US012414332B2

(12) United States Patent
Liaw

(10) Patent No.: US 12,414,332 B2
(45) **Date of Patent: *Sep. 9, 2025**

(54) STRUCTURE AND METHOD FOR SEMICONDUCTOR DEVICES

(71) Applicant: Parabellum Strategic Opportunities Fund LLC, Wilmington, DE (US)

(72) Inventor: Jhon Jhy Liaw, Hsinchu County (TW)

(73) Assignee: Parabellum Strategic Opportunities Fund LLC, Austin, TX (US)

( * ) Notice: Subject to any disclaimer, the term of this patent is extended or adjusted under 35 U.S.C. 154(b) by 138 days.

This patent is subject to a terminal disclaimer.

(21) Appl. No.: 18/360,508

(22) Filed: Jul. 27, 2023

(65) Prior Publication Data

US 2023/0378301 A1 Nov. 23, 2023

Related U.S. Application Data

(60) Continuation of application No. 17/590,409, filed on Feb. 1, 2022, now Pat. No. 11,728,402, which is a (Continued)

(51) Int. Cl.

*H10D 30/67* (2025.01)
*H10D 30/01* (2025.01)
(Continued)

(52) U.S. Cl.

CPC ..... *H10D 30/6735* (2025.01); *H10D 30/0243* (2025.01); *H10D 30/6212* (2025.01); *H10D 30/6757* (2025.01); *H10D 62/116* (2025.01); *H10D 62/121* (2025.01); *H10D 62/151* (2025.01); *H10D 64/017* (2025.01); (Continued)

(58) Field of Classification Search

CPC ..... H10D 30/501–509; H10D 30/6735; H10D 30/6212; H01L 29/775; H01L 29/778; H01L 29/785; H01L 29/7851; H01L 29/7856; H01L 29/42392; H01L 29/7853

See application file for complete search history.

(56) References Cited

U.S. PATENT DOCUMENTS

| | | | |
|---|---|---|---|
| 9,613,953 | B2 | 4/2017 | Liaw |
| 9,793,273 | B2 | 10/2017 | Liaw |

(Continued)

*Primary Examiner* — Joseph C. Nicely

(74) *Attorney, Agent, or Firm* — Almanac IP Advisors LLP

(57) ABSTRACT

The present disclosure provides an integrated circuit (IC) device, including: a semiconductor substrate having a top surface; a first source/drain feature and a second source/drain feature disposed on the semiconductor substrate; and a plurality of semiconductor layers including a first semiconductor layer and a second semiconductor layer. Each of the first semiconductor layer and the second semiconductor layer extends longitudinally in a first direction and connects the first source/drain feature and the second source/drain feature. The first semiconductor layer is stacked over the second semiconductor layer in a second direction perpendicular to the first direction. A length of the first semiconductor layer along the first direction is less than a length of the second semiconductor layer along the first direction. The IC device further includes a gate structure engaging center portions of the first semiconductor layer and the second semiconductor layer.

20 Claims, 49 Drawing Sheets

Related U.S. Application Data division of application No. 16/585,636, filed on Sep. 27, 2019, now Pat. No. 11,239,335.

(51) Int. Cl.

| | |
|---|---|
| ***H10D 30/62*** | (2025.01) |
| ***H10D 62/10*** | (2025.01) |
| ***H10D 62/13*** | (2025.01) |
| ***H10D 64/01*** | (2025.01) |
| ***H10D 64/66*** | (2025.01) |
| *H01L 21/306* | (2006.01) |
| *H01L 21/3065* | (2006.01) |

(52) U.S. Cl.

CPC ......... *H10D 64/018* (2025.01); *H10D 64/021* (2025.01); *H10D 64/679* (2025.01); *H01L 21/30604* (2013.01); *H01L 21/3065* (2013.01)

(56) References Cited

U.S. PATENT DOCUMENTS

| | | | | |
|---|---|---|---|---|
| 9,805,985 | B2 | 10/2017 | Liaw | |
| 9,984,936 | B1 | 5/2018 | Xie et al. | |
| 10,340,341 | B1 | 7/2019 | Chao et al. | |
| 11,024,741 | B2 | 6/2021 | Song et al. | |
| 11,557,653 | B2 * | 1/2023 | Jeong | H10D 62/151 |
| 11,699,759 | B2 | 7/2023 | Song et al. | |
| 2017/0250261 | A1 * | 8/2017 | Kim | H10D 64/251 |
| 2017/0256609 | A1 * | 9/2017 | Bhuwalka | H10D 30/43 |
| 2018/0301531 | A1 | 10/2018 | Xie | |
| 2019/0081155 | A1 | 3/2019 | Xie et al. | |
| 2020/0098756 | A1 | 3/2020 | Lilak et al. | |
| 2020/0295198 | A1 | 9/2020 | Cheng et al. | |
| 2020/0343387 | A1 | 10/2020 | Liaw | |
| 2020/0381514 | A1 * | 12/2020 | Song | H10D 62/235 |
| 2020/0395482 | A1 | 12/2020 | Song et al. | |
| 2023/0178606 | A1 * | 6/2023 | Jeong | H10D 30/6213 257/288 |

* cited by examiner

STRUCTURE AND METHOD FOR SEMICONDUCTOR DEVICES

This application is a Continuation of U.S. patent application Ser. No. 17/590,409, filed Feb. 1, 2022, which is a Divisional of U.S. patent application Ser. No. 16/585,636, filed Sep. 27, 2019, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is a gate-all-around (GAA) transistor, whose gate structure extends around its channel region, thereby providing access to the channel region on all sides. Such GAA transistors are compatible with conventional complementary metal-oxide-semiconductor (CMOS) processes, allowing them to be aggressively scaled down while maintaining gate control and mitigating SCEs. However, conventional methods for GAA devices may experience challenges, including poor epitaxial growth in the source/drain region, small formation margin for gate dielectric and electrode in the narrow channel-channel spaces, and increased capacitance between adjacent conductive regions, such as the source/drain region and active gate structure, especially as device size is scaled down. Therefore, although conventional GAA devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 38A are top views of embodiments of GAA devices of the present disclosure constructed at various fabrication stages according to some embodiments of the present disclosure;

FIGS. 2B to 38B are cross sectional views of embodiments of GAA devices of the present disclosure along the line A-A' in FIGS. 2A to 38A, respectively, according to some embodiments of the present disclosure;

FIGS. 2C to 38C are cross sectional views of an embodiment of a GAA device of the present disclosure along the line B-B' in FIGS. 2A to 38C, respectively, according to some embodiments of the present disclosure;

FIGS. 2D to 38D are cross sectional views of an embodiment of a GAA device of the present disclosure along the line C-C' in FIGS. 2A to 38A, respectively, according to some embodiments of the present disclosure;

FIGS. 39A to 39G and 40A to 401 are cross-sectional views of example methods for fabricating various embodiments of a GAA device according to some embodiments of the present disclosure.

DETAILED DESCRIPTION

Figure 1A:
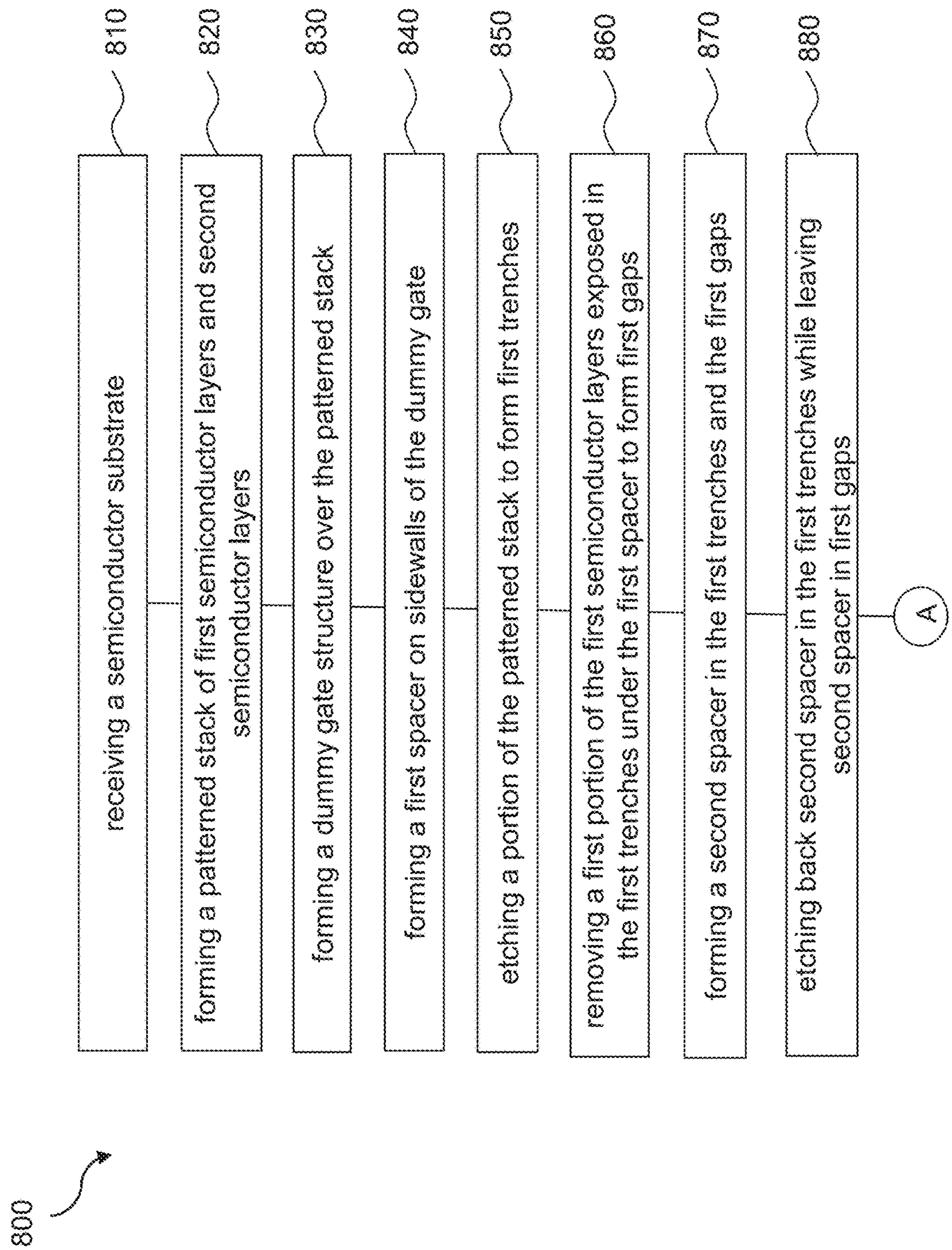
FIGS. 1A, 1B, and 1C are flow charts of an example method for fabricating an embodiment of a GAA device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" may encompass the dimension range from 4.5 nm to 5.5 nm.

Multi-gate devices (e.g. gate-all-around (GAA) devices) have been introduced in an effort to improve gate control by increasing gate-channel coupling, reduce OFF-state current, and reduce short-channel effects (SCEs). GAA devices can be aggressively scaled down while maintaining gate control and mitigating SCEs. However, conventional methods for GAA devices may experience challenges, including poor epitaxial growth in the source/drain region, small formation margin for gate dielectric and electrode in the narrow channel-channel spaces, and increased capacitance between adjacent conductive regions, such as a source/drain region and an adjacent active gate structure. These drawbacks are exacerbated as device size is scaled down.

The present disclosure is generally related to ICs and semiconductor devices and methods of forming the same. More particularly, the present disclosure is related to GAA devices. A GAA device includes any device that has its gate structure, or portions thereof, formed around all-sides of a channel region (e.g. surrounding a portion of a channel region). In some instances, a GAA device may also be referred to as a quad-gate device where the channel region has four sides and the gate structure is formed on all four sides. The channel region of a GAA device may include one or more semiconductor layers, each of which may be in one of many different shapes, such as wire (or nanowire), sheet (or nanosheet), bar (or nano-bar), and/or other suitable shapes. In embodiments, the channel region of a GAA device may have multiple horizontal semiconductor layers (such as nanowires, nanosheets, or nano-bars) (hereinafter collectively referred to as "nanochannels") vertically spaced, making the GAA device a stacked horizontal GAA device. The GAA devices presented herein may be a complementary metal-oxide-semiconductor (CMOS) GAA device, a p-type metal-oxide-semiconductor (pMOS) GAA device, or an n-type metal-oxide-semiconductor (nMOS) GAA device. Further, the GAA devices may have one or more channel regions associated with a single, contiguous gate structure, or multiple gate structures. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure. The GAA devices and methods of manufacture that are proposed in the present disclosure exhibit desirable properties, examples being: (1) a bottom-up epitaxial growth process that forms source/drain regions that are free from voids; (2) a large formation margin/window for gate dielectric and electrode in narrow channel-channel spaces; and (3) decreased capacitance between a source/drain region and an adjacent active gate structure.

In the illustrated embodiments, the IC device includes a GAA device 100. The GAA device 100 may be fabricated during processing of the IC, or a portion thereof, that may include static random access memory (SRAM) and/or logic circuits, passive components such as resistors, capacitors, and inductors, and active components such as p-type field effect transistors (pFETs), n-type FETs (nFETs), FinFETs, MOSFETs, CMOS, bipolar transistors, high voltage transistors, high frequency transistors, other memory cells, and combinations thereof.

Figure 1B:
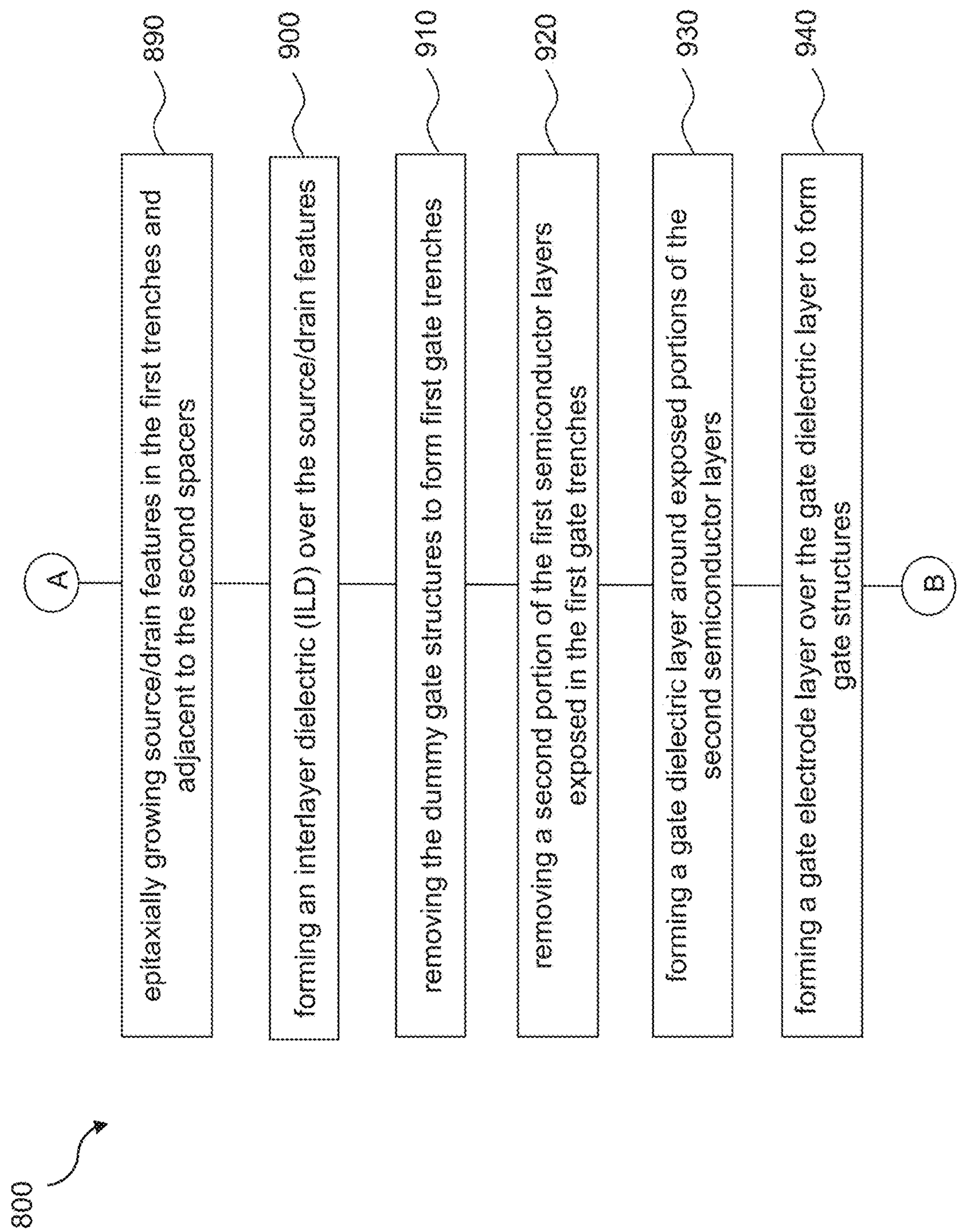
Figure 1C:
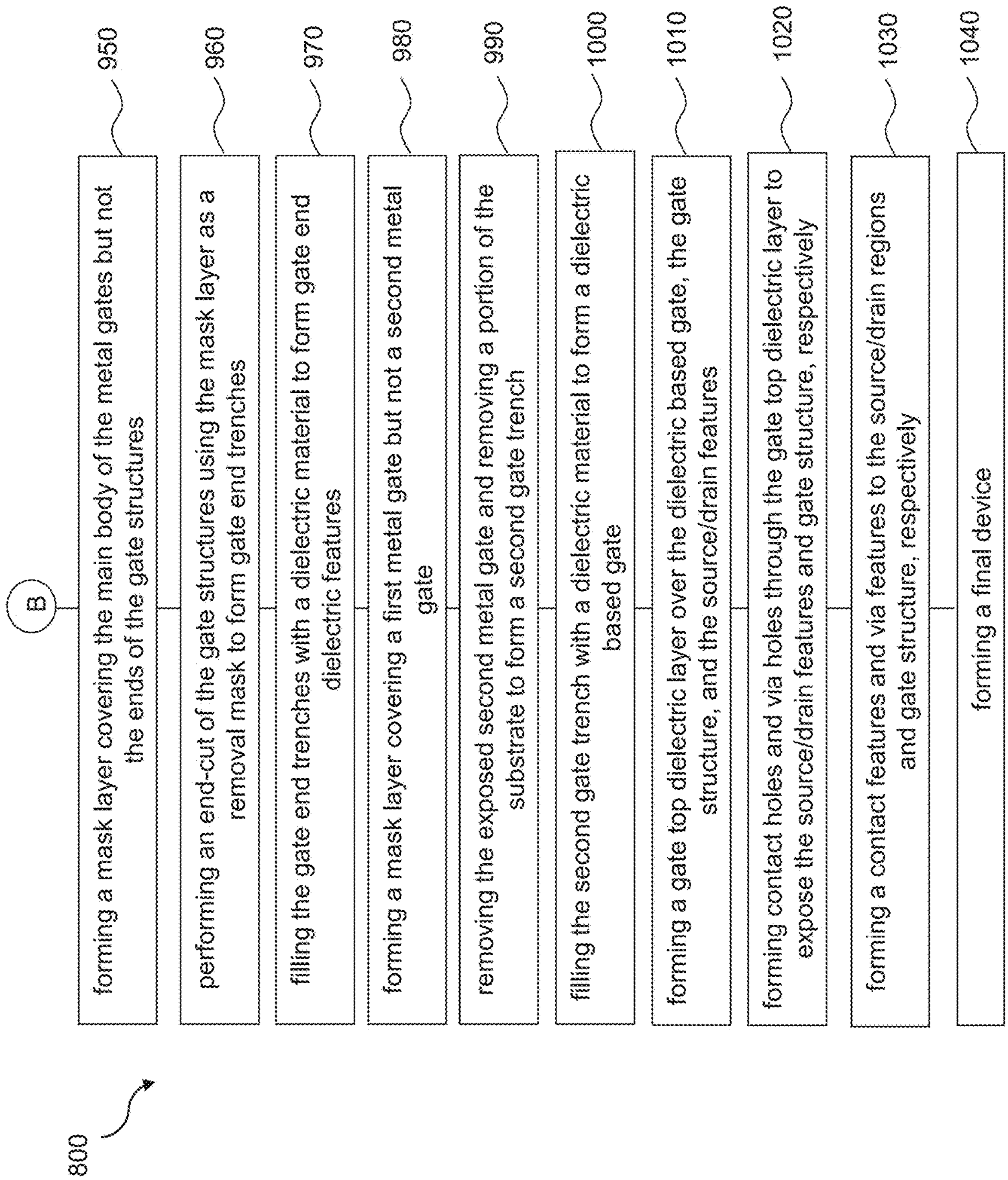
Figure 2A:
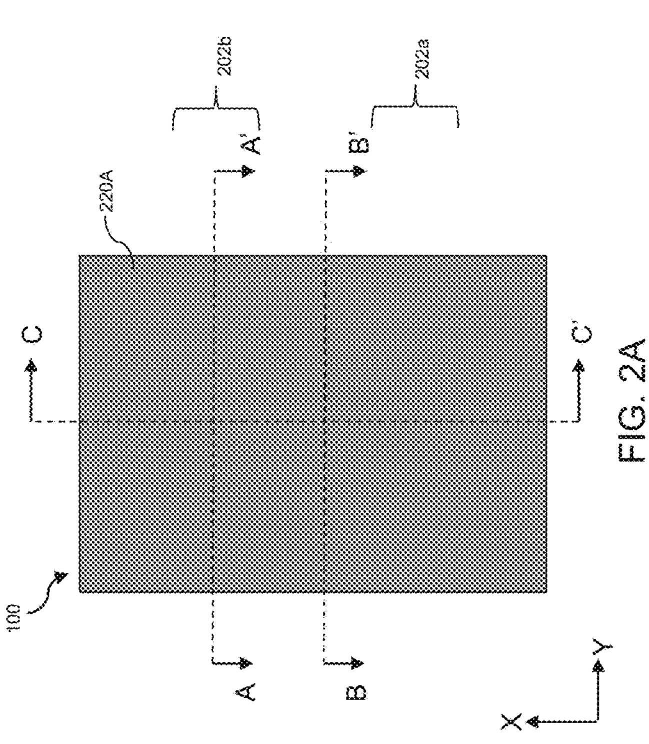
Figure 2B:
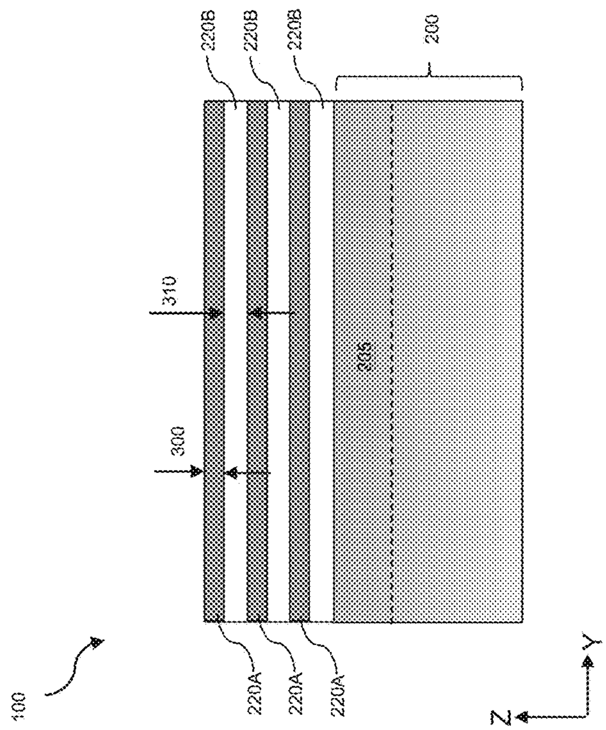
Figure 2C:
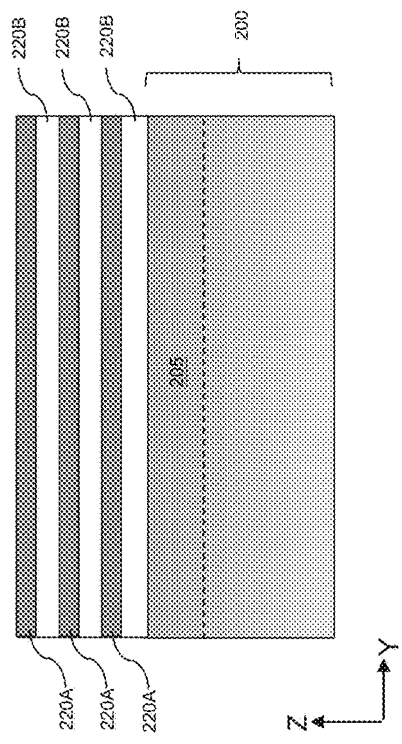
Figure 2D:
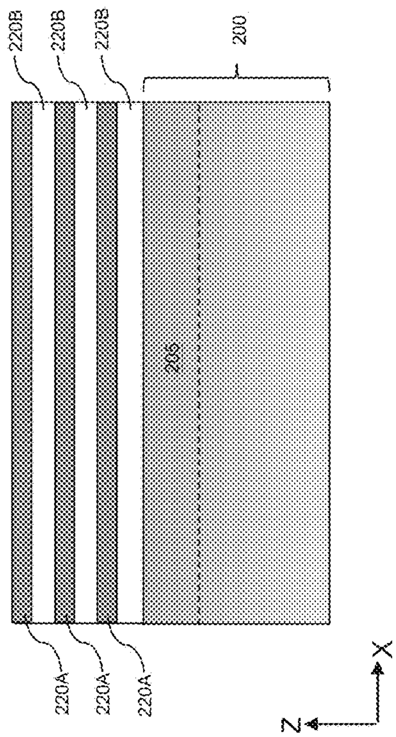

FIGS. 1A-1C are flow charts of an example method for fabricating an embodiment of a GAA device of the present disclosure according to some embodiments of the present disclosure. FIGS. 2A-27A are top views of an embodiment of a GAA device of the present disclosure constructed at various fabrication stages according to some embodiments of the present disclosure. FIGS. 2B-27B, 2C-27C, and 2D-27D are cross sectional views of an embodiment of a GAA device of the present disclosure along the lines A-A', B-B', and C-C' in FIGS. 2A-27A, respectively, according to some embodiments of the present disclosure.

Referring to block 810 of FIG. 1A and FIGS. 2A-2D, the GAA device 100 includes a substrate 200. In some embodiments, the substrate 200 contains a semiconductor material, such as bulk silicon (Si). Alternatively or additionally, another elementary semiconductor, such as germanium (Ge) in a crystalline structure, may also be included in the substrate 200. The substrate 200 may also include a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 200 may also include a semiconductor-on-insulator substrate, such as Si-on-insulator (SOI), SiGe-on-insulator (SGOI), Ge-on-insulator (GOI) substrates. Portions of the substrate 200 may be doped, such as the doped portions 205. The doped portions 205 may be doped with p-type dopants, such as boron (B) or boron fluoride ($BF_3$), or doped with n-type dopants, such as phosphorus (P) or arsenic (As). The doped portions 205 may also be doped with combinations of p-type and n-type dopants (e.g. to form a p-type well and an adjacent n-type well). The doped portions 205 may be formed directly on the substrate 200, in a p-well structure, in an n-well structure, in a dual-well structure, or using a raised structure.

Referring to block 820 of FIG. 1A and FIGS. 2A-2D, a stack of semiconductor layers 220A and 220B are formed over the substrate 200 in an interleaving or alternating fashion, extending vertically (e.g. along the Z-direction) from the substrate 200. For example, a semiconductor layer 220B is disposed over the substrate 200, a semiconductor layer 220A is disposed over the semiconductor layer 220B, another semiconductor layer 220B is disposed over the semiconductor layer 220A, so on and so forth. In the depicted embodiments, there are three layers of semiconductor layers 220A and three layers of semiconductor layers 220B alternating between each other. However, there may be any appropriate number of layers in the stack. For example, there may be 2 to 10 layers of semiconductor layers 220A, alternating with 2 to 10 layers of semiconductor layers 220B in the stack. The material compositions of the semiconductor layers 220A and 220B are configured such that they have an etching selectivity in a subsequent etching process. For example, in some embodiments, the semiconductor layers 220A contain silicon germanium (SiGe), while the semiconductor layers 220B contain silicon (Si). In some other embodiments, the semiconductor layers 220B contain SiGe, while the semiconductor layers 220A contain Si. In the depicted embodiment, each of the semiconductor layers 220A has a substantially uniform thickness, depicted in FIG. 2B as the thickness 300, while each of the semiconductor layers 220B has a substantially uniform thickness, depicted in FIG. 2B as the thickness 310.

Figure 3B:
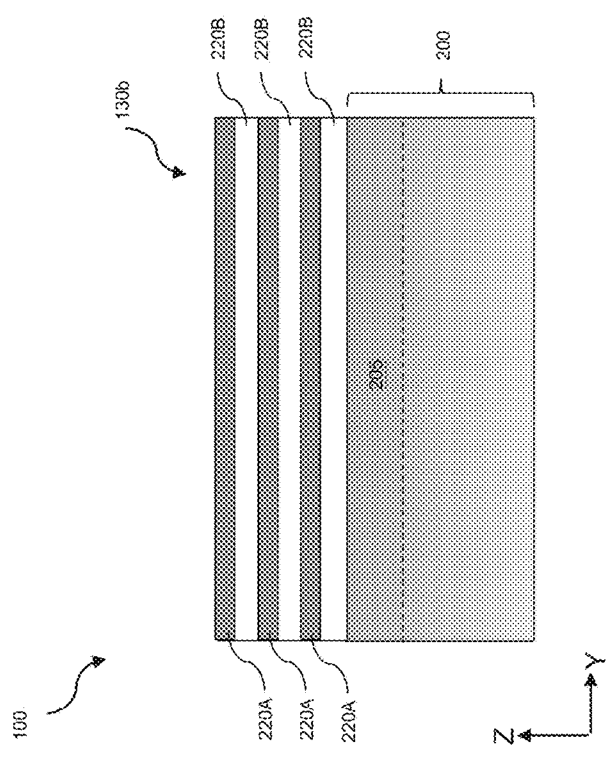
Figure 3D:
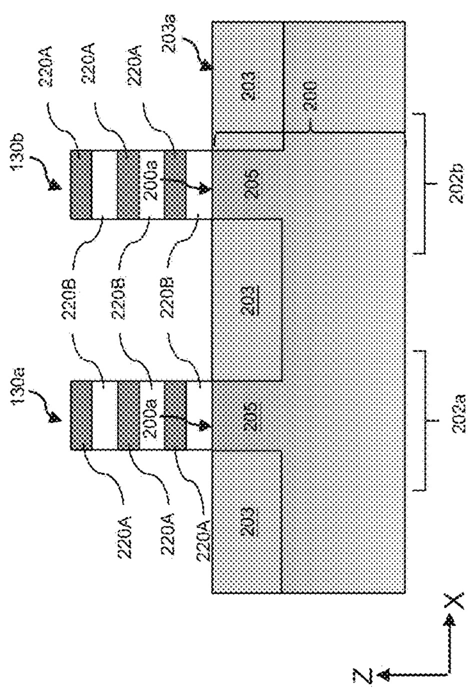
Figure 3A:
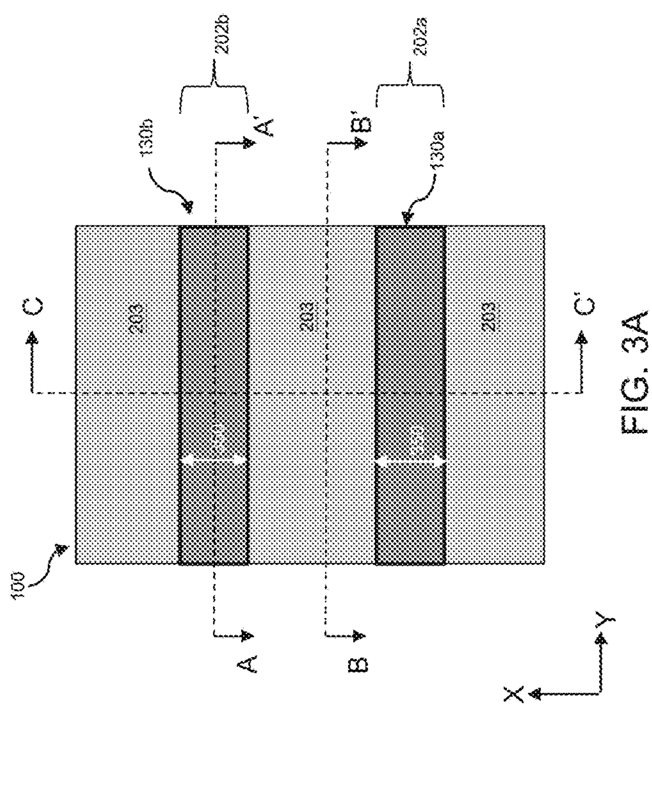
Figure 3C:
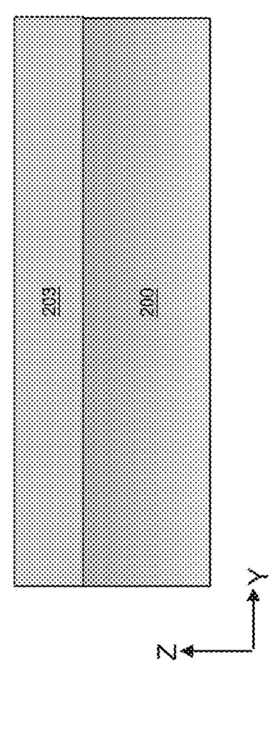

Referring to block 820 of FIG. 1A and FIGS. 3A-3D, the stack of semiconductor layers 220A and 220B are patterned into a plurality of fin structures, for example, into fin structures (or fins) **130*a* and 130*b*. Each of the fins 130*a* and 130*b* includes a stack of the semiconductor layers 220A and 220B disposed in an alternating manner with respect to one another. The fins 130*a* and 130*b* each extends lengthwise (e.g. longitudinally) in a first direction (e.g. in the Y-direction) and are separated from each other (e.g. laterally) in a second direction (e.g. in the X-direction), as shown in FIGS. 3A and 3D. As illustrated in FIG. 3A, the fins may each have a lateral width along the X-direction, depicted in FIG. 3A as the width 350. It is understood that the X-direction and the Y-direction are horizontal directions that are perpendicular to each other, and that the Z-direction is a vertical direction that is orthogonal (or normal) to a plane defined by the X-direction and the Y-direction. The substrate 200** may have its top surface aligned in parallel to the XY plane.

The fins **130*a* and 130*b* may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The regions in which the fins are formed will be used to form active devices through subsequent processing and are thus referred to as active regions. For example, fin 130***a* is formed in the active region 202*a*, and the fin 130*b* is formed in the active region 202*b*. Both fins 130*a* and 130*b* protrude out of the doped portions 205.

The structure 100 includes isolation features 203, which may be shallow trench isolation (STI) features. In some examples, the formation of the isolation features 203 includes etching trenches into the substrate 200 between the active regions and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 203. The isolation features 203 may have a multi-layer structure such as a thermal oxide liner layer over the substrate 200 and a filling layer (e.g., silicon nitride or silicon oxide) over the thermal oxide liner layer. Alternatively, the isolation features 203 may be formed using any other isolation formation techniques. As illustrated in FIG. 3D, the fins 130*a* and 130*b* are located above the top surface 203*a* of the isolation features 203 (e.g. protrude out of the isolation features 203) and are also located above the top surface 200*a* of the substrate 200.

Figure 4B:
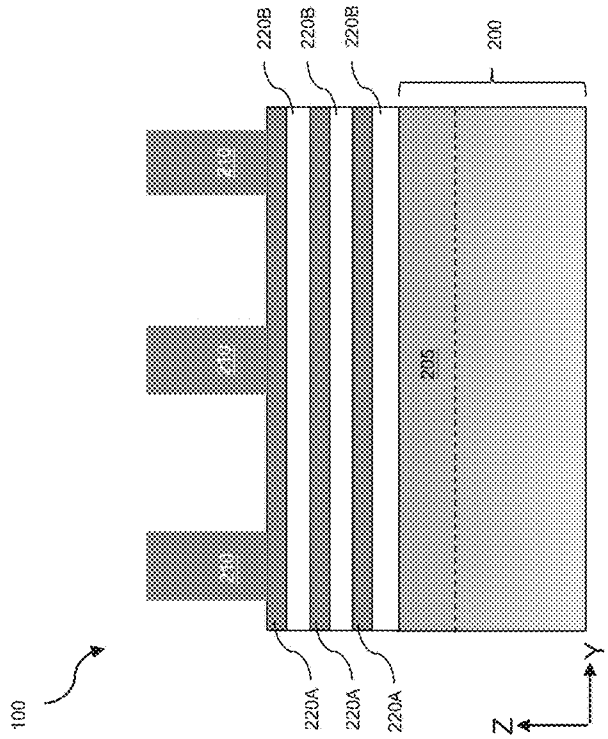
Figure 4D:
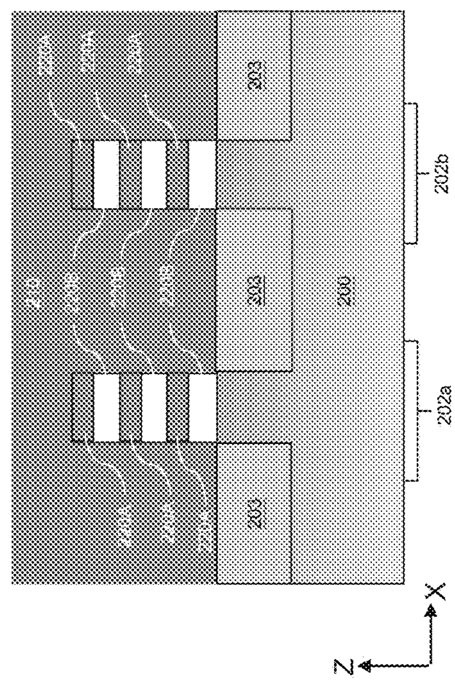
Figure 4A:
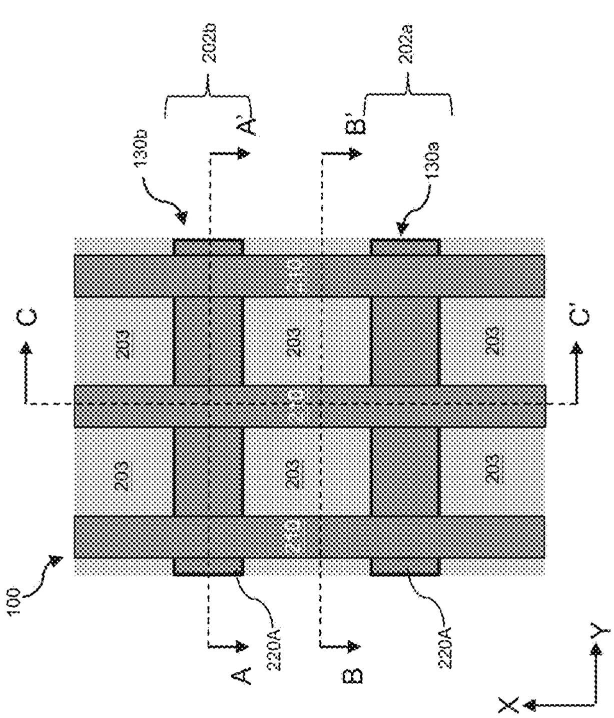
Figure 4C:
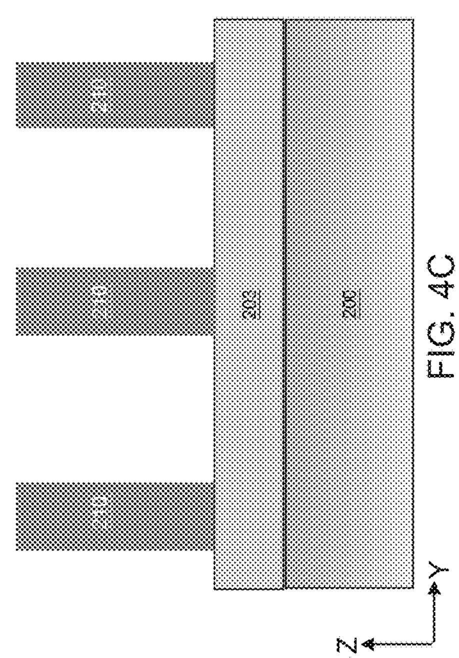
Figure 5B:
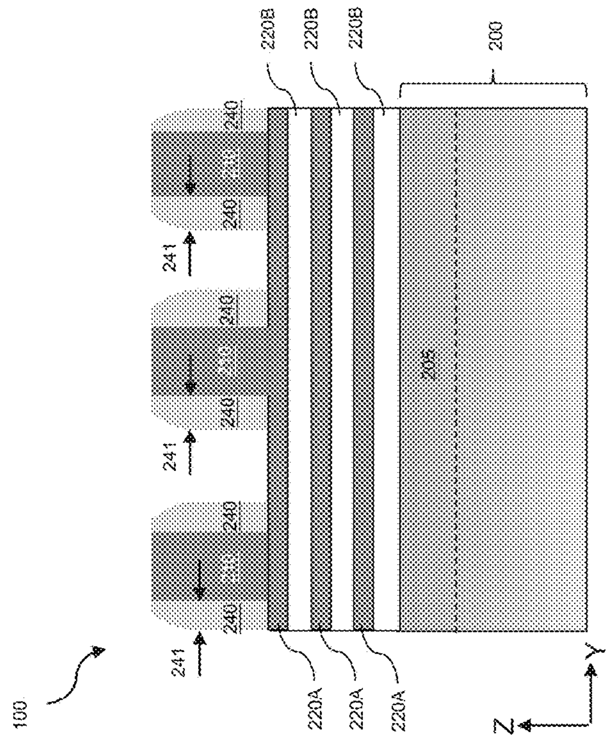
Figure 5A:
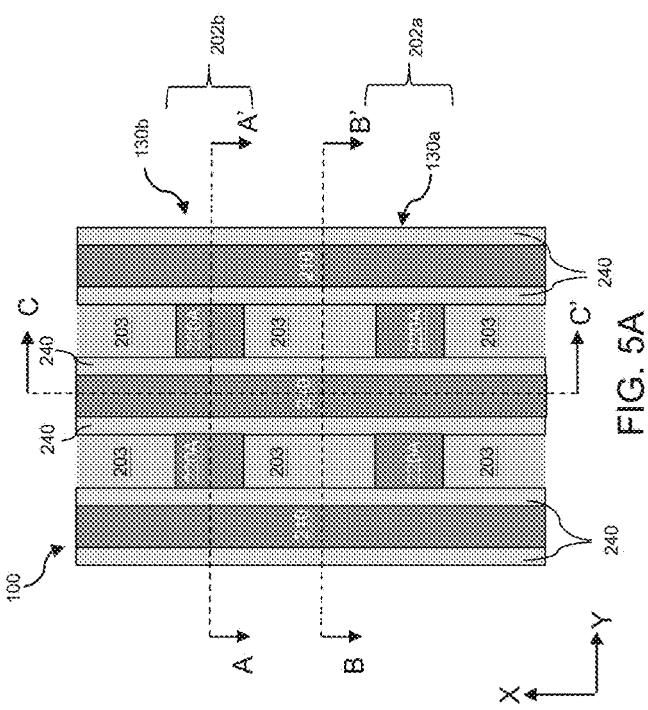
Figure 5D:
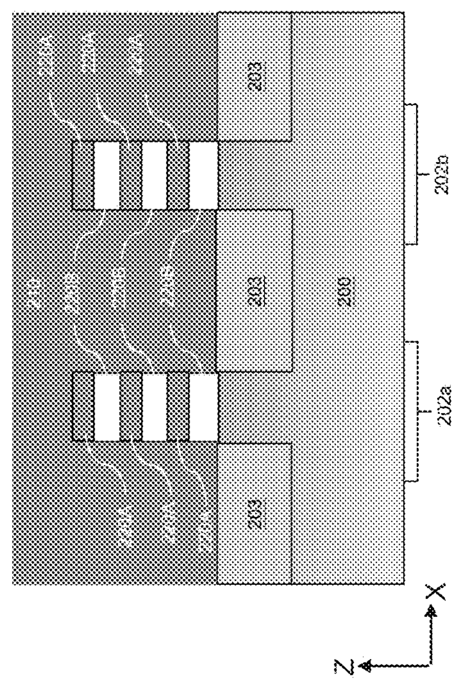
Figure 5C:
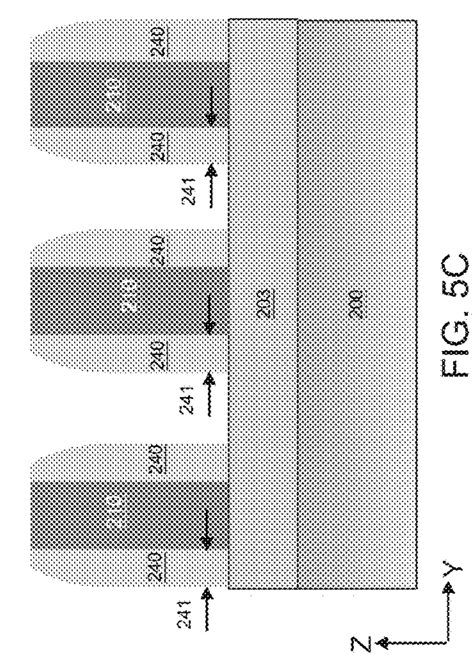

Referring to block 830 of FIG. 1A and FIGS. 4A-4D, dummy gate structures 210 are formed over a portion of each of the fins 130*a* and 130*b*, and over the isolation features 203, in between the fins 130*a* and 130*b*. The dummy gate structures 210 may be configured to extend lengthwise (e.g. longitudinally) in parallel to each other, for example, each along the X-direction, as shown in FIG. 4A. In some embodiments, as illustrated in FIG. 4D, each of the dummy gate structures wraps around the top surface and side surfaces of each of the fins 130*a*, 130*b*. The dummy gate structures 210 may include polysilicon. In some embodiments, the dummy gate structures 210 also include one or more mask layers, which are used to pattern the dummy gate electrode layers. The dummy gate structures 210 may undergo a gate replacement process through subsequent processing to form metal gates, such as a high-k metal gate, as discussed in greater detail below. Some of the dummy gate structures 210 may also undergo a second gate replacement process to form a dielectric based gate that electrically isolates the GAA device 100 from neighboring devices, as also discussed in greater detail below. The dummy gate structures 210 may be formed by a procedure including deposition, lithography patterning, and etching processes. The deposition processes may include CVD, ALD, PVD, other suitable methods, and/or combinations thereof.

Referring to block 840 of FIG. 1A and FIGS. 5A-5D, gate spacers 240 are formed on the sidewalls of the dummy gate structures 210. The gate spacers 240 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The gate spacers 240 may include a single layer or a multi-layer structure. In some embodiments, each of the gate spacers 240 may have a thickness 241 (e.g. measured in the Y-direction) in a range from about 3 nm to about 10 nm. A thickness within the stated range of values may be needed for device performance, especially for advanced technology nodes. In some embodiments, the gate spacers 240 may be formed by depositing a spacer layer (containing the dielectric material) over the dummy gate structures 210, followed by an anisotropic etching process to remove portions of the spacer layer from the top surfaces of the dummy gate structures 210. After the etching process, portions of the spacer layer on the sidewall surfaces of the dummy gate structures 210 substantially remain and become the gate spacers 240. In some embodiments, the anisotropic etching process is a dry (e.g. plasma) etching process. Additionally or alternatively, the formation of the gate spacers 240 may also involve chemical oxidation, thermal oxidation, ALD, CVD, and/or other suitable methods. In the active regions, the gate spacers 240 are formed over the top layer of the semiconductor layers 220A. Accordingly, the gate spacers 240 may also be interchangeably referred to as the top spacers 240. In some examples, one or more material layers (not shown) may also be formed between the dummy gate structures 210 and the corresponding top spacers 240. The one or more material layers may include an interfacial layer and/or a high-k dielectric layer, as examples.

Referring to block 850 of FIG. 1A and FIGS. 6A-6D, portions of the fins 130*a* and 130*b* exposed by the dummy gate structures 210 and the gate spacers 240 are at least partially recessed (or etched away) to form tapered trenches 151 for subsequent epitaxial source and drain growth. As described in greater detail below, the tapering of the trenches 151 is a deliberate feature of the proposed process, an effect being an efficient epitaxial growth process that prevents voids from being induced in the subsequently-formed source/drain regions. In effect, the tapered trenches 151 result in a bottom-up epitaxial growth process that conformally fills the tapered trenches 151. The formation of the tapered trenches 151 exposes sidewalls of the stack of semiconductor layers 220A and 220B. In the depicted embodiments, an acute angle α subtended by a sidewall 151*w* of the tapered trenches 151 and the top surface 200*a* of the substrate may be in a range from about 80 degrees to about 88 degrees (e.g. about 85 degrees). In the examples shown in FIGS. 6A-6D, the bottom 151*a* of the tapered trenches 151 is substantially aligned (e.g. substantially coplanar) with the top surface 200*a* of the substrate 200. Alternatively, in some other embodiments (not shown), the recess process removes only some, but not all, of the semiconductor layers 220A and 220B. In other words, the bottom 151*a* of the tapered trenches 151 is located above the top surface 200*a* of the substrate 200 (e.g. in the Z-direction). In yet some other embodiments (not shown), the recess process may remove not only the exposed fins 130*a* and 130*b*, but also remove a portion of the underlying doped region 205 of the substrate 200. In other words, in such embodiments, the bottom 151*a* of the tapered trenches 151 may be located below the top surface of the substrate 200 (e.g. in the Z-direction).

Figure 6B:
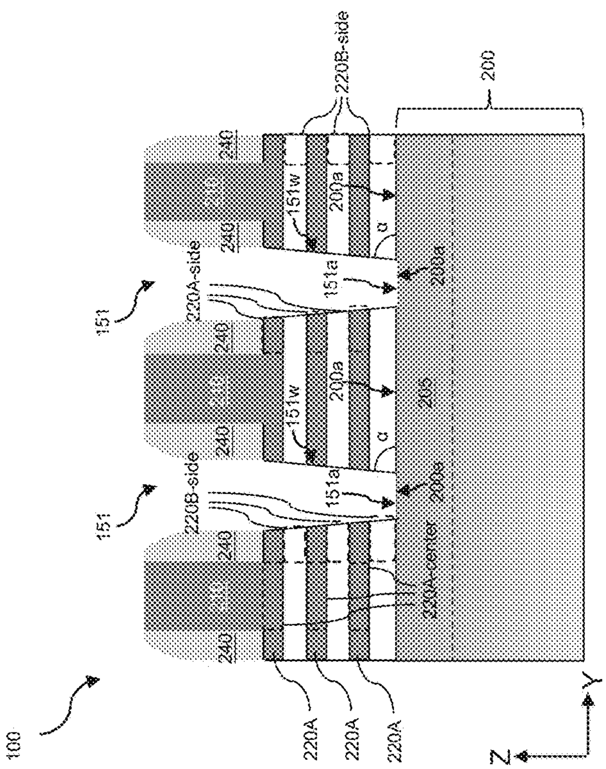
Figure 6A:
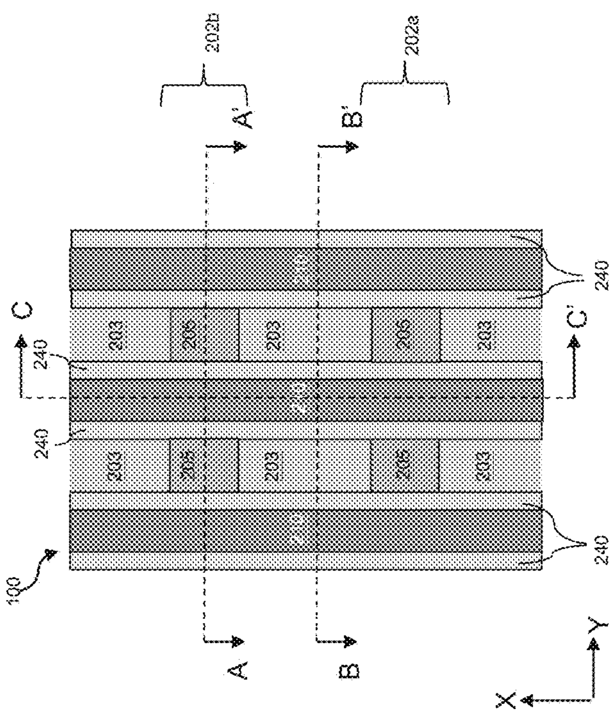
Figure 6C:
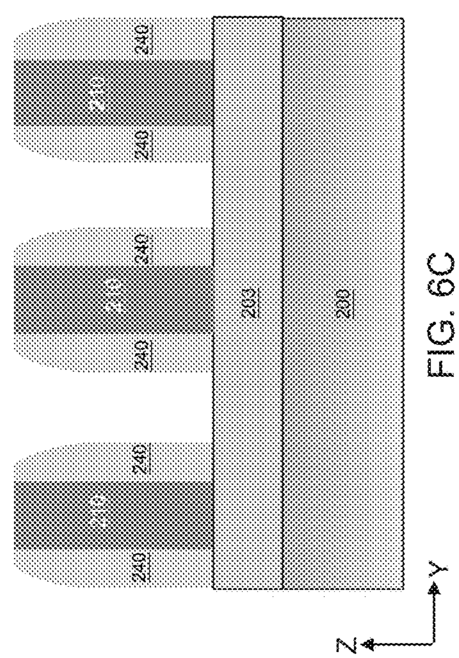
Figure 6D:
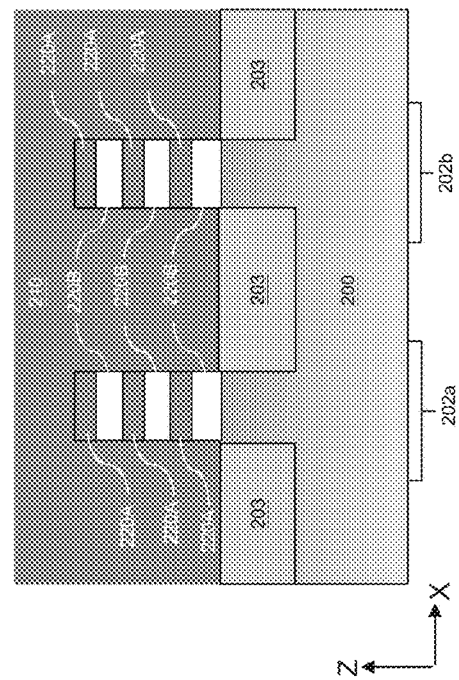

In the depicted embodiments (e.g. as seen in FIG. 6B), the remaining stack of semiconductor layers 220A and 220B includes two regions—a first region that is vertically beneath the dummy gate structures 210 (referred to as the "center portions") and a second region that is vertically beneath the top spacers 240 (referred to as the "side portions"). Accordingly, the portion of the semiconductor layers 220A vertically beneath the dummy gate structures 210 are referred to as the center portions 220A-center; while the portions of the semiconductor layers 220A vertically beneath the top spacers 240 and that extend laterally towards the tapered trenches 151 are referred to as the side portions 220A-side. Similarly, the portion of the semiconductor layers 220B vertically beneath the dummy gate structures 210 are referred to as the center portions 220B-center; while the portions of the semiconductor layers 220B vertically beneath the top spacers 240 and that extend laterally towards the tapered trenches 151 are referred to as the side portions 220B-side.

The process used to form the tapered trenches 151 may include multiple lithography and etching steps, and may use any suitable methods, such as dry etching and/or wet etching. As an example, one or more of the multiple lithography and etching steps used to form the tapered trenches 151 may include a first etch process having a first etch chemistry and a second etch process having a second etch chemistry that is different from the first etch chemistry. The first etch process may be a main-etch process that initially forms an opening in the stack of semiconductor layers 220A and 220B, while the second etch process may be an over-etch process that shapes the initially-formed opening to produce the tapered profile observed in the trenches 151. The first etch chemistry may include hydrogen bromide (HBr) combined with argon (Ar), helium (He), oxygen ($O_2$), or a combination thereof. The second etch chemistry may include hydrogen bromide (HBr) combined with nitrogen, methane ($CH_4$), or a combination thereof. The second etch process (e.g. the over-etch process) may be performed at a high bias power (e.g. a bias power in a range from about 150 Watts to about 600 Watts).

Figure 7A:
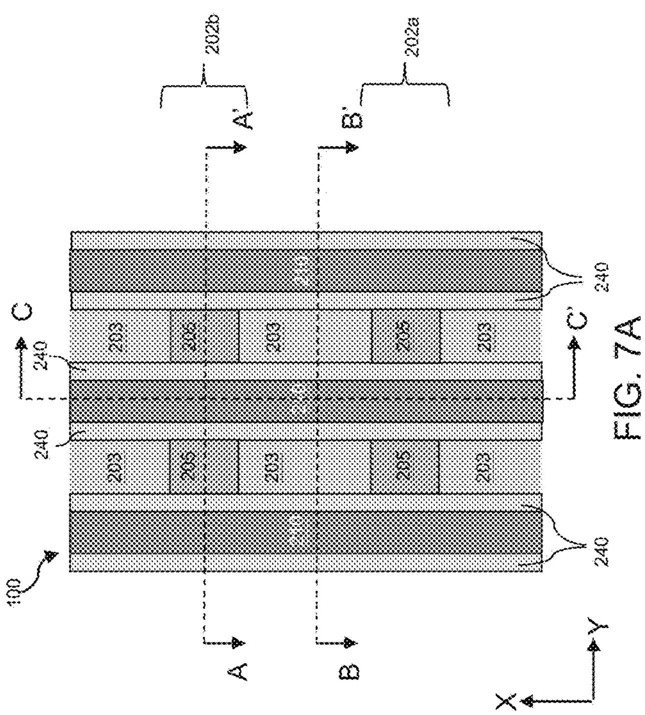
Figure 7B:
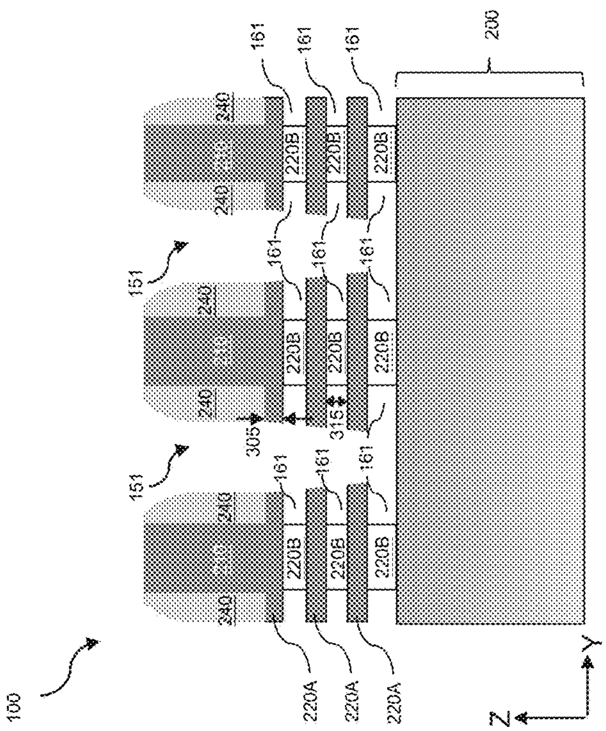
Figure 7C:
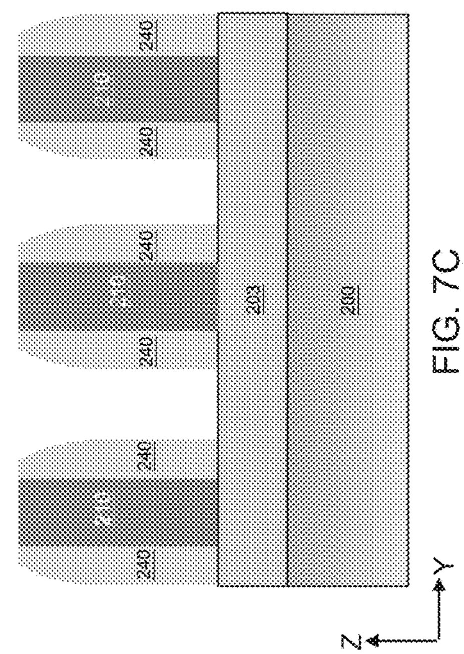
Figure 7D:
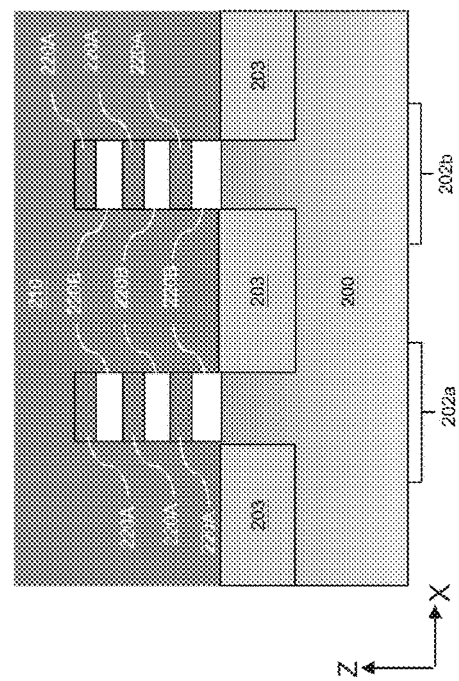
Figure 8B:
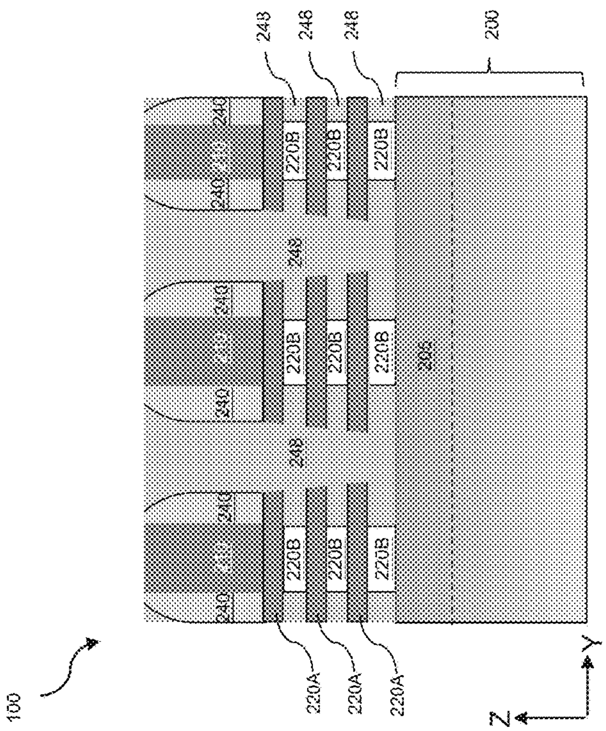
Figure 8A:
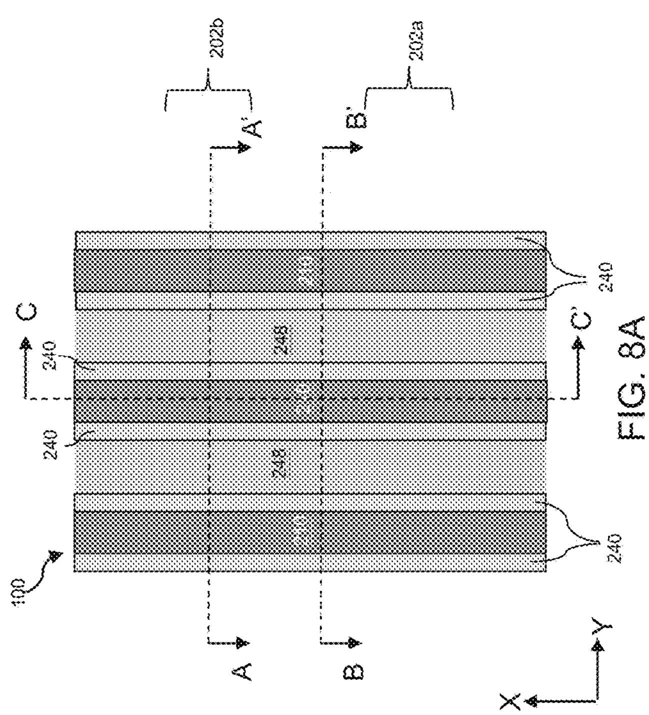
Figure 8D:
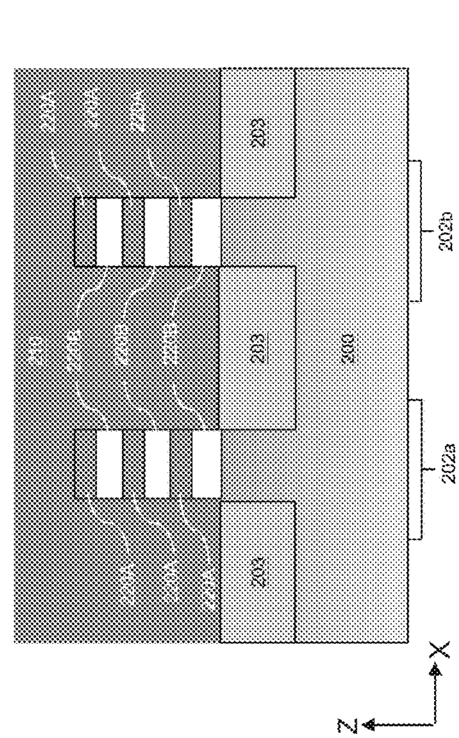
Figure 8C:
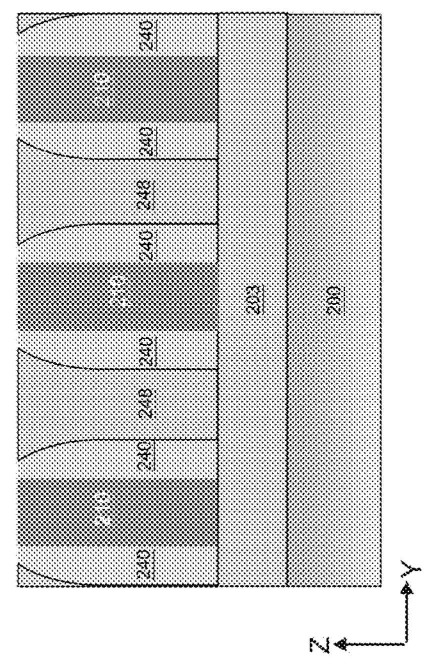

Referring to block 860 of FIG. 1A and FIGS. 7A-7D, portions of the semiconductor layers 220B are removed through the exposed sidewall surfaces in the tapered trenches 151 via a selective etching process. The selective etching process may be any suitable processes, such as a wet etching or a dry etching process. The extent to which the semiconductor layers 220B are recessed (or the size of the portion removed) is determined by the processing conditions such as the duration the semiconductor layers 220B is exposed to an etching chemical. In the depicted embodiments, the duration is controlled such that the side portions 220B-side are removed in their entirety, while the center portions 220B-center remain substantially unchanged. In other words, the remaining portions of the semiconductor layers 220B each has a sidewall that is substantially aligned with a sidewall of the dummy gate structures 210 (e.g. the sidewall in the XZ plane, defined by the X-direction and the Z-direction). As illustrated in FIG. 7B, the selective etching process creates openings 161, which extend the trenches 151 into areas beneath the semiconductor layers 220A and top spacers 240. The openings 161 are referred to as "first gaps" in block 860 of FIG. 1A.

Meanwhile, the semiconductor layers 220A are only slightly affected during the selective etching process. For example, prior to the selective etching process, the side portions 220A-side each has a thickness 300, and side portions 220B-side each has a thickness 310 (see FIG. 2B). After the selective etching process, the side portions 220A-side have a thickness 305, and the openings 161 have a height 315 (or interchangeably referred to as thickness 315). Thickness 305 is only slightly smaller than thickness 300, and thickness 315 is only slightly larger than thickness 310. For example, thickness 305 may be about 1% to 10% smaller than thickness 300; and thickness 315 may be about 1% to 10% larger than thickness 310. The etch selectivity between the semiconductor layers 220A and 220B is made possible by the different material compositions between these layers. For example, the semiconductor layers 220B may be etched away at a substantially faster rate (e.g. more than about 5 times to about 10 times faster) than the semiconductor layers 220A.

As discussed above, the selective etching process may be a wet etching process. In an embodiment, the semiconductor layers 220A includes Si and the semiconductor layers 220B includes SiGe. In such an embodiment, a Standard Clean 1 (SC-1) solution may be used to selectively etch away the SiGe semiconductor layers 220B. For example, the SiGe semiconductor layers 220B may be etched away at a substantially faster rate than the Si semiconductor layers 220A. As a result, desired portions of the semiconductor layers 220B (e.g. the side portions 220B-side) are removed, while the semiconductor layers 220A remain substantially unchanged. The SC-1 solution includes ammonia hydroxide ($NH_4OH$), hydrogen peroxide ($H_2O_2$), and water ($H_2O$). The etching duration is adjusted such that the size of the removed portions of SiGe layers are controlled. The optimal condition may be reached by additionally adjusting the etching temperature, dopant concentration, as well as other experimental parameters.

In another embodiment, the semiconductor layers 220A include SiGe and the semiconductor layers 220B includes Si. In such an embodiment, a cryogenic deep reactive ion etching (DRIE) process may be used to selectively etch away the Si semiconductor layer 220B. For example, the DRIE process may implement a sulfur hexafluoride-oxygen ($SF_6$—$O_2$) plasma. The optimal condition may be reached by adjusting the etching temperature, the power of the Inductively Coupled Plasma (ICP) power source and/or Radio Frequency (RF) power source, the ratio between the $SF_6$ concentration and the $O_2$ concentration, the dopant (such as boron) concentrations, as well as other experimental parameters. For example, the etching rate of a Si semiconductor layer 220B using a $SF_6$—$O_2$ plasma (with approximately 6% $O_2$) may exceed about 8 μm/min at a temperature of about −80° C.; while the SiGe semiconductor layers 220A are not substantially affected during the process.

Referring to block 870 of FIG. 1A and FIGS. 8A-8D, a dielectric material 248 is deposited into both the trenches 151 and the openings 161. The dielectric material 248 may be selected from $SiO_2$, SiON, SiOC, SiOCN, or combinations thereof. In some embodiments, the proper selection of the dielectric material 248 may be based on its dielectric constant. In an embodiment, this dielectric material 248 may have a dielectric constant lower than that of the top spacers 240. In some other embodiments, this dielectric material 248 may have a dielectric constant higher than that of the top spacers 240. This aspect of the dielectric material 248 will be further discussed later. The deposition of the dielectric material 248 may be any suitable methods, such as CVD, PVD, PECVD, MOCVD, ALD, PEALD, or combinations thereof. A chemical-mechanical polishing (CMP) process may be performed to planarize the top surfaces of the device 100, and to expose the top surfaces of the dummy gate structures 210. In the operation depicted in FIGS. 8A-8D, the dielectric material 248 completely fills both the trenches 151 and the openings 161.

Figure 9B:
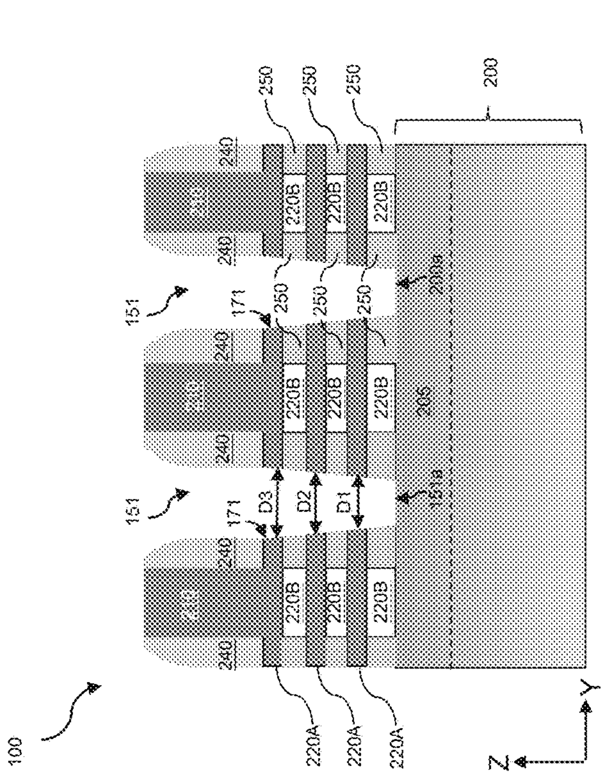
Figure 9D:
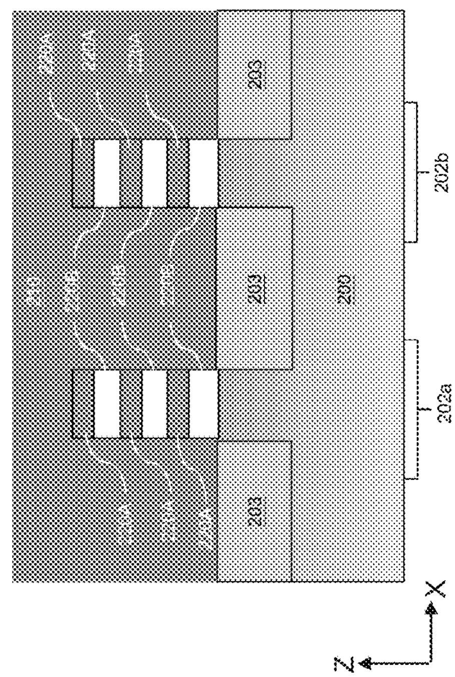
Figure 9A:
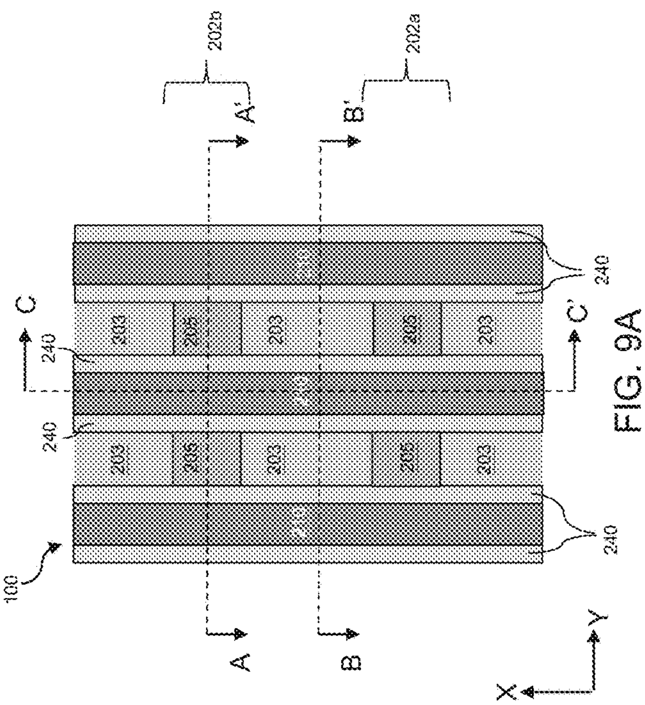
Figure 9C:
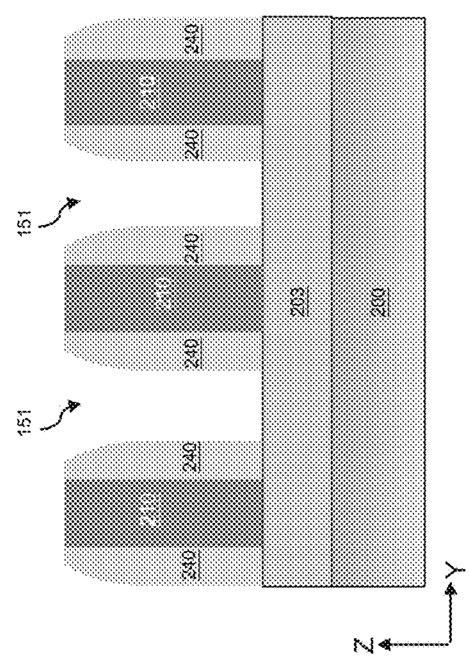

Referring to block 880 of FIG. 1A and FIGS. 9A-9D, the dielectric material 248 is etched back such that the top surface 200*a* of the substrate 200 is exposed. In the depicted embodiment, the etching-back is a self-aligned anisotropic dry-etching process, such that the top spacers 240 are used as the masking element. Alternatively, a different masking element (e.g. a photoresist) may be used. The etching-back process may be similar to the process described above in reference to FIGS. 6A-6D where formation of the tapered trenches 151 was described. The etching-back process removes the dielectric materials 248 within the tapered trenches 151 but does not substantially affect the dielectric materials 248 within the openings 161. As a result, the dielectric material 248 filling the openings 161 become inner spacers 250. In other words, the inner spacers 250 are formed between vertically adjacent (e.g. along in the Z-direction) side portions 220A-side of the semiconductor layers 220A (see FIG. 9B). In the present embodiment, the inner spacers 250 are only present in the active regions. As illustrated in FIG. 9C, no inner spacers 250 are present over the isolation features 203. Rather, only top spacers 240 are present over the isolation features 203. As illustrated in FIG. 9B, the sidewall surfaces of the inner spacers 250, the top spacers 240, and side surfaces of the semiconductor layers 220A form continuous sidewall surfaces 171. In other words, the continuous sidewall surfaces 171 include both exposed side surfaces of semiconductor materials from the semiconductor layers 220A and exposed side surfaces of dielectric material from the top spacers 240 and the inner spacers 250. Furthermore, due to the tapered profile of the sidewalls of continuous sidewall surfaces 171, a distance between horizontally adjacent portions of the semiconductor layer 220A (e.g. along the Y-direction) decreases from a mouth of the trench 151 to the bottom 151*a* of the trench 151. For example, in FIG. 9B, the distance D3 between horizontally adjacent portions of the semiconductor layer 220A at the mouth of the trench 151 is greater than the distance D2 between horizontally adjacent portions of the semiconductor layer 220A at a middle region of the trench 151. Similarly, the distance D2 is greater than the distance D1 between horizontally adjacent portions of the semiconductor layer 220A near the bottom 151*a* of the trench 151.

Figure 10A:
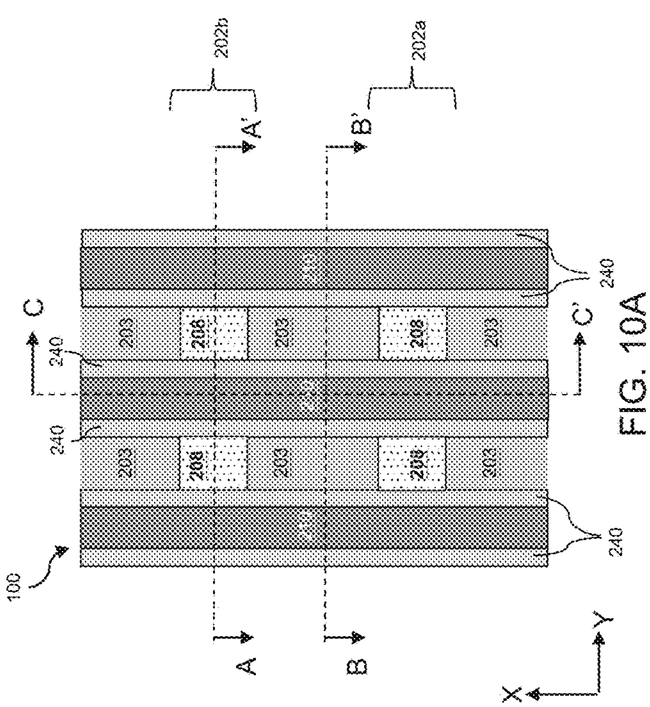
Figure 10B:
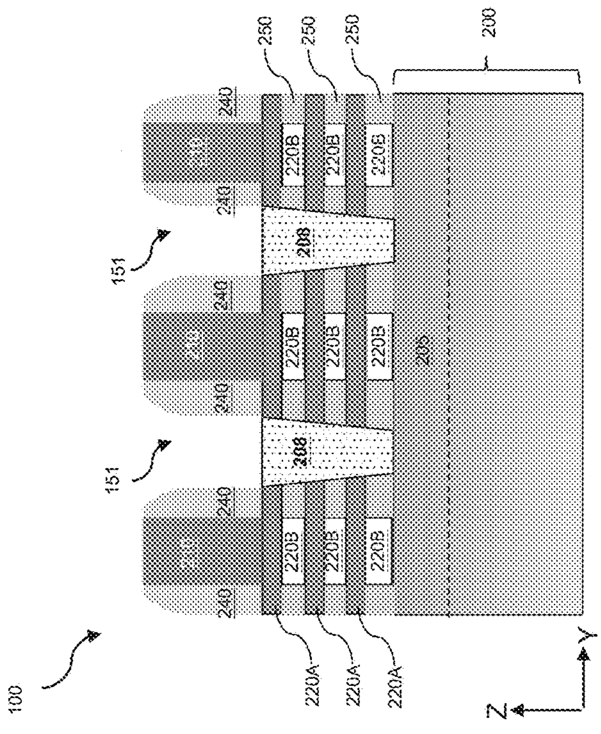
Figure 10C:
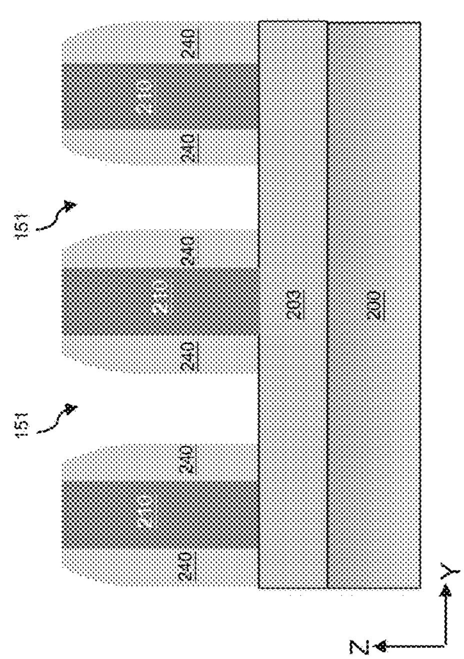
Figure 10D:
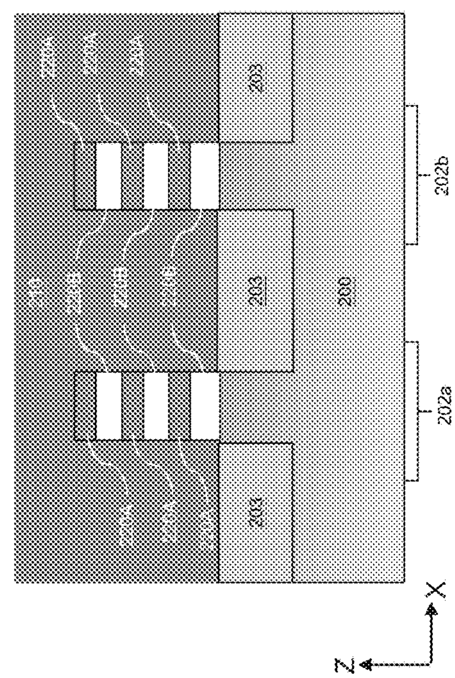
Figure 11B:
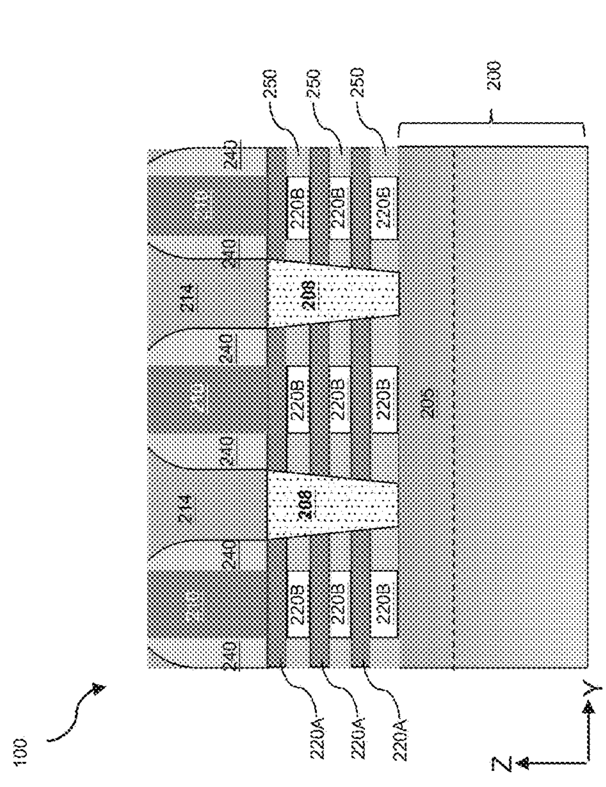
Figure 11D:
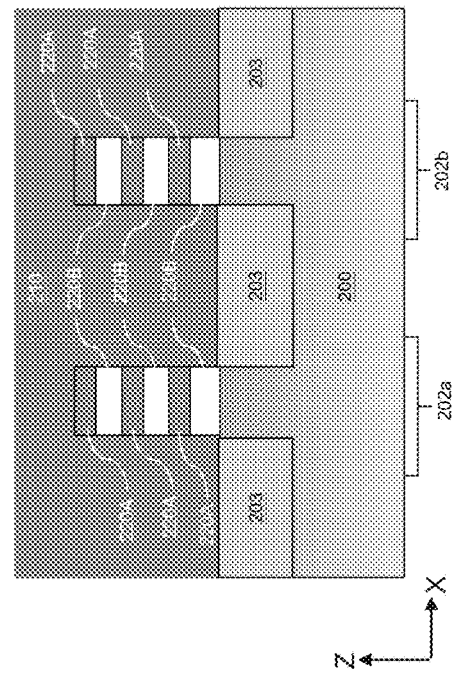
Figure 11A:
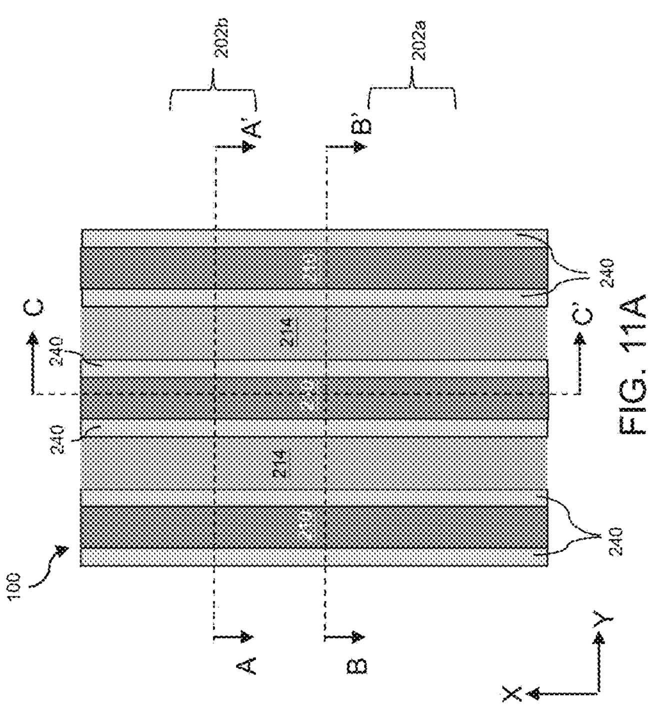
Figure 11C:
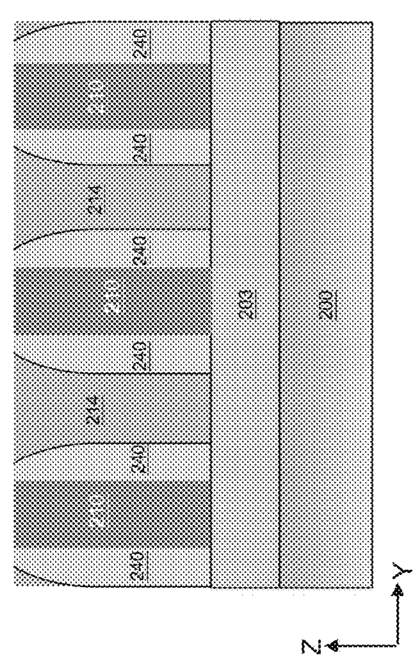

Referring to block 890 of FIG. 1B and FIGS. 10A-10D, the method 800 continues to forming epitaxial source/drain features 208 in the trenches 151. In some embodiments, one source/drain feature is a source electrode, and the other source/drain feature is a drain electrode. The semiconductor layers 220A that extend from one source/drain feature 208 to the other source/drain feature 208 may form channels of the GAA device 100. Multiple processes including etching and growth processes may be employed to grow the epitaxial source/drain features 208. In the depicted embodiment, the epitaxial source/drain features 208 have top surfaces that are substantially aligned with the top surface of the topmost semiconductor layer 220A. However, in other embodiments, the epitaxial source/drain features 208 may alternatively have top surfaces that extend higher than the top surface of the topmost semiconductor layer 220A (e.g. in the Z-direction). In the depicted embodiment, the epitaxial source/drain features 208 occupy a lower portion of the trenches 151 (e.g. the portion defined by the inner spacers 250 and the semiconductor layers 220A), leaving an upper portion of the trenches 151 (e.g. the portion defined by the top spacers 240) open. In some embodiments, the epitaxial source/drain features 208 may merge together, for example, along the X-direction, to provide a larger lateral width than an individual epitaxial feature. In the depicted embodiments, as shown in FIG. 10A, the epitaxial source/drain features 208 are not merged.

The epitaxial source/drain features 208 may include any suitable semiconductor materials. For example, the epitaxial source/drain features 208 in an n-type GAA device may include Si, SiC, SiP, SiAs, SiPC, or combinations thereof; while the epitaxial source/drain features 208 in a p-type GAA device may include Si, SiGe, Ge, SiGeC, or combinations thereof. The source/drain features 208 may be doped in-situ or ex-situ. For example, the epitaxially grown Si source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features; and the epitaxially grown SiGe source/drain features may be doped with boron. One or more annealing processes may be performed to activate the dopants in the epitaxial source/drain features 208. The annealing processes may include rapid thermal annealing (RTA) and/or laser annealing processes.

The epitaxial source/drain features 208 directly interface with the continuous sidewall surfaces 171. During the epitaxial growth, semiconductor materials grow from the exposed top surface 200*a* of the substrate 200 (e.g. the exposed top surface of doped region 205) as well as from the exposed side surfaces of the semiconductor layers 220A. It is noted that semiconductor materials do not grow from the surfaces of the inner spacers 250 and the top spacers 240 during the epitaxial growth process. Since the distance between horizontally adjacent portions of the semiconductor layer 220A decreases from the mouth of the trench 151 to the bottom 151*a* of the trenches 151, the epitaxial growth process fills up the bottom of the trench 151 prior to the top of the trenches 151. Consequently, the tapered profile of the trenches 151 causes the epitaxial growth process to be a bottom-up conformal epitaxial growth process that fills the tapered trenches 151, thereby preventing voids from being formed in the epitaxial source/drain features 208.

Referring to block 900 of FIG. 1B and FIGS. 11A-11D, an interlayer dielectric (ILD) layer 214 is formed over the epitaxial source/drain features 208 in the remaining spaces of the trenches 151, as well as vertically over the isolation features 203. The ILD layer 214 may also be formed in between the adjacent gates 210 along the Y-direction, and in between the source/drain features 208 along the X-direction. The ILD layer 214 may include a dielectric material, such as a high-k material, a low-k material, or an extreme low-k material. For example, the ILD layer 214 may include $SiO_2$, SiOC, SiON, or combinations thereof. The ILD layer 214 may include a single layer or multiple layers, and may be formed by a suitable technique, such as CVD, ALD, and/or spin-on techniques. After forming the ILD layer 214, a CMP process may be performed to remove excessive portions of the ILD layer 214, thereby planarizing the top surface of the ILD layer 214. Among other functions, the ILD layer 214 provides electrical isolation between the various components of the GAA device 100.

Figure 12A:
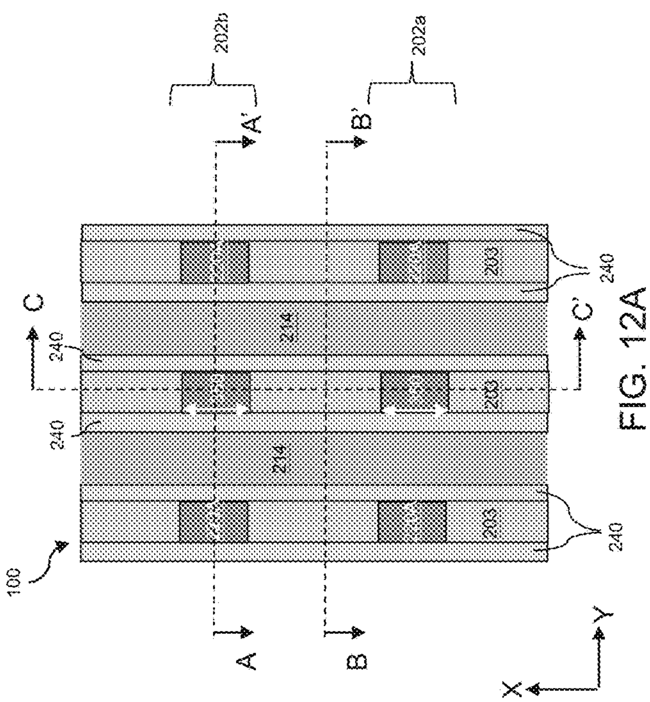
Figure 12B:
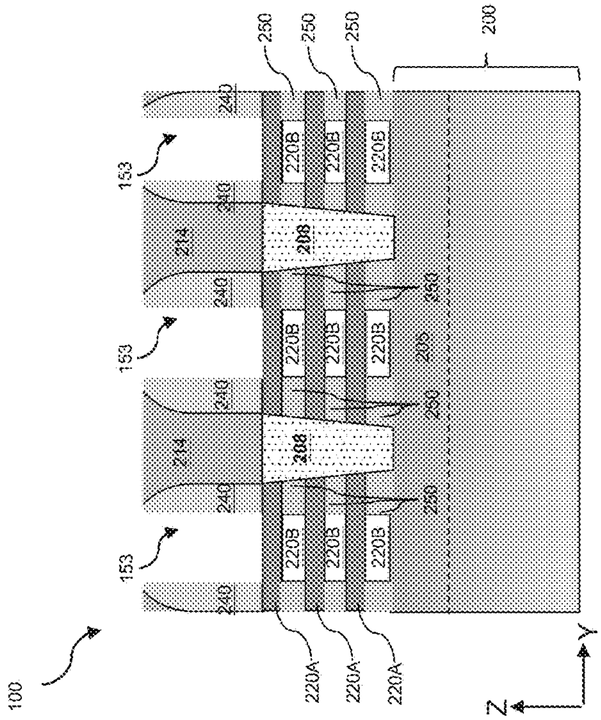
Figure 12C:
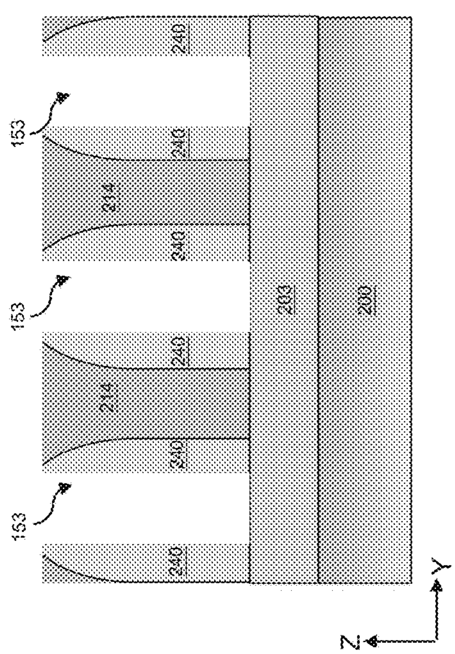
Figure 12D:
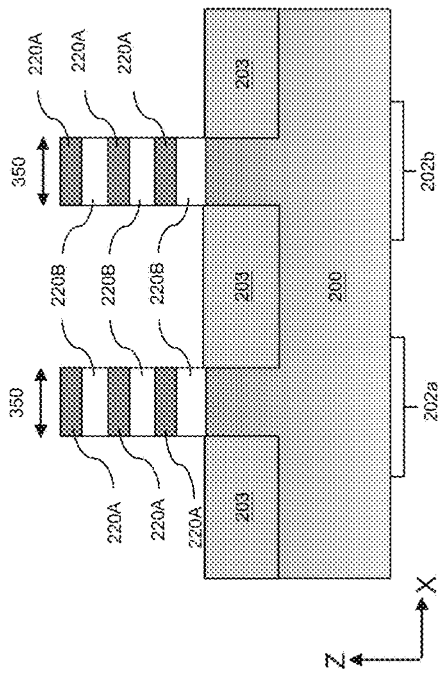
Figure 13B:
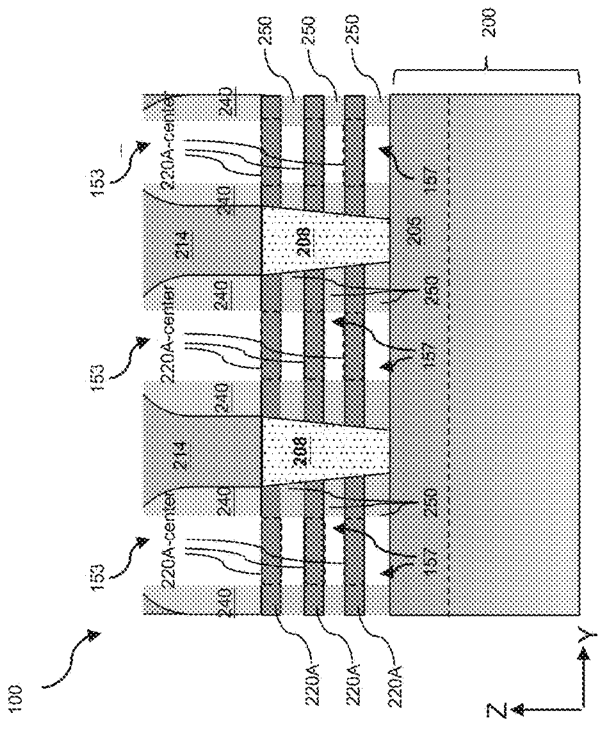
Figure 13D:
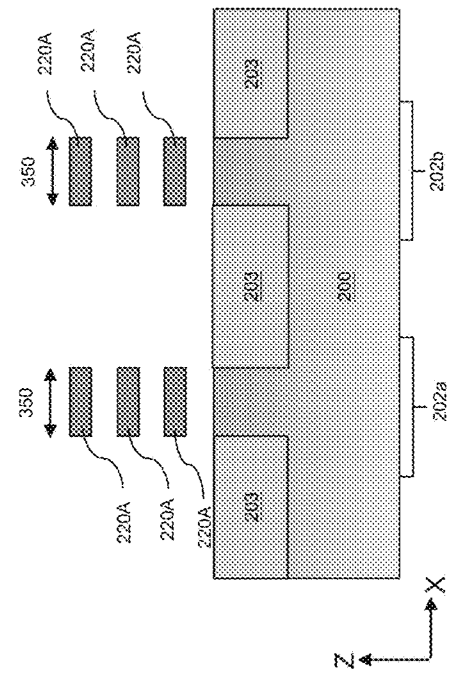
Figure 13A:
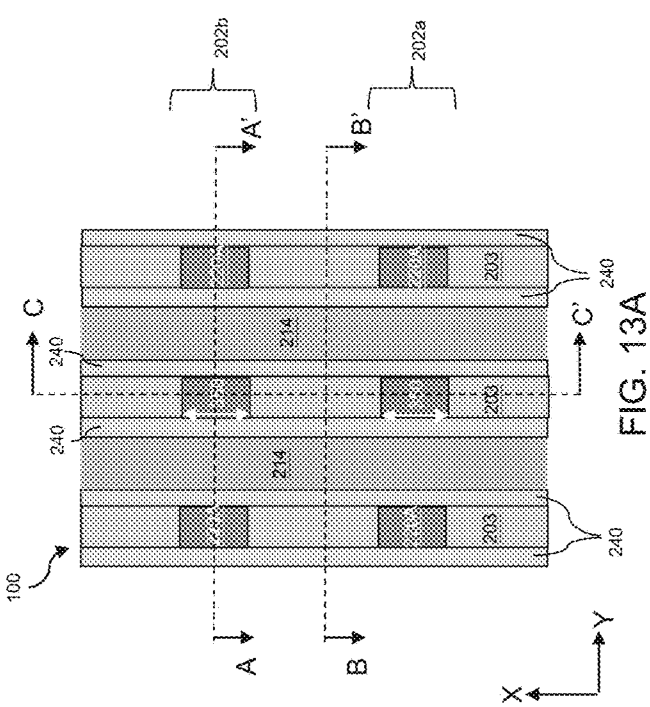
Figure 13C:
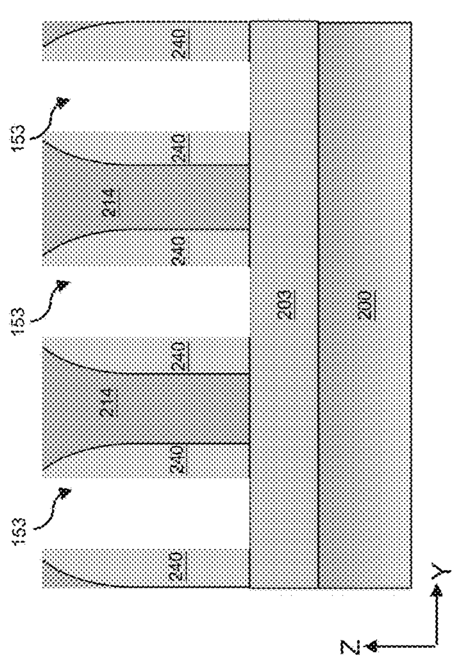
Figure 14B:
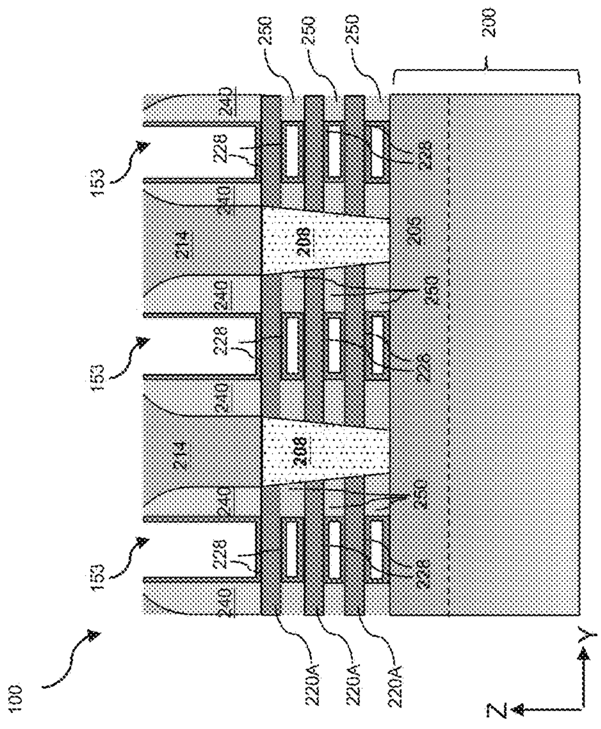
Figure 14D:
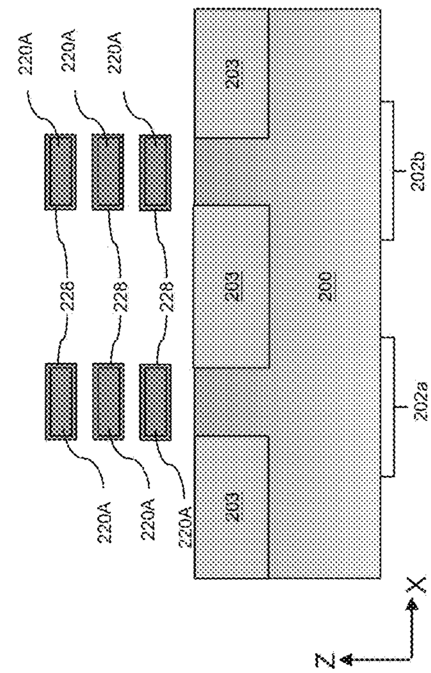
Figure 14A:
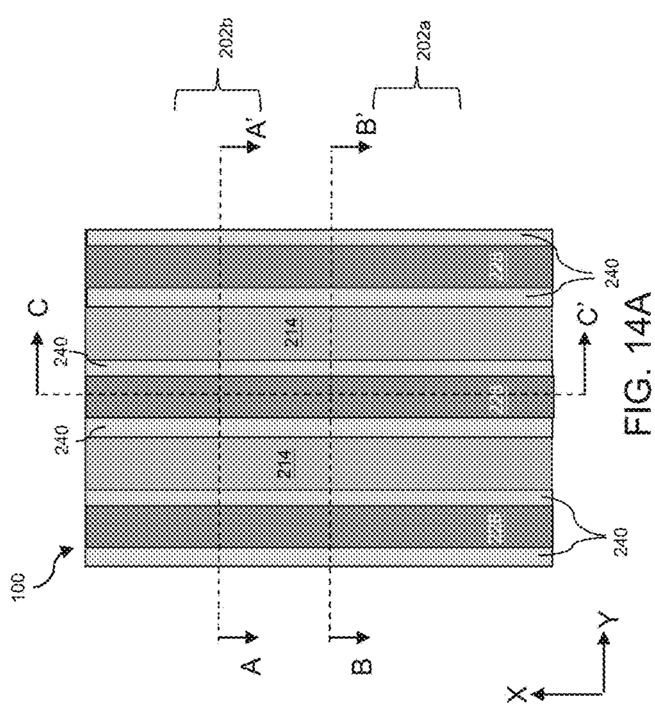
Figure 14C:
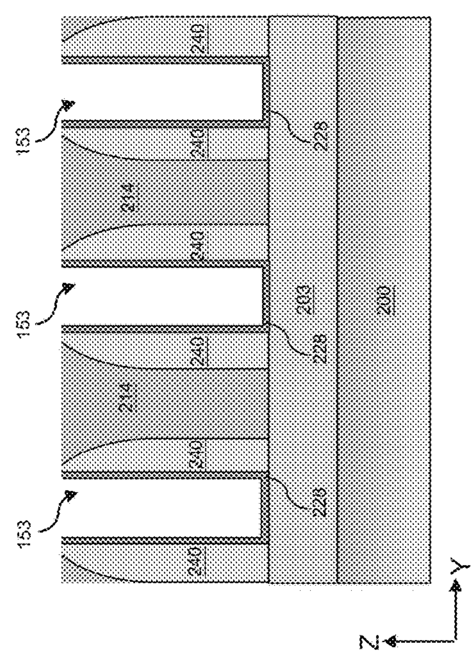
Figure 15B:
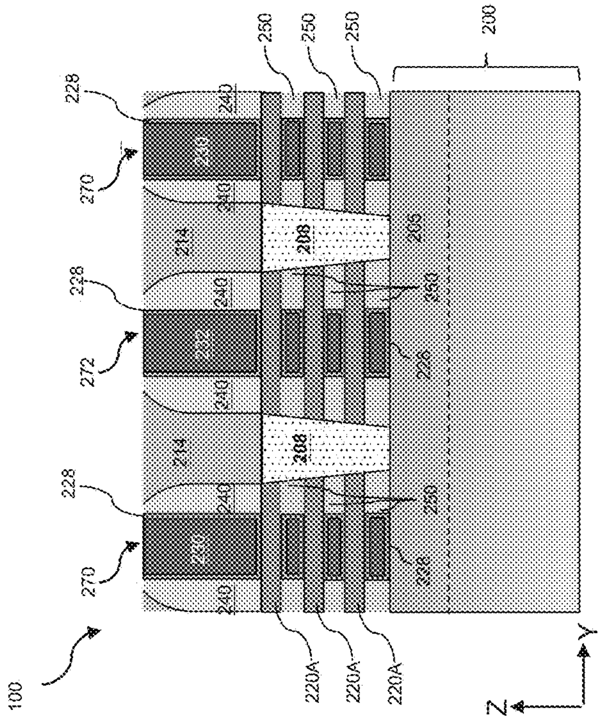
Figure 15D:
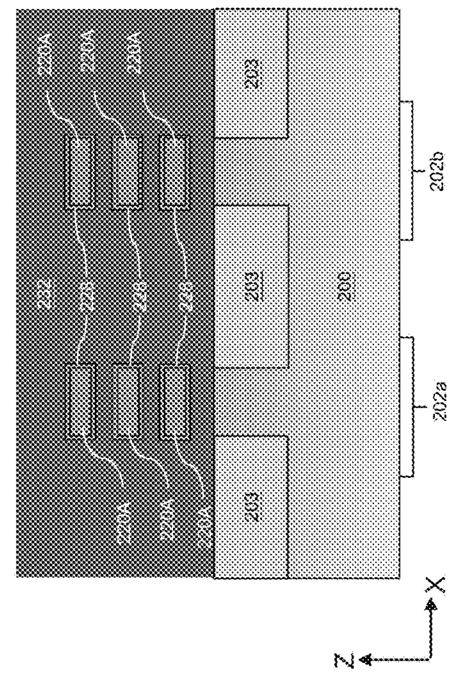
Figure 15A:
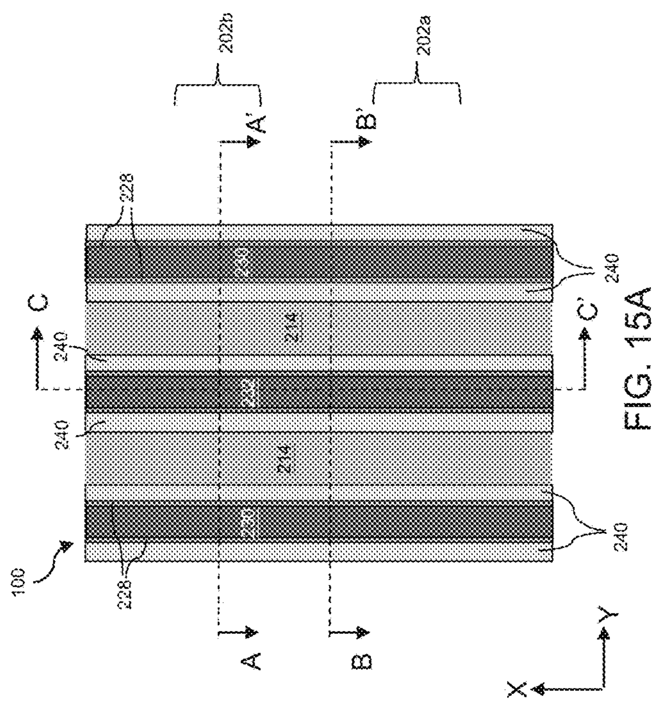
Figure 15C:
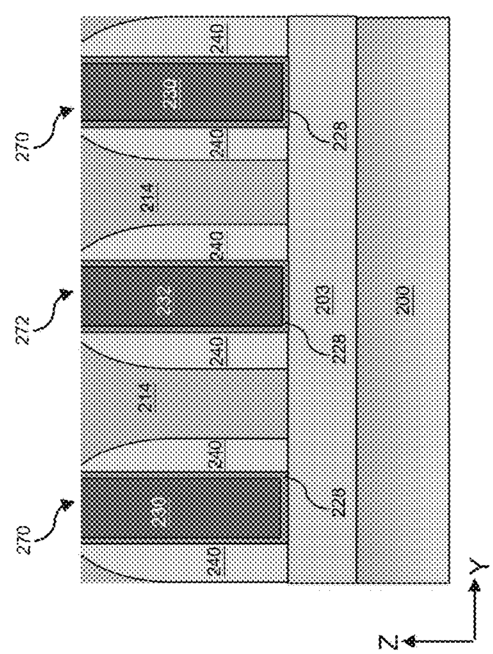
Figure 16A:
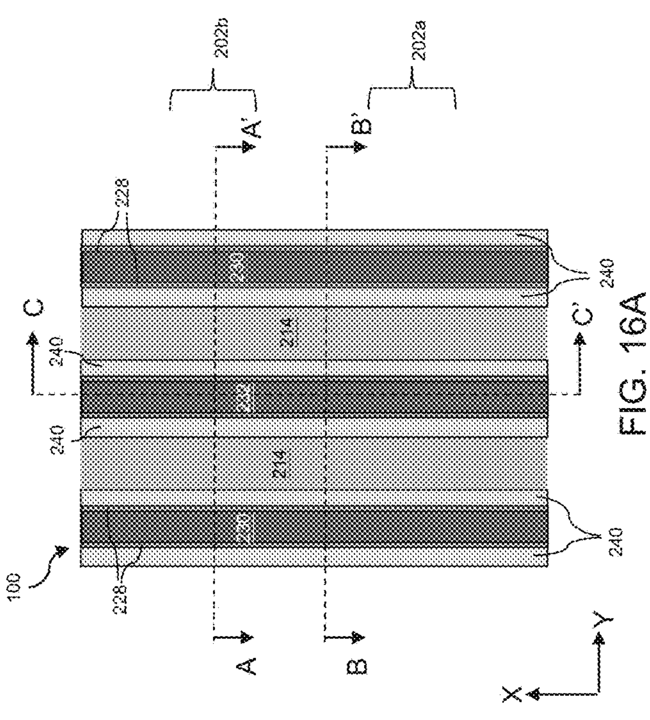
Figure 16B:
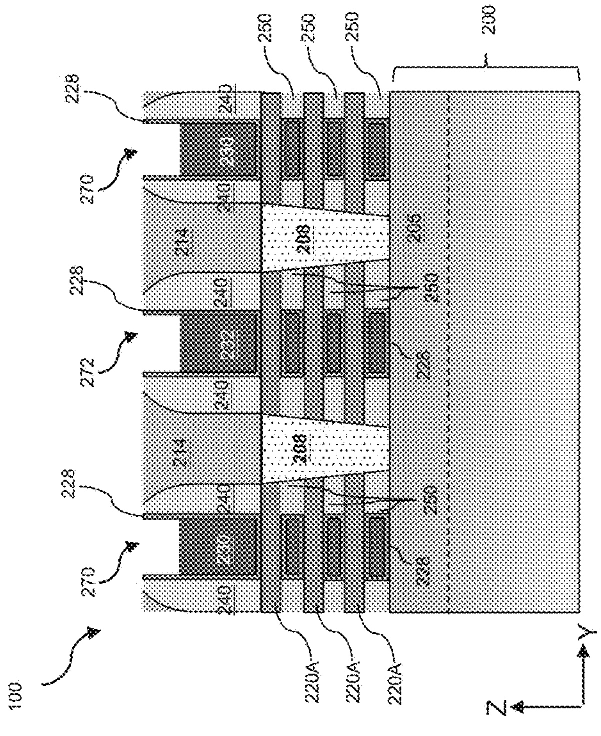
Figure 16C:
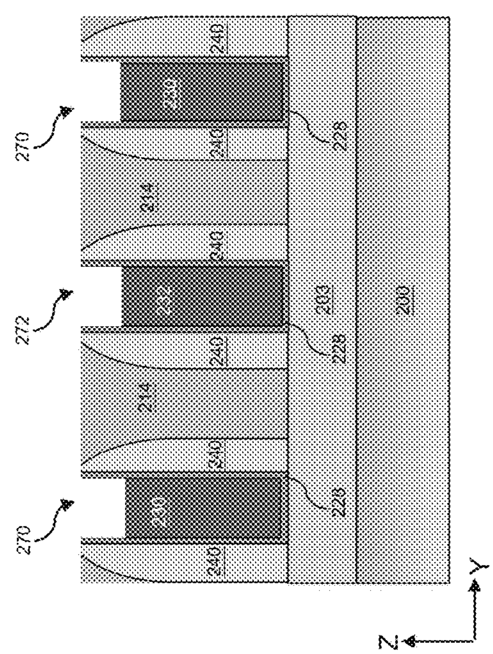
Figure 16D:
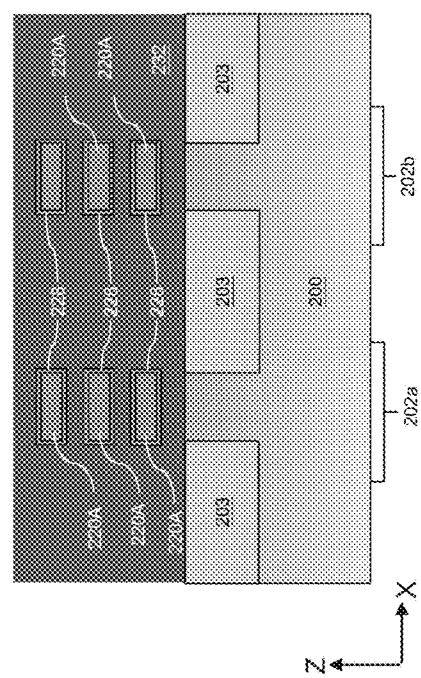
Figures 17A, 17B, 17C, 17D:
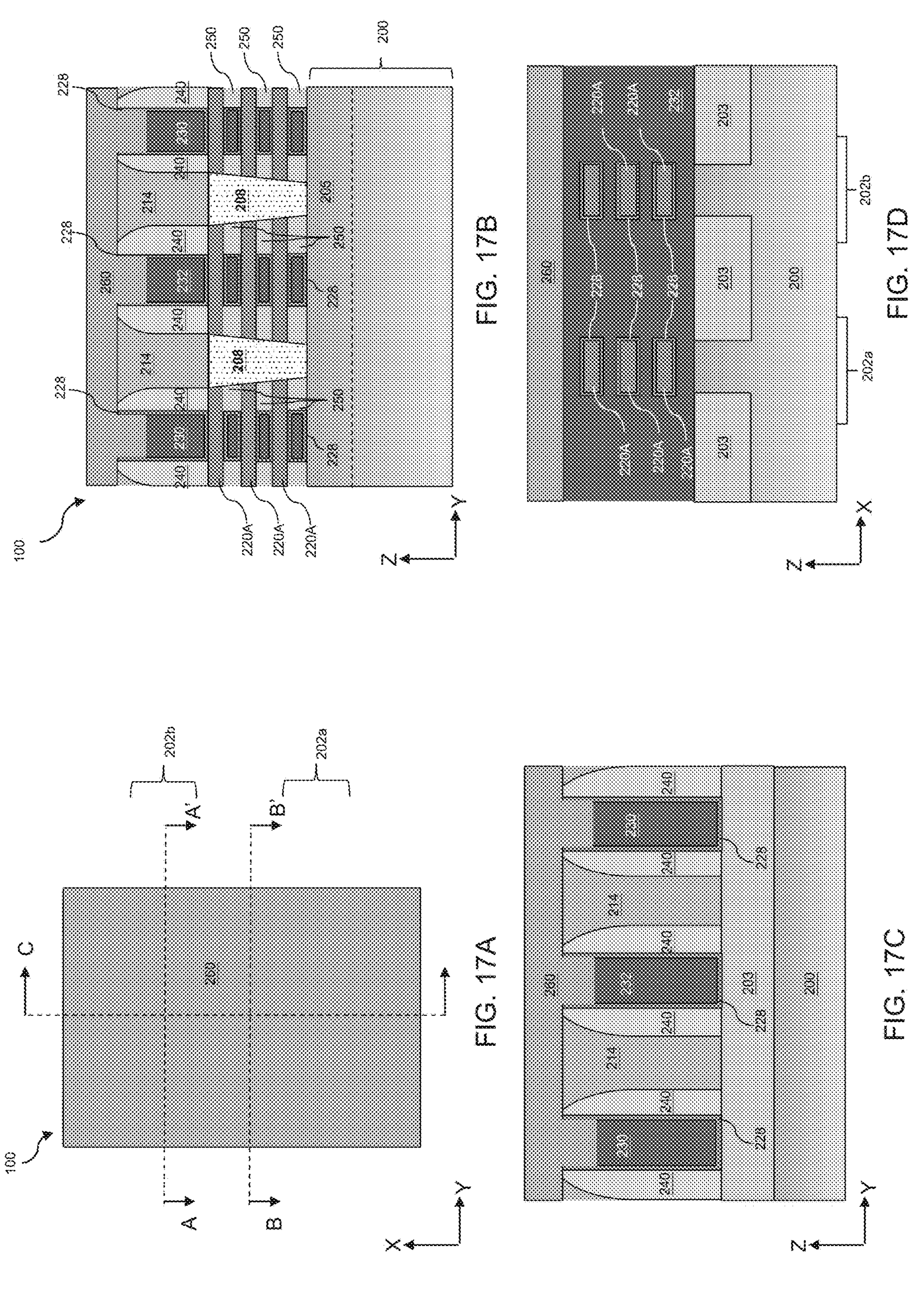
Figure 18B:
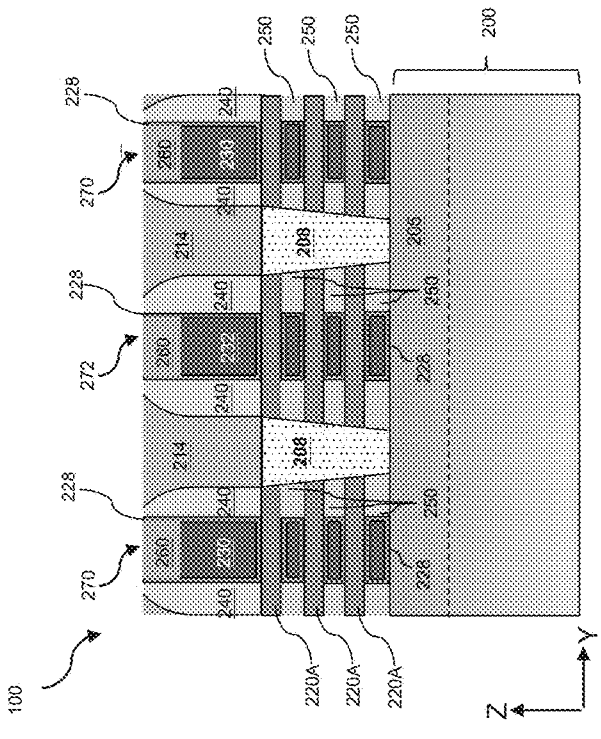
Figure 18D:
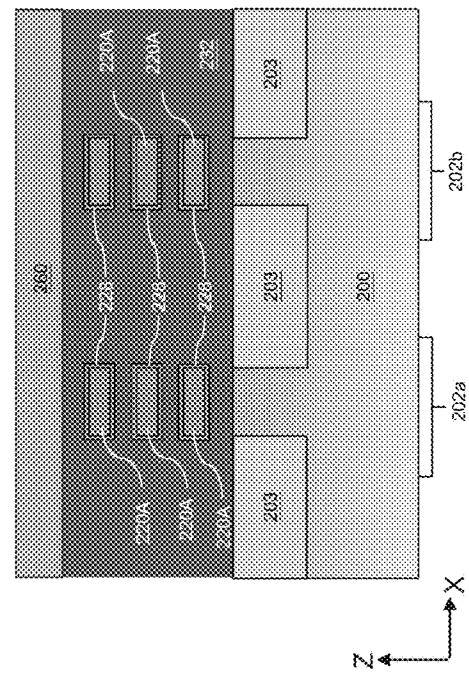
Figure 18A:
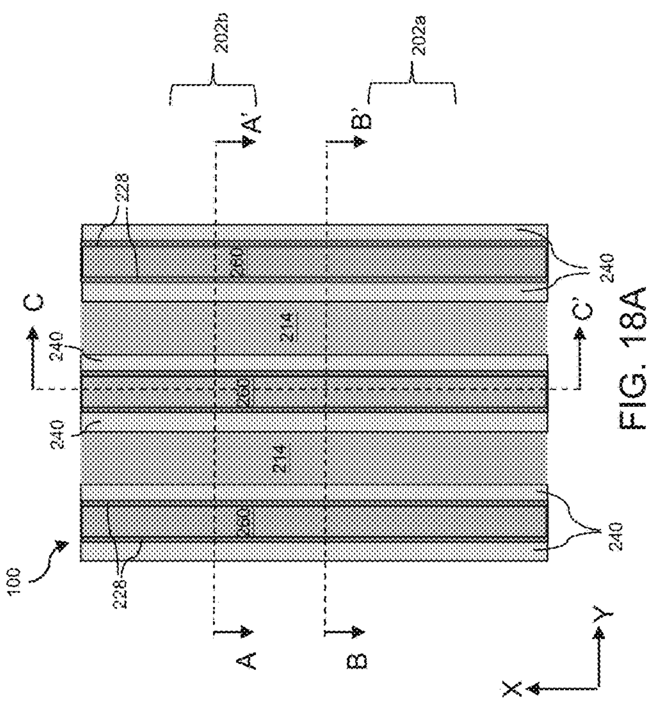
Figure 18C:
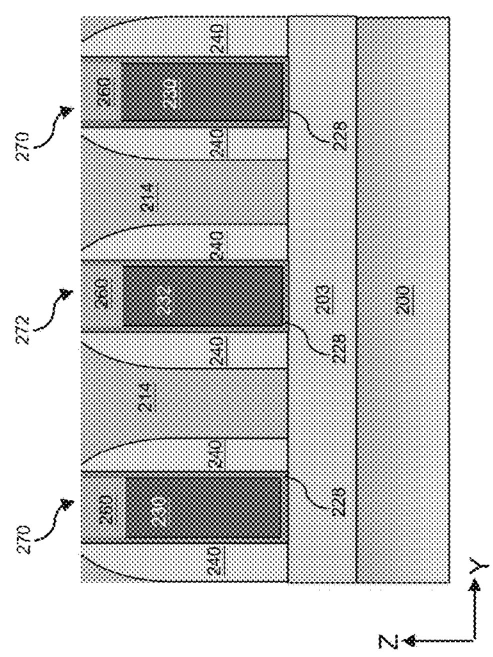
Figures 19A, 19B, 19C, 19D:
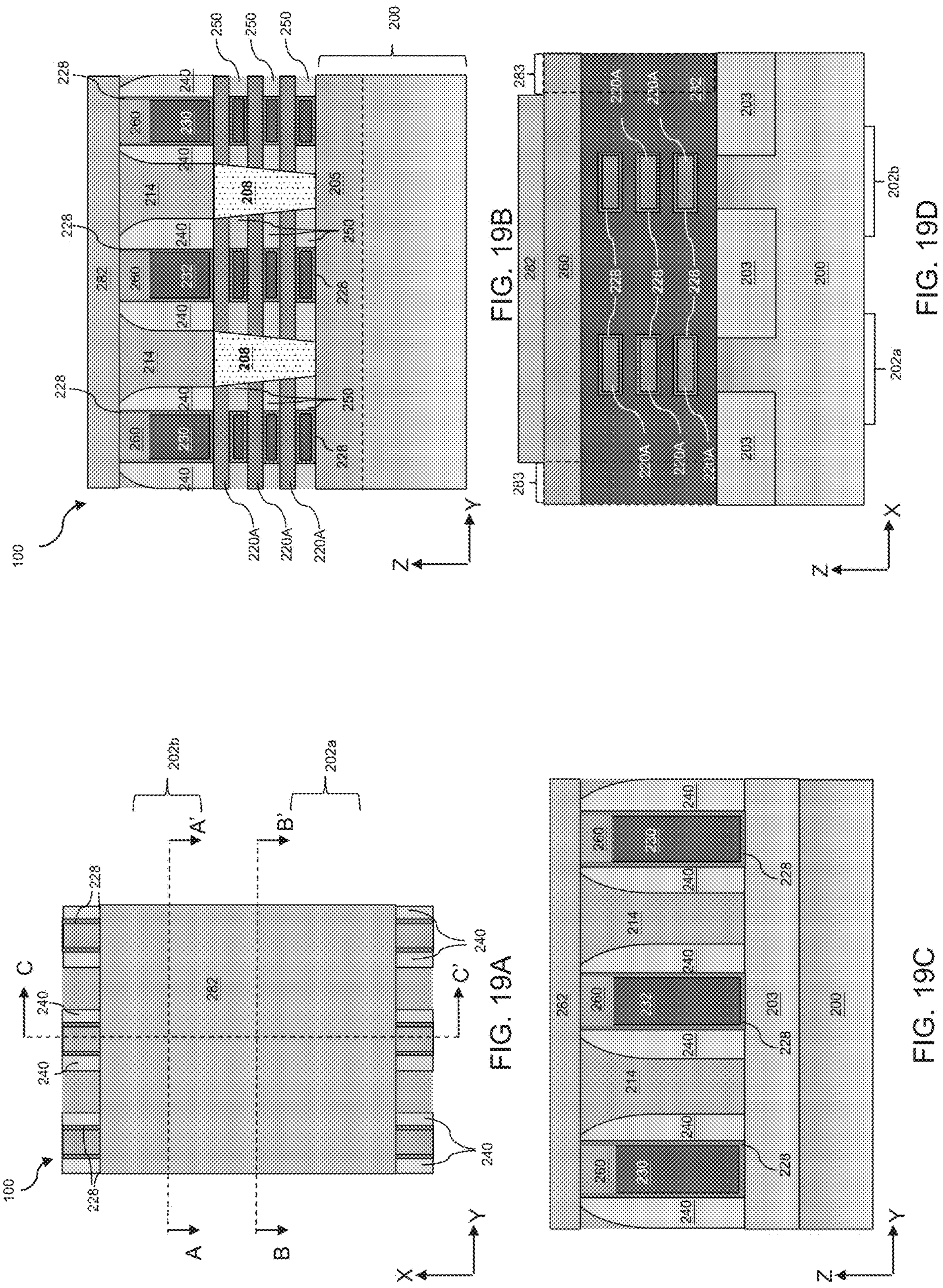
Figure 20B:
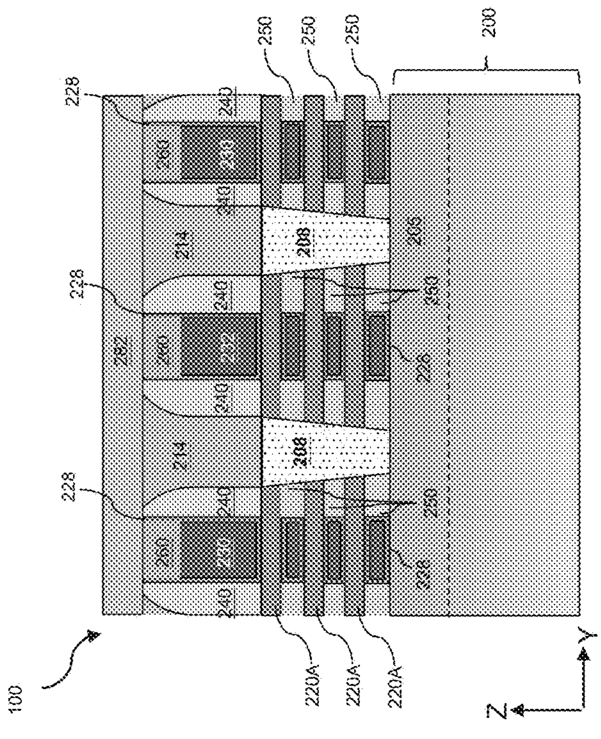
Figure 20D:
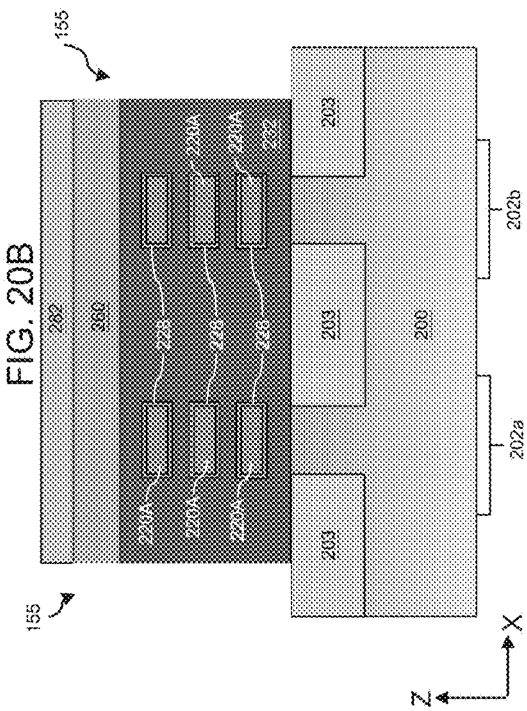
Figure 20A:
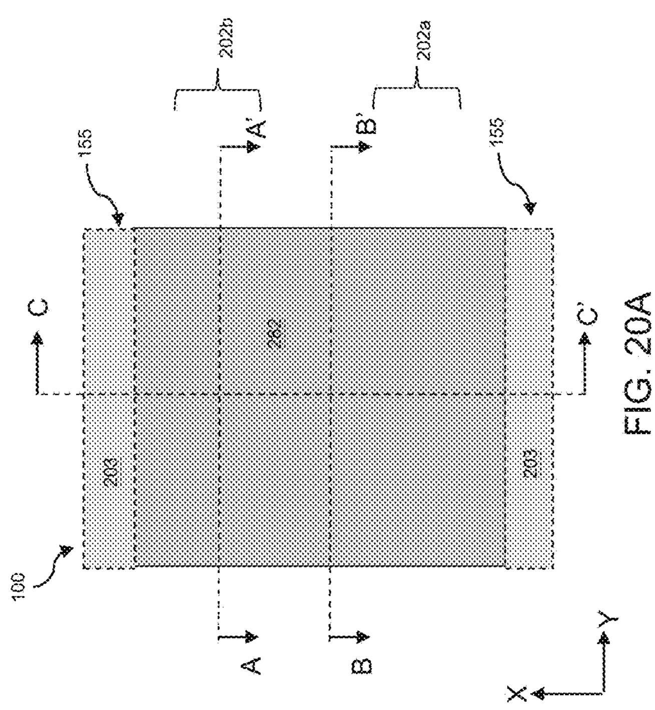
Figure 20C:
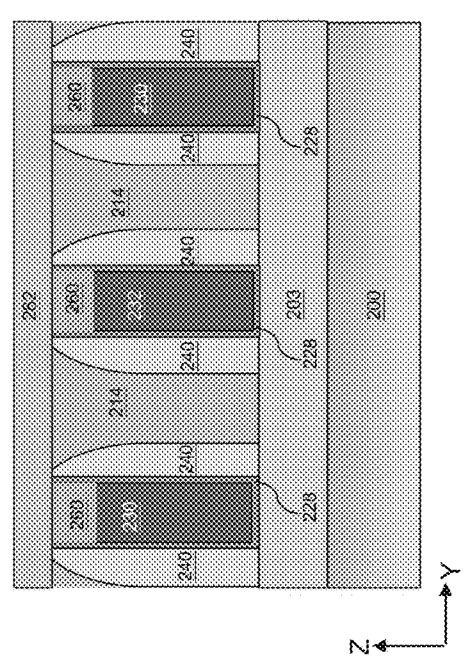
Figure 21B:
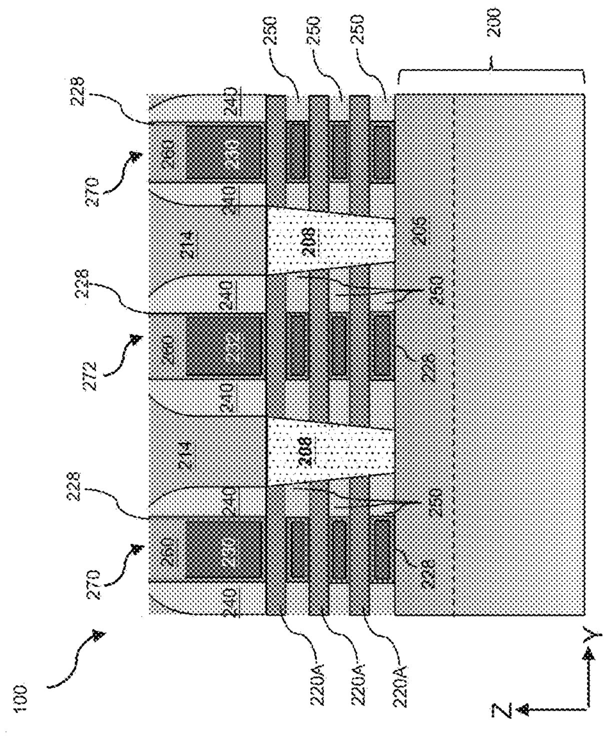
Figure 21D:
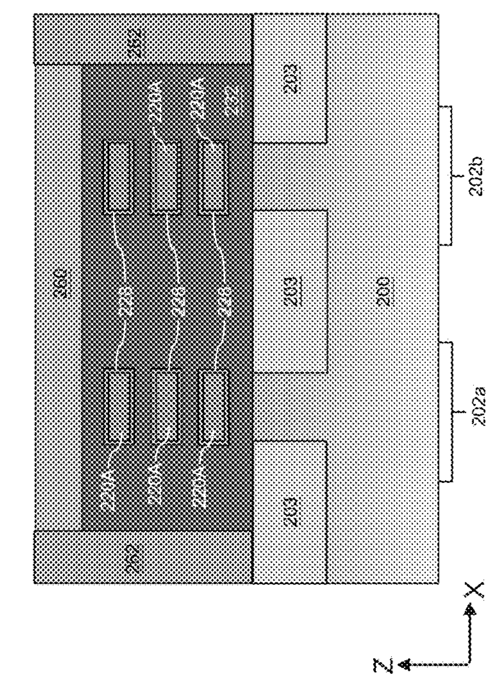
Figure 21A:
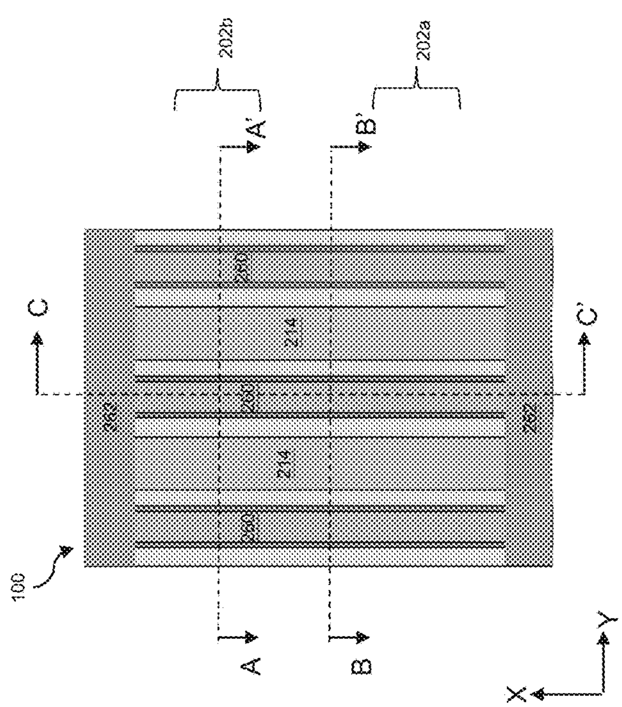
Figure 21C:
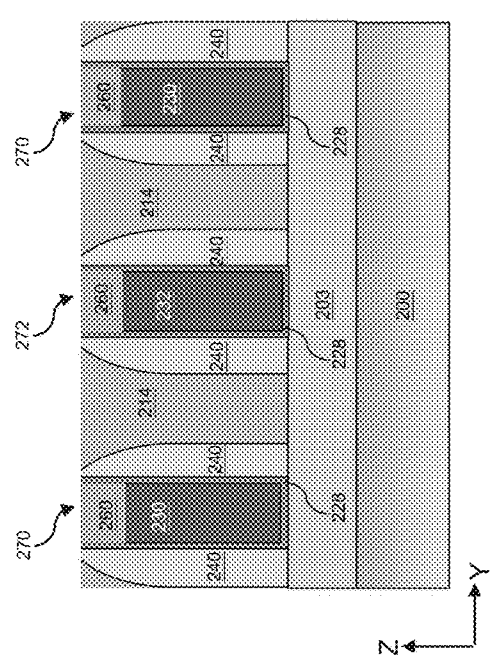
Figure 22A:
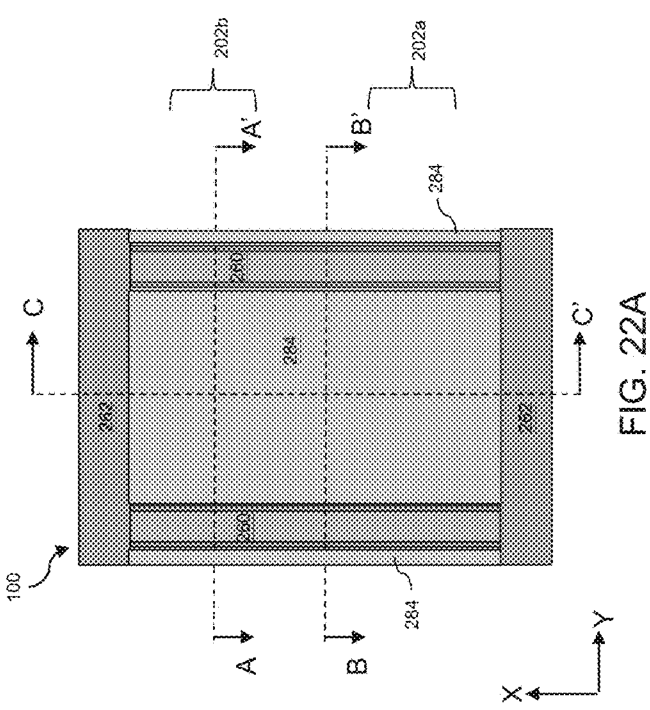
Figure 22B:
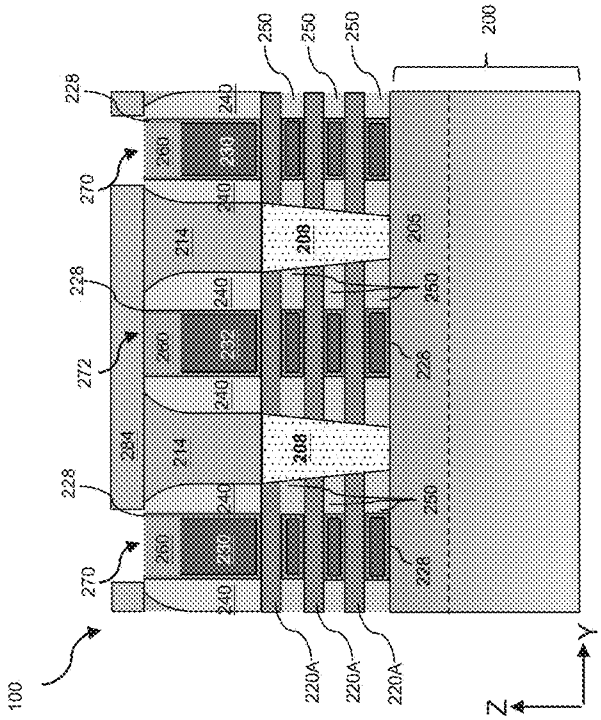
Figure 22C:
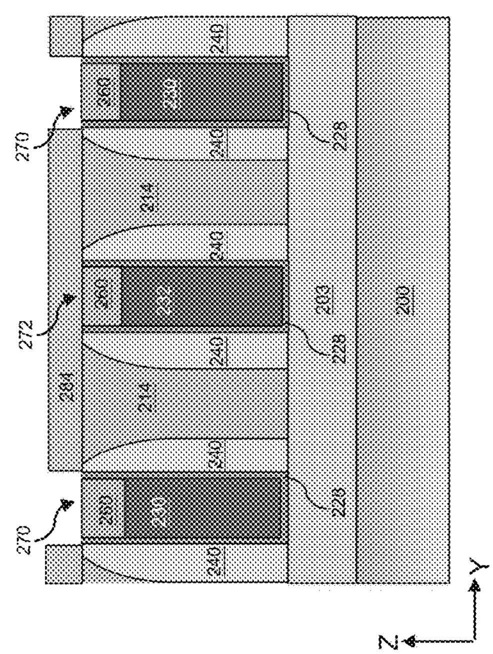
Figure 22D:
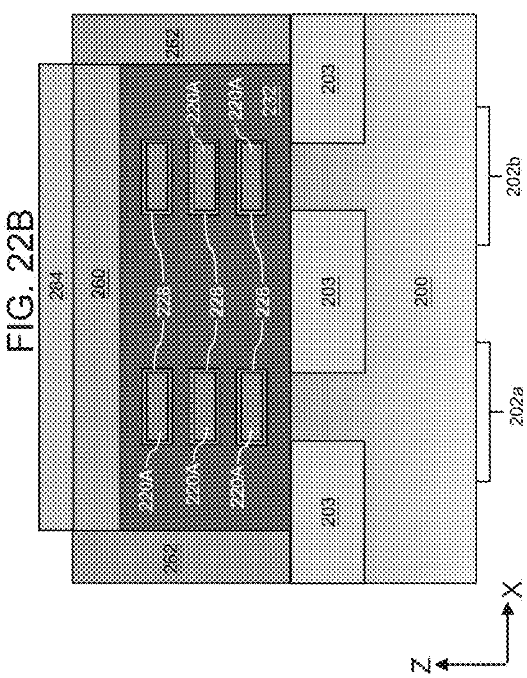
Figure 23A:
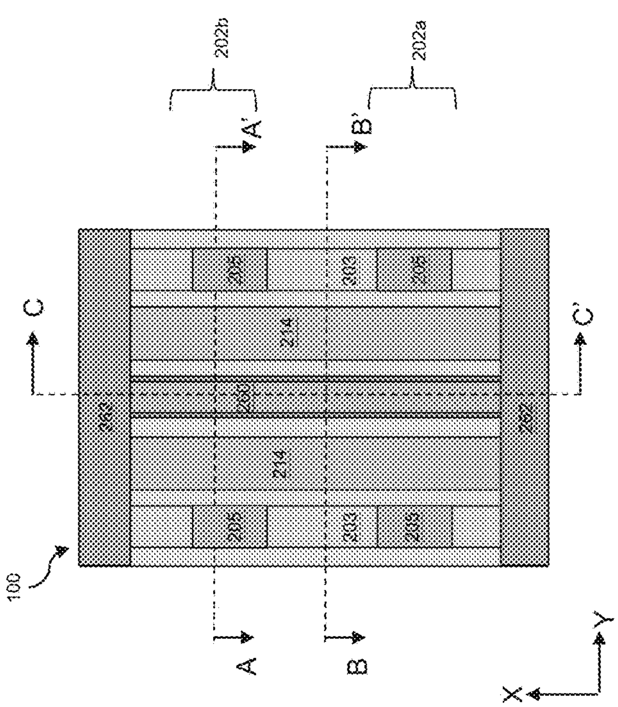
Figure 23B:
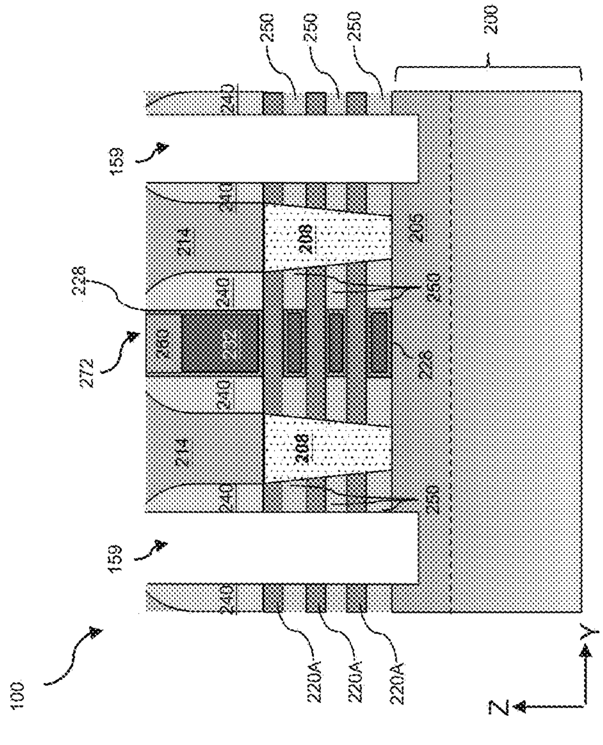
Figure 23C:
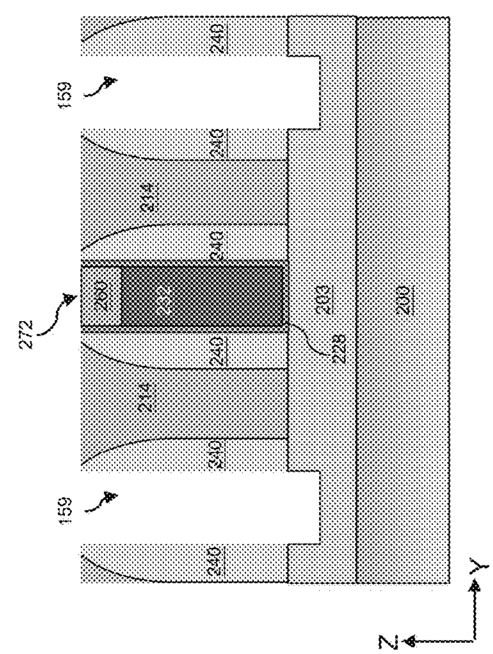
Figure 23D:
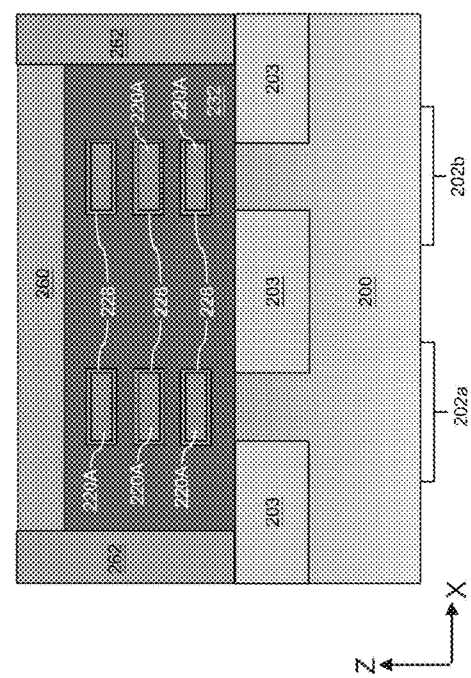
Figure 24A:
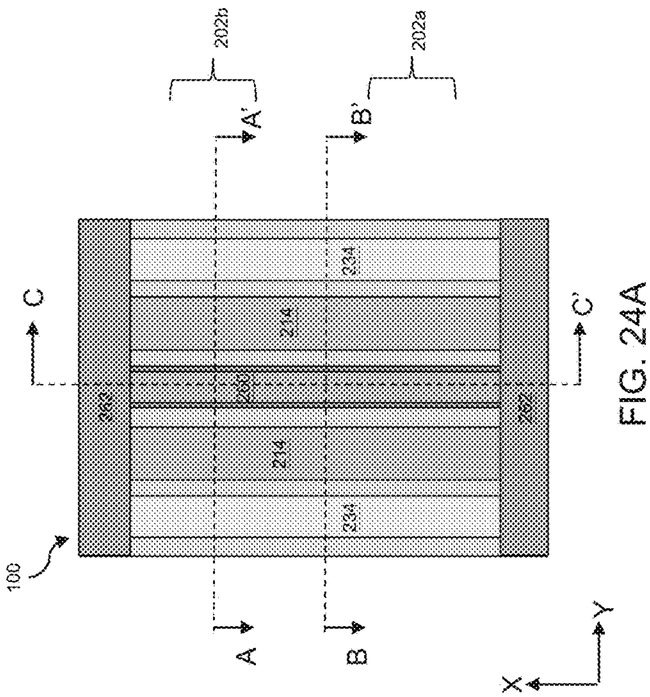
Figure 24B:
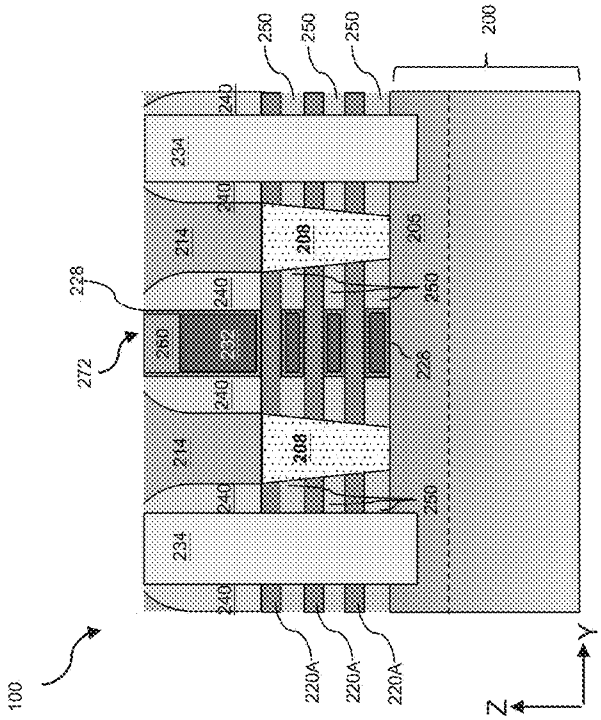
Figure 24C:
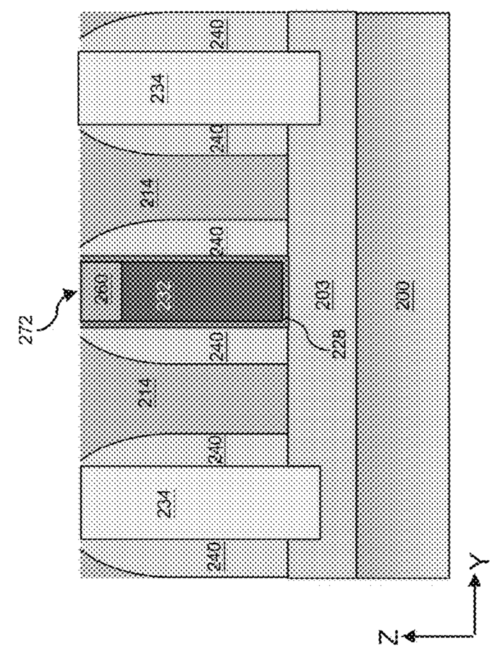
Figure 24D:
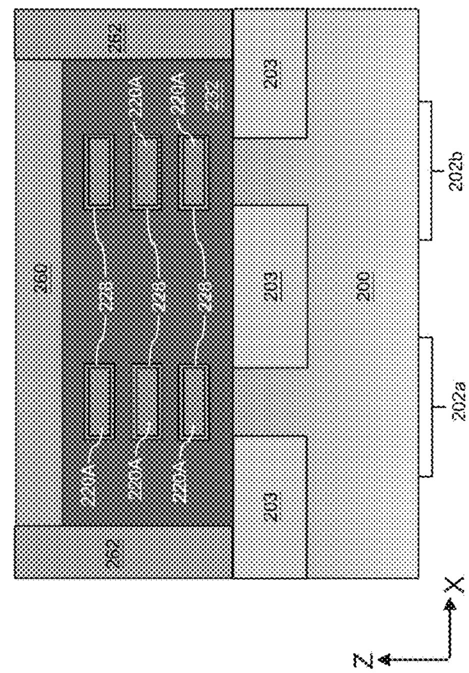
Figure 25B:
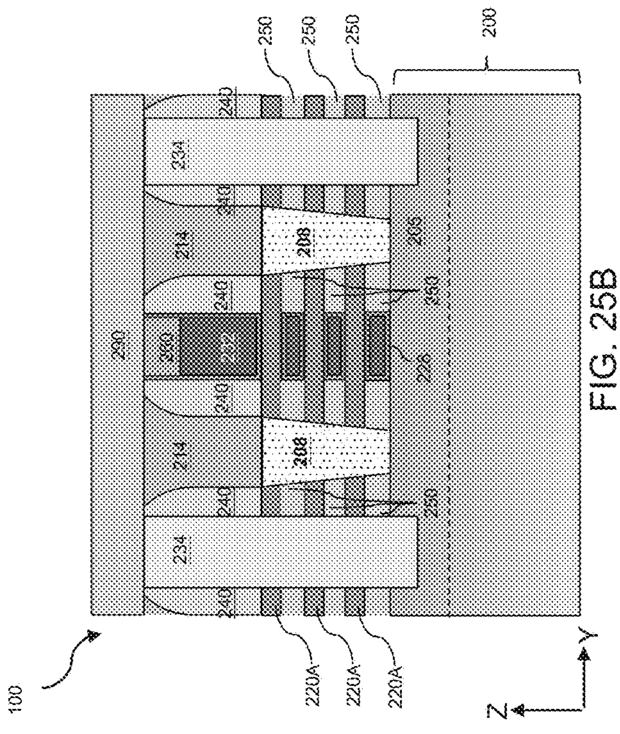
Figure 25D:
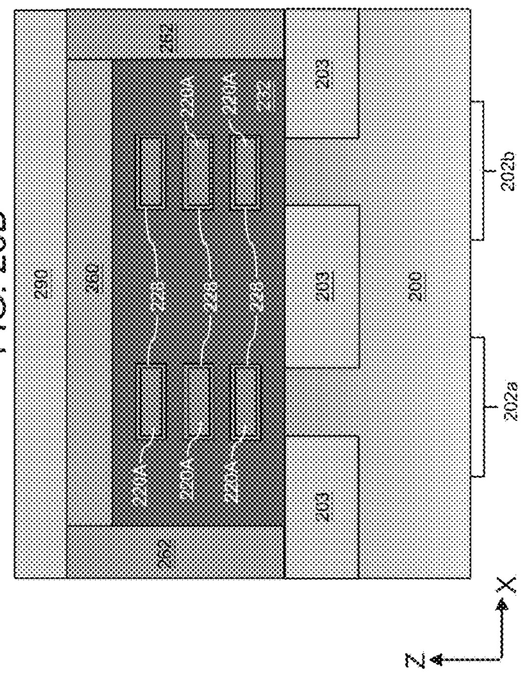
Figure 25A:
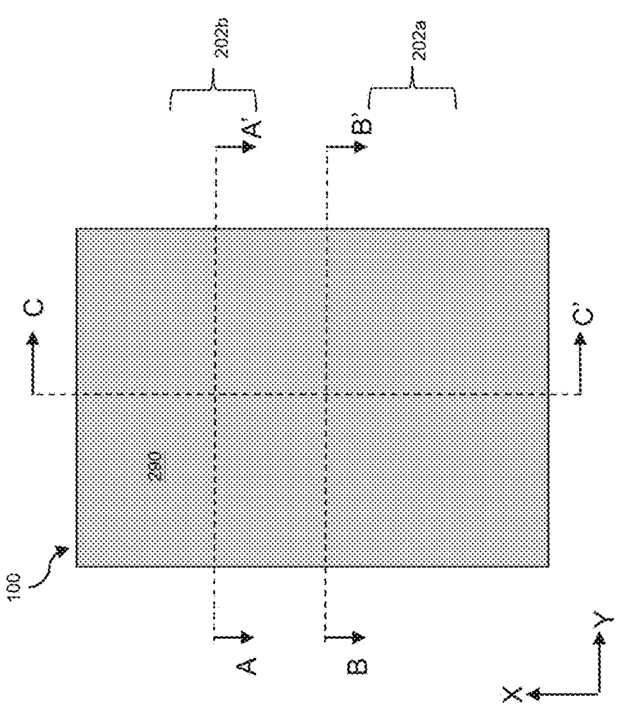
Figure 25C:
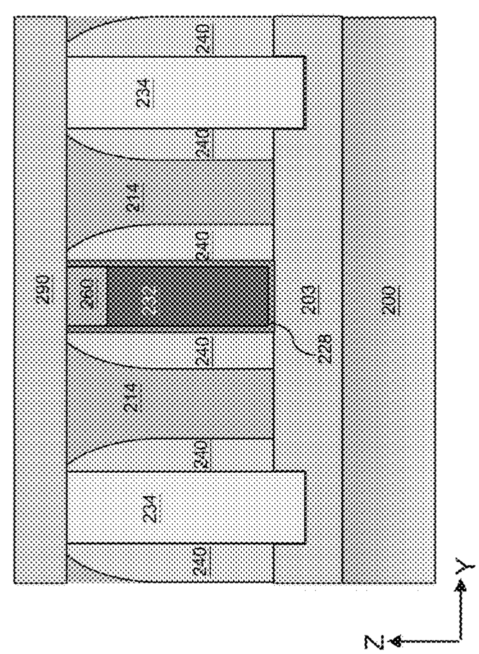
Figure 26A:
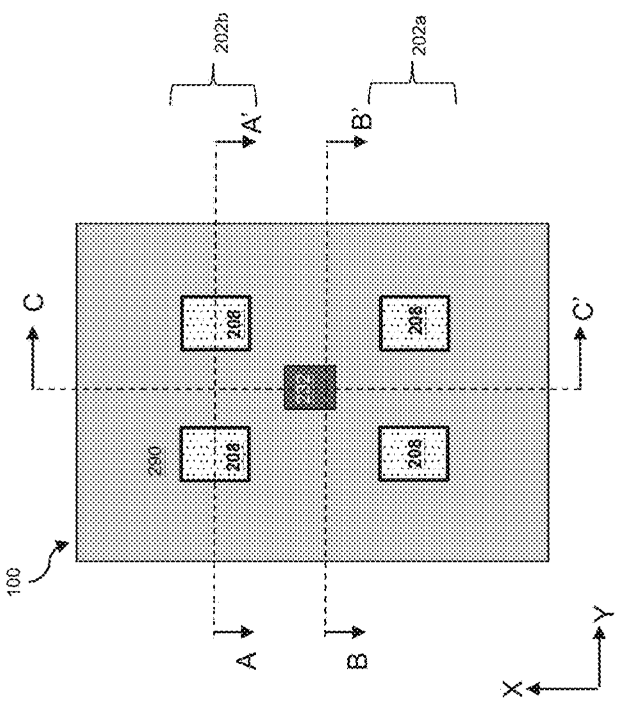
Figure 26B:
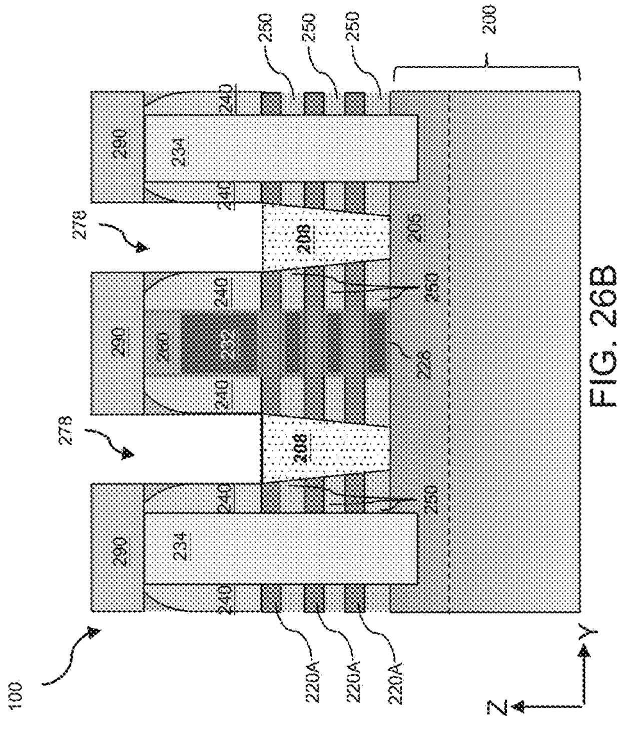
Figure 26C:
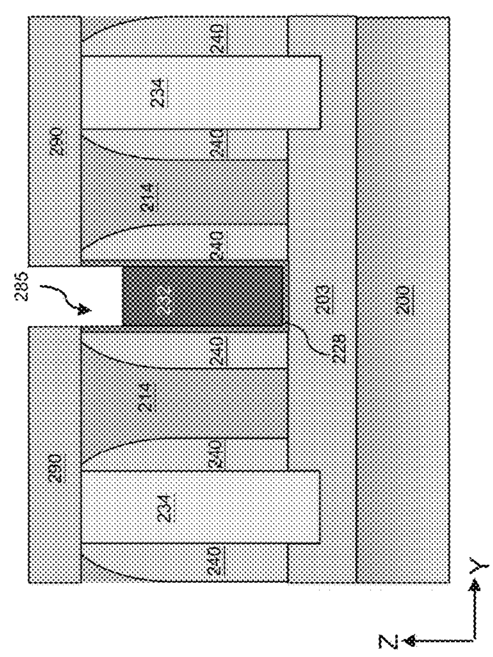
Figure 26D:
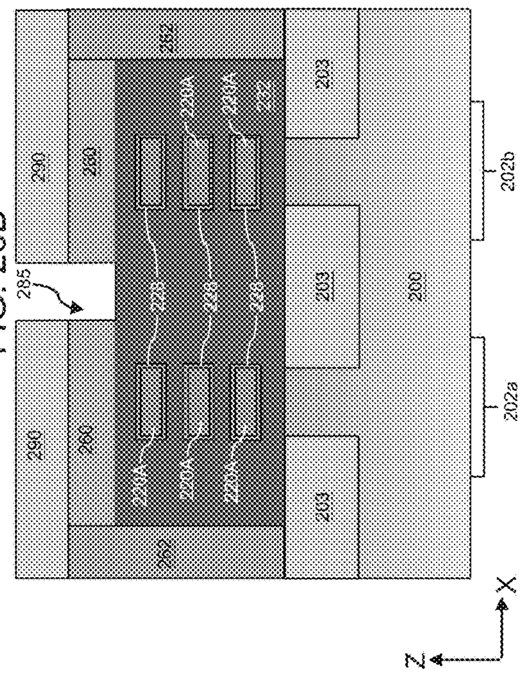

Referring to block 910 of FIG. 1B and FIGS. 12A-12D, the dummy gate structures 210 are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 210. Then, the dummy gate structures 210 are selectively etched through the masking element. In some other embodiments, the top spacers 240 may be used as the masking element or a part thereof. For example, the dummy gate structures 210 may include polysilicon, the top spacers 240 and the inner spacers 250 may include dielectric materials, and the semiconductor layers 220A-center includes a semiconductor material. Therefore, an etch selectivity may be achieved by selecting appropriate etching chemicals, such that the dummy gate structures 210 may be removed without substantially affecting the features of the GAA device 100. The removal of the dummy gate structures 210 creates gate trenches 153. The gate trenches 153 expose the top surfaces and the side surfaces of the stack of semiconductor layers 220A, 220B, as depicted in FIG. 12D. In other words, the center portions 220A-center and 220B-center are exposed at least on two side surfaces in the gate trenches 153. Additionally, the gate trenches 153 also expose the top surfaces of the isolation features 203.

Referring to block 920 of FIG. 1B and FIGS. 13A-13D, any remaining center portions 220B-center are also selectively removed through the gate trenches 153, for example using wet or dry etching process. The etching chemical is selected such that the center portions 220B-center has a sufficiently different etching rate as compared to the center portions 220A-center and the inner spacers 250. As a result, the center portions 220A-center and the inner spacers 250 remain substantially unchanged. This selective etching process may include one or more etching steps.

As illustrated in FIGS. 13A-13D, in the present embodiment, the removal of the semiconductor layers 220B forms suspended semiconductor layers 220A-center and openings 157 in between the vertically adjacent layers (e.g. in the Z-direction), thereby exposing the top and bottom surfaces of the center portions 220A-center. Each of the center portions 220A-center are now exposed circumferentially in the X-Z plane. In addition, the portion of the doped regions 205 beneath the center portions 220A-center are also exposed in the openings 157. In some other embodiments however, the removal process only removes some but not all of the center portions 220B-center.

In the examples depicted in FIGS. 12A-12D and FIGS. 13A-13D, the gate trench 153 and the opening 157 vertically adjacent to the gate trench 153 (e.g. in the Z-direction) collectively form an opening having a vertical profile. In other words, the opening collectively formed by the gate trench 153 and its corresponding opening 157 have vertical sidewalls. In some embodiments, such openings having the vertical sidewalls may be formed by a plurality of etch processes. For example, the etch chemistry of the etch process used to remove the dummy gate structures 210 and thereby form the gate trenches 153 (e.g. in FIGS. 12A-12D) may include hydrogen bromide (HBr) combined with chlorine ($Cl_2$), tetrafluoromethane ($CF_4$), oxygen, or a combination thereof. Furthermore, the etch process used to selectively remove the semiconductor layers 220B and thereby form the openings 157 (e.g. in FIGS. 13A-13D) may have an initial etch chemistry including hydrogen bromide (HBr) combined with chlorine ($Cl_2$), oxygen, or a combination thereof. This initial etch chemistry is followed by a subsequent etch chemistry including hydrogen bromide (HBr) combined with tetrafluoromethane ($CF_4$), oxygen, or a combination thereof that induces the vertical profile of the opening collectively formed by the gate trench 153 and its corresponding opening 157. As described in further detail below, in other embodiments, however, the opening collectively formed by a gate trench 153 and its corresponding opening 157 may have a tapered profile. Such a tapered profile may be achieved by omitting the above-described subsequent etch chemistry that includes hydrogen bromide (HBr) combined with tetrafluoromethane ($CF_4$), oxygen, or a combination thereof. In such examples, a gate structure that is subsequently formed in the tapered opening has a tapered profile as well.

Referring to blocks 930 and 940 of FIG. 1B, FIGS. 14A-14D, and FIGS. 15A-15D, a gate structure is formed. The gate structure includes a gate dielectric layer and a gate electrode disposed over the gate dielectric layer. For example, the gate structure may include a polysilicon gate electrode over a SiON gate dielectric layer. As another example, the gate structure may include a metal gate electrode over a high-k dielectric layer. In some instances, a refractory metal layer may interpose between the metal gate electrode (such as an aluminum gate electrode) and the high-k dielectric layer. As yet another example, the gate structure may include silicide. In the depicted embodiment, the gate structures each includes a gate dielectric layer 228 and a gate electrode that includes one or more metal layers 230, 232. The gate dielectric layers 228 are formed between the metal layers 230, 232 and the channels formed by the semiconductor layers 220A (e.g. the center portions 220A-center).

In some embodiments, the gate dielectric layers 228 are formed conformally on the device 100 (see FIGS. 14A-14D). The gate dielectric layers 228 at least partially fill the gate trenches 153. In some embodiments, dielectric interfacial layers may be formed over the center portions 220A-center of the semiconductor layers 220A prior to forming the gate dielectric layers 228. Such dielectric interfacial layers improve the adhesion between the center portions 220A-center of the semiconductor layers 220A and the gate dielectric layers 228. In the examples depicted in this disclosure, such dielectric interfacial layers are omitted. Instead, in the embodiments shown, the gate dielectric layers 228 is formed around the exposed surfaces of each of the semiconductor layers 220A, such that they wrap around the center portions 220A-center of each of the semiconductor layers 220A in 360 degrees. Additionally, the gate dielectric layers 228 also directly contact vertical sidewalls of the inner spacers 250 and vertical sidewalls of the top spacers 240. The gate dielectric layers 228 may include a dielectric material having a dielectric constant greater than a dielectric constant of $SiO_2$, which is approximately 3.9. For example, the gate dielectric layers 228 may include hafnium oxide ($HfO_2$), which has a dielectric constant in a range from about 18 to about 40. As various other examples, the gate dielectric layers 228 may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The formation of the gate dielectric layers 228 may be by any suitable processes, such as CVD, PVD, ALD, or combinations thereof.

Referring to block 940 of FIG. 1B and FIGS. 15A-15D, metal layers 230, 232 are formed over the gate dielectric layers 228 to fill the remaining spaces of the gate trenches 153. The metal layers 230, 232 may include any suitable materials, such as titanium nitride (TiN), tantalum nitride (TaN), titanium aluminide (TiAl), titanium aluminum nitride (TiAlN), tantalum aluminide (TaAl), tantalum aluminum nitride (TaAlN), tantalum aluminum carbide (TaAlC), tantalum carbonitride (TaCN), aluminum (Al), tungsten (W), copper (Cu), cobalt (Co), nickel (Ni), platinum (Pt), or combinations thereof. In some embodiments, a CMP is performed to expose a top surface of the ILD 214. The dielectric layers 228 and the metal layers 230 collectively form the gate structures 270, while the dielectric layers 228 and the metal layers 232 collectively form gate structure 272. Each of the gate structures 270, 272 engages multiple layers within the center portions 220A-center (e.g. multiple nanochannels).

In some embodiments, a gate top hard mask layer 260 may optionally be formed over the gate structures 270, 272. For example, referring to FIGS. 16A-16D, the metal layers 230, 232 may optionally be recessed, such that a top surface of the metal layers 230, 232 extends below a top surface of the ILD 214. Subsequently, as illustrated in FIGS. 17A-17D, a gate top hard mask layer 260 is formed over the GAA device 100 such that it covers the gate structures 270, 272 (specifically, the metal layers 230, 232), the ILD layers 214, and fills the space created by the recess process. A CMP may be conducted to planarize the top surface of the gate top hard mask layer 260. In some embodiments, as illustrated in FIGS. 18A-18D, the CMP exposes the top surfaces of the ILD layers 214, the top surfaces of the top spacers 240, and the top surfaces of the gate dielectric layers 228. The gate top hard mask layers 260 may include a dielectric material, such as $SiO_2$, SiOC, SiON, SiOCN, nitride-based dielectric, metal oxide dielectric, $HfO_2$, $Ta_2O_5$, $TiO_2$, $ZrO_2$, $Al_2O_3$, $Y_2O_3$, or combinations thereof. The gate top hard mask layer 260 protects the gate structure 272 in the subsequent etching processes to form the source/drain contact features, and also insulates the gate structure 272. However, in some other embodiments (not shown), recesssing of the metal layers 230, 232 and/or the formation of the gate top hard mask layers 260 is omitted.

Referring to block 950 of FIG. 1C and FIGS. 19A-19D, a mask layer 282 (e.g. a photoresist layer) is formed over the top surface of the device 100. The mask layer 282 may cover the main body (or the center portion) of the device 100 but not the two end portions 283 (along the X-direction) of the device 100. Referring to block 960 of FIGS. 1C and 20A-20D, an end-cut process is subsequently conducted. The end-cut process forms end-cut trenches 155, which split the gate structures 270, 272 along the X direction into individual gates. The individual gates may extend over an n-type region only (e.g. for an NMOS gate), over a p-type region only (e.g for a PMOS gate), or over both an n-type region and a p-type region (e.g. for a CMOS gate). The end-cut process may include any suitable lithography and etching processes such that the end portions 283 are etched down to expose the isolation structure 203.

Referring to block 970 of FIG. 1C and FIGS. 21A-21D, a dielectric material is deposited into the end-cut trenches 155 to form the gate end dielectric features 262, which extends from a top surface of the isolation features 203 and fully covers an end of the gates, such as the gate structures 270, 272. The gate end dielectric features 262 may include a nitride-based dielectric material (e.g., $Si_3N_4$), a metal oxide, $SiO_2$, or combinations thereof. As described in further detail below, a subsequent step that replaces gate features 270 with dielectric based gates removes the top spacers 240 and the inner spacers 250 without substantially affecting the gate end dielectric features 262. Therefore, there needs to be sufficient etching selectivity between the gate end dielectric features 262 and the spacer layers (i.e., top spacers 240 and inner spacers 250). For example, the etching rate for the top spacers 240 and the inner spacers 250 in the etching chemical may be substantially faster than the etching rate for the gate end dielectric features 262 in the same solution, e.g. more than about 5 to 50 times faster. This difference in etching rate is a result of the different characteristics of the materials in these different layers, which may also be manifested in their different dielectric constants. In many embodiments, the gate end dielectric material may have a dielectric constant higher than both that of the top spacers 240 and that of the inner spacers 250. For example, the gate end dielectric features 262 may include a dielectric material with a dielectric constant larger than about 6.9 to about 7. For example, the gate end dielectric features 262 may include nitride. The nitride may have a dielectric constant larger than about 7.8 to about 8.0. On the other hand, the top spacers 240 and/or the inner spacers 250 may include oxide-based dielectric materials. For example, the top spacers 240 and/or the inner spacers 250 may include oxides with a dielectric constant in the range from about 3.9 to about 5.0. For another example, the top spacers 240 and/or the inner spacers 250 may include doped oxides, such as nitrogen-doped oxides and/or carbon-doped oxides. The nitrogen-doped oxide may have a dielectric constant between about 4 and about 5. The carbon-doped oxide may have a dielectric constant between about 3 and about 4. In some embodiments, the gate end dielectric features 262 may include a single layer. In some other embodiments, the gate end dielectric features 262 may include multiple layers, such as a nitride layer and an oxide layer.

Referring to block 980 of FIG. 1C and FIGS. 22A-22D, a mask layer 284 (e.g. a photoresist layer) is formed over the GAA device 100. In an embodiment, the mask layer 284 covers one or more gate structures 272 but does not cover one or more of the other gate structures 270. Subsequently, referring to block 990 of FIG. 1C and FIGS. 23A-23D, the exposed gate structures 270 are removed via any suitable processes to form gate trenches 159. As a result, the doped regions 205 as well as the isolation features 203 beneath the gate structures 270 are exposed in the gate trenches 159. The etching process may be a wet etching or a dry etching process, using the mask layer 284 as the masking elements. In the depicted embodiment, the etching process not only removes the exposed gate structures 270, but also removes the gate dielectric layer 228, portions of the top spacers 240, inner spacers 250, and semiconductor layers 220A, and partially recesses the doped region 205 of the substrate 200. However, in other embodiments, the removal of the gate dielectric layer 228 and/or the recess of the doped region 205 may be omitted. Alternatively or additionally, the sidewalls of the top spacers 240 may be used as masking elements.

As illustrated in block 1000 of FIG. 1C and FIGS. 24A-24D, the gate trenches 159 are filled with one or more dielectric materials to form the dielectric based gates 234. The dielectric materials may include $SiO_2$, SiOC, SiON, SiOCN, carbon-doped oxide, nitrogen-doped oxide, carbon-doped and nitrogen-doped oxide, dielectric metal oxides such as $HfO_2$, $Ta_2O_5$, $TiO_2$, $ZrO_2$, $Al_2O_3$, $Y_2O_3$, lanthanum-(La-) doped oxide, oxide doped with multiple metals, or combinations thereof. The dielectric based gates 234 may include a single layer or multiple layers. The formation processes may use any suitable processes, such as ALD, CVD, PVD, PEALD, PECVD, or combinations thereof. A CMP process may be performed to remove excessive dielectric materials and provide a top surface that is substantially coplanar with the ILD layer 214, the top spacers 240, and the gate end dielectric features 262.

Referring to block 1010 of FIG. 1C and FIGS. 25A-25D, a gate top dielectric layer 290 is formed over the GAA device 100. The gate top dielectric layer 290 may be formed by any suitable processes, such as CVD, PECVD, flowable CVD (FCVD), or combinations thereof. The gate top dielectric layer 290 covers top surfaces of the dielectric based gates 234, the ILD 214, the top spacers 240, the gate structure 272, and the gate top hard mask layer 260, if present. The gate top dielectric layer 290 may include a dielectric material, such as $SiO_2$, SiOC, SiON, SiOCN, nitride-based dielectric, metal oxide dielectric, $HfO_2$, $Ta_2O_5$, $TiO_2$, $ZrO_2$, $Al_2O_3$, $Y_2O_3$, or combinations thereof. The gate top dielectric layer 290 may have a thickness between about 3 nm and about 30 nm. A thickness within the stated range of values may be needed for device performance (e.g. to meet transistor switching speed requirements), especially for advanced technology nodes. In some embodiments, the gate top dielectric layer 290 protect the gate structure 272 in the subsequent etching processes to form the source/drain contact features, and also insulate the gate structure 272.

Referring to block 1020 of FIG. 1C and FIGS. 26A-26D, a portion of the gate top dielectric layer 290 and ILD 214 are removed to form contact holes 278 over the epitaxial source/drain features 208. Any appropriate methods may be used to form the contact holes 278, such as multiple lithography and etching steps. In an embodiment, a self-aligned contact formation process may be utilized. For example, the ILD 214 may include a dielectric material that has an etching rate substantially faster than that of the top spacers 240 and that of the gate top hard mask layer 260. Therefore, the top spacers 240 and the gate top hard mask layer 260 are not substantially affected when the ILD 214 is etched away to form the contact holes 278. As the top spacers 240 and the gate top hard mask layer 260 protect the gate structure 272 from the etching chemical, the integrity of the gate structure 272 are preserved. The contact holes 278 expose the top surfaces of the epitaxial source/drain features 208 for subsequent contact layer formation. Additionally, a portion of the gate top dielectric layer 290 and the gate top hard mask layer 260 (if present) are also removed to form via holes 285 over the metal layers 232 of the gate structure 272. The via holes 285 expose the metal layers 232 for subsequent via feature formation. Any appropriate methods may be used to form the via holes 285 and may include multiple lithography and etching steps.

Referring to block 1030 of FIG. 1C and FIGS. 27A-27D, contact features 280 are formed within the contact holes 278. Accordingly, the contact features 280 are embedded within the gate top dielectric layer 290 and ILD 214, and electrically connect the epitaxial source/drain features 208 to external conductive features (not shown). Additionally, via features 286 are also formed in the via holes 285. Accordingly, the via features 286 are embedded within the gate top dielectric layer 290 (and within the gate top hard mask layer 260, if present) and electrically connect the gate structure 272 to external conductive features (not shown). The contact features 280 and the via features 286 may each include Ti, TiN, TaN, Co, Ru, Pt, W, Al, Cu, or combinations thereof, respectively. Any suitable methods may be used to form the contact features 280 and the via features 286. In some embodiments, additional features are formed in between the source/drain features 208 and the contacts 280, such as self-aligned silicide features 288. A CMP process may be performed to planarize the top surface of the GAA device 100.

As discussed above, the dielectric constants for the top spacers 240 and the inner spacers 250 may be different. Whether the top spacer or the inner spacer should use a material with a lower dielectric constant may be a design choice. For example, the design choice may be made based on a comparison between the relative importance of the capacitance values of different device regions. For example, a designer may assign the material with the lower dielectric constant to the top spacer 240 rather than the inner spacer 250. On the other hand, if it is more important to have a higher capacitance in the source/drain-metal gate region, the designer may assign the material with the lower dielectric constant to the inner spacer 250 rather than the top spacer 240.

More specifically, the top spacer 240 may be considered to be the dielectric medium of a capacitor between a pair of vertically aligned conductive plates, i.e., the sidewall of the contact 280 and the sidewall of the gate structure 272. Similarly, the inner spacer 250 may be considered to be the dielectric medium of another capacitor between another pair of vertically aligned conductive plates, i.e. the sidewall of the source/drain feature 208 and the sidewall of the gate structure 272. The capacitance is proportional to the dielectric constant of the dielectric medium, according to the following equation:

$$C = \varepsilon\frac{A}{d} = k\varepsilon_0\frac{A}{d}$$

wherein C is the capacitance of the capacitor, ε is the permittivity of the dielectric medium, $\varepsilon_0$ is the permittivity of vacuum, A is the area of the capacitor, d is the separation distance of the capacitor, and k is the dielectric constant of the dielectric medium. Therefore, a smaller dielectric constant leads to a smaller capacitance. If, according to the design needs, it is more important to have a higher capacitance in the contact-to-metal gate region than in the source/drain-to-metal gate region, the designer may assign the material with the lower k to the top spacer 240 rather than the inner spacer 250. On the other hand, if it is more important to have a higher capacitance in the source/drain-metal gate region, the designer may assign the material with the lower k to the inner spacer 250 rather than the top spacer 240. Referring to block 1040 of FIG. 1C, additional layers and/or features may also be formed above and/or within the gate top dielectric layer 290 to complete the fabrication of the GAA device 100.

Figure 27A:
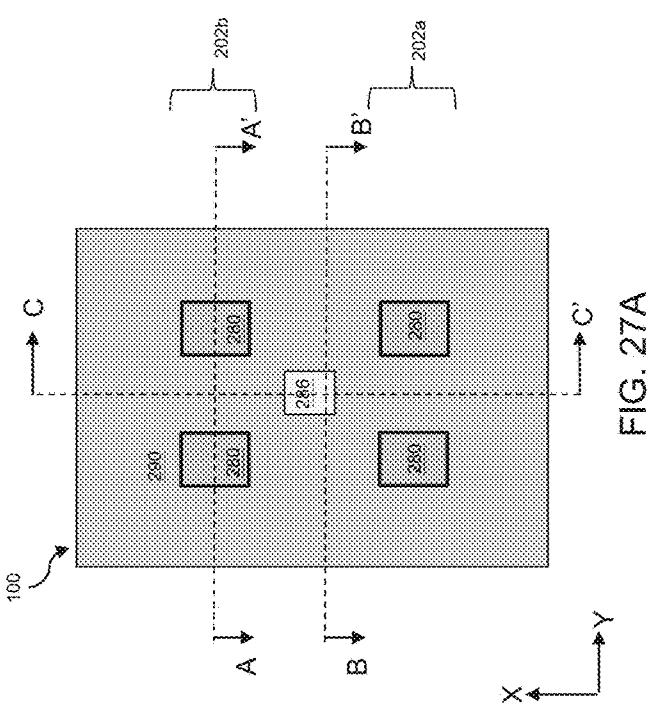
Figure 27C:
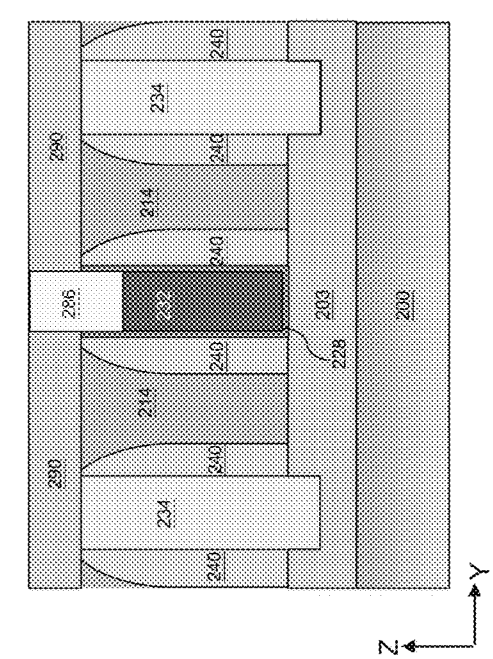
Figure 27B:
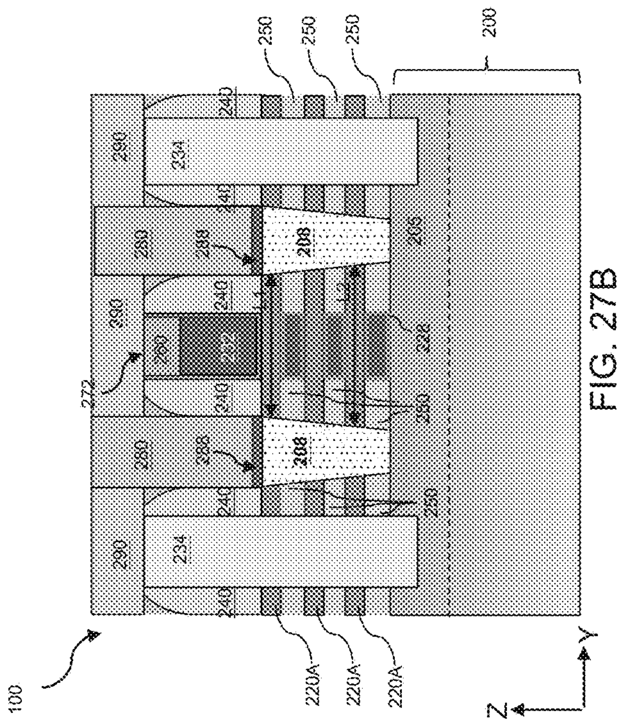
Figure 27D:
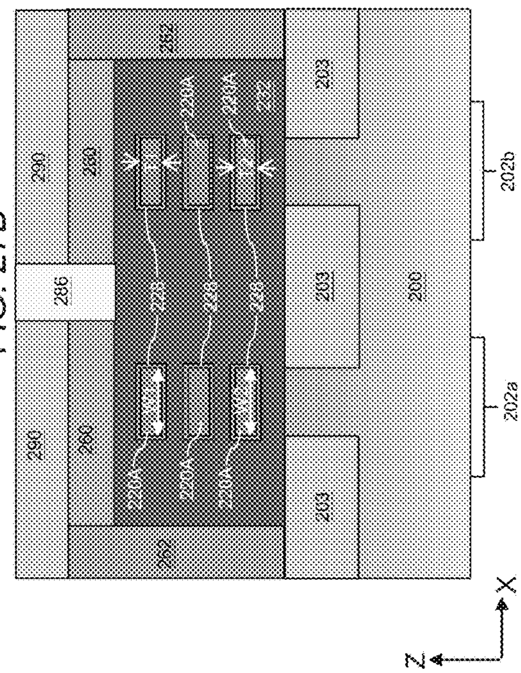
Figure 28B:
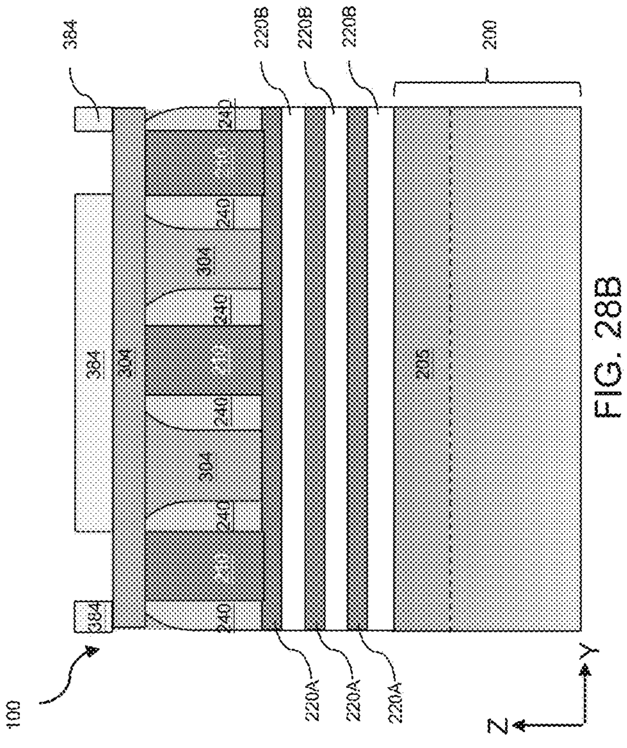
Figure 28D:
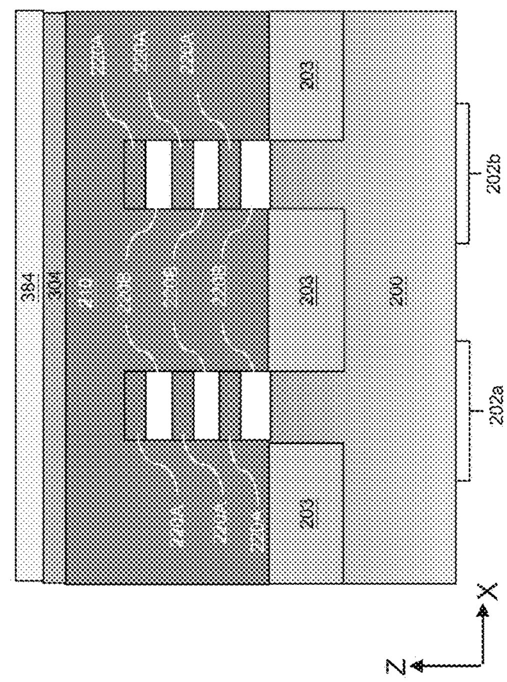
Figure 28A:
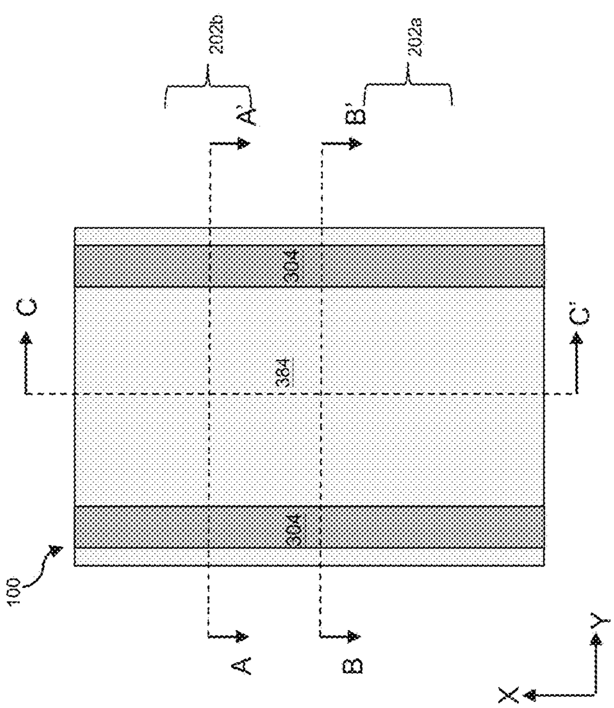
Figure 28C:
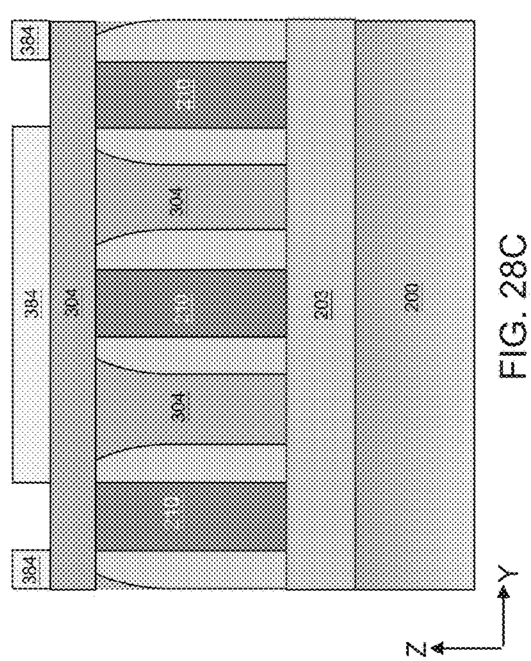
Figure 29A:
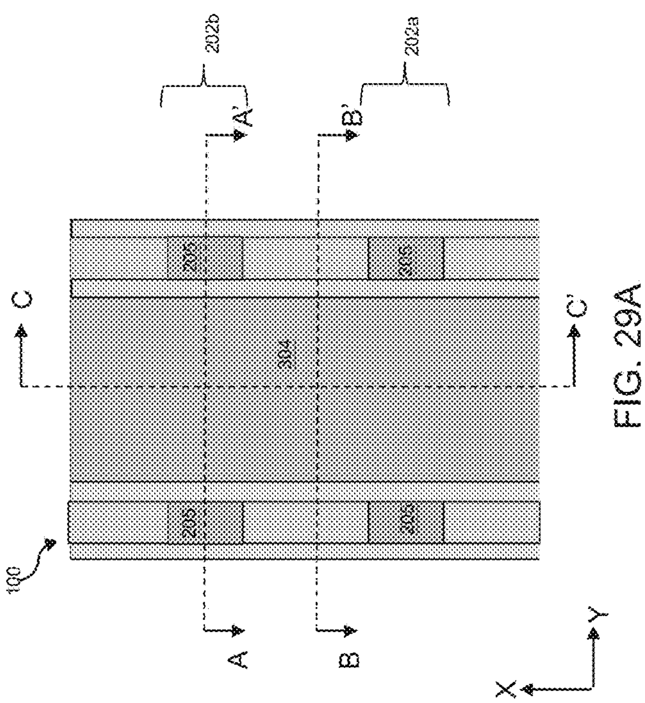
Figure 29B:
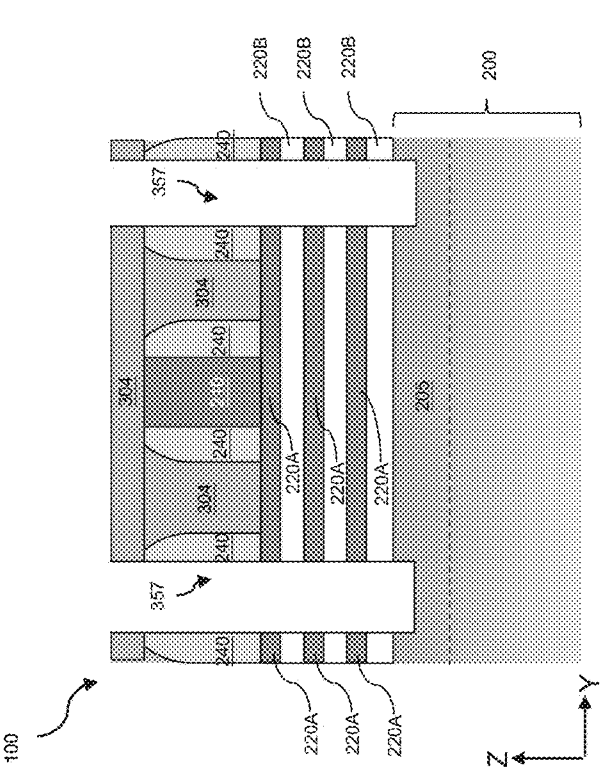
Figure 29C:
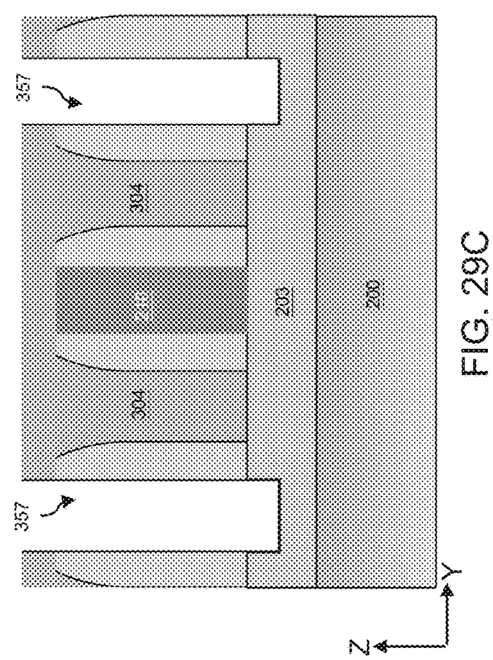
Figure 29D:
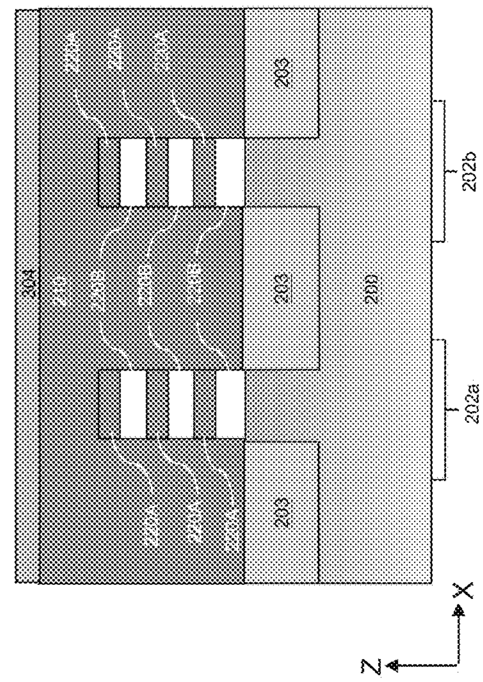
Figure 30B:
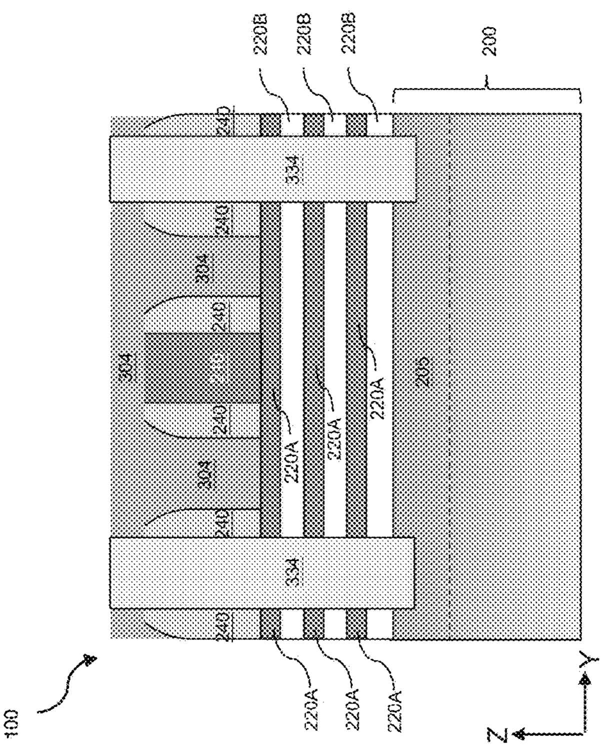
Figure 30D:
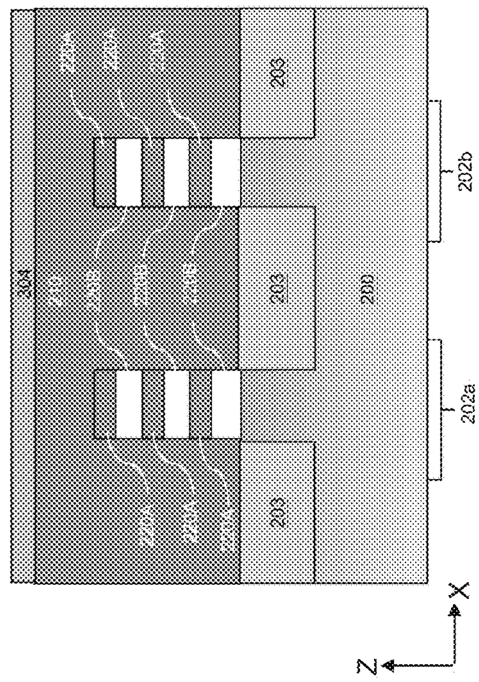
Figure 30A:
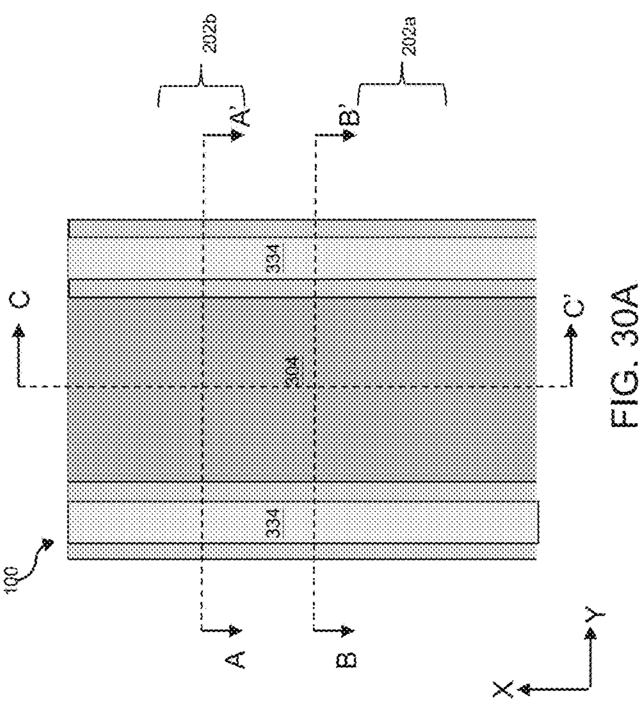
Figure 30C:
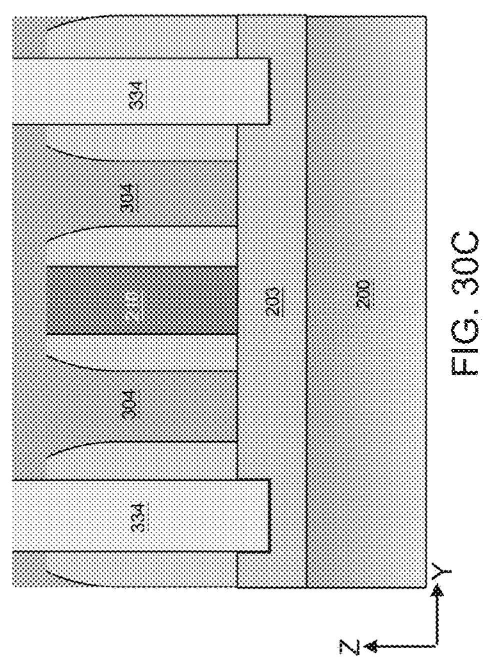
Figure 31B:
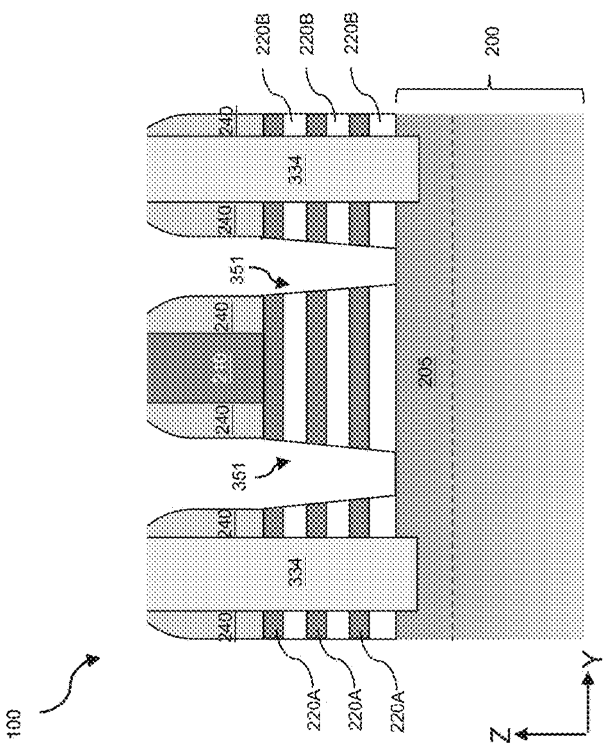
Figure 31D:
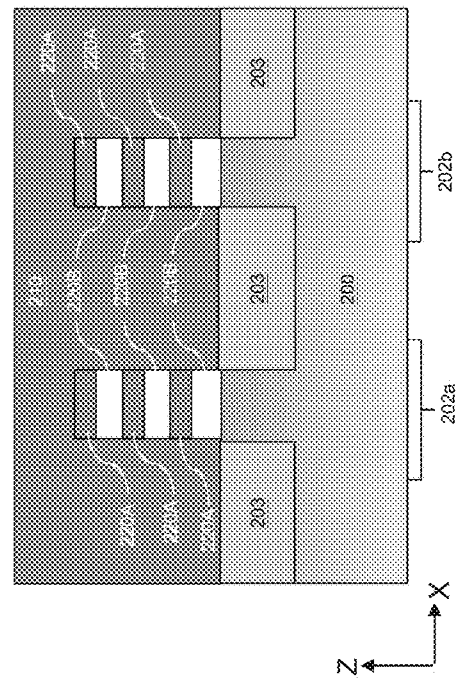
Figure 31A:
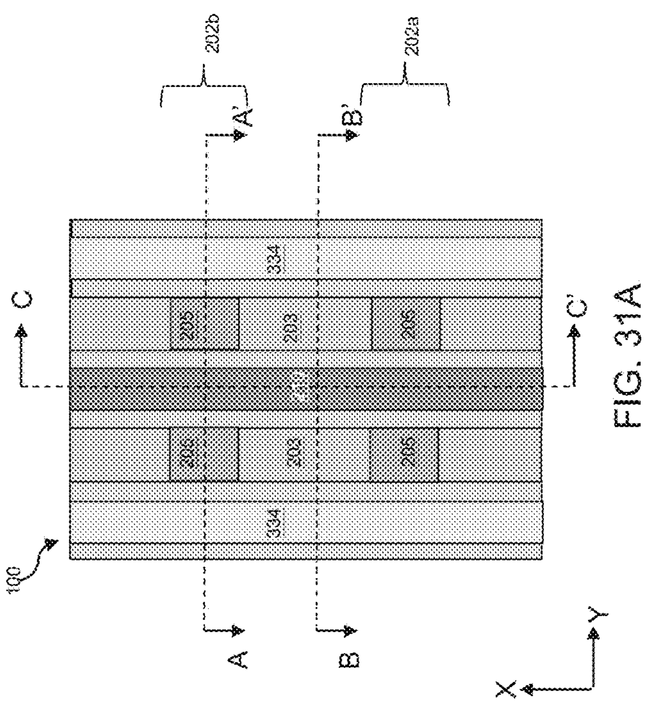
Figure 31C:
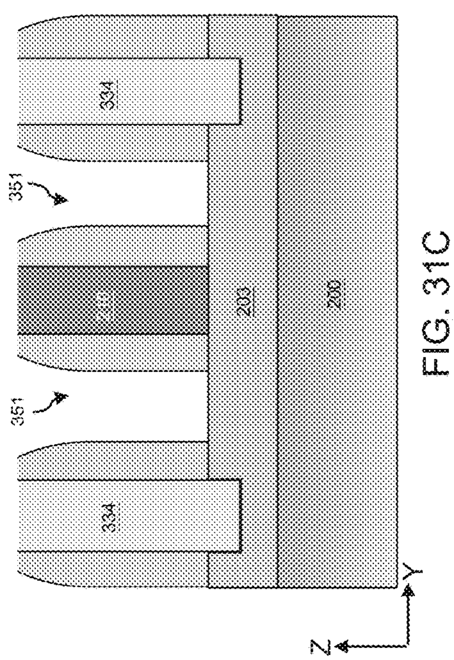
Figure 32A:
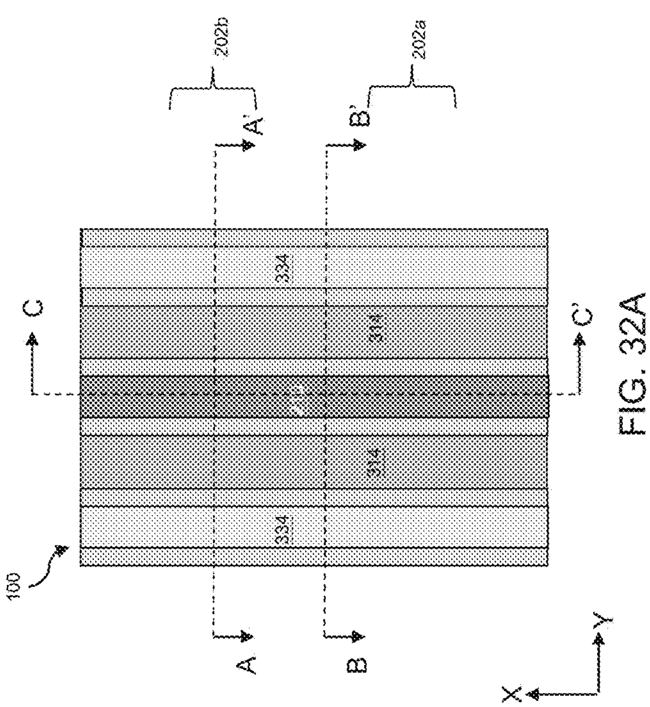
Figure 32B:
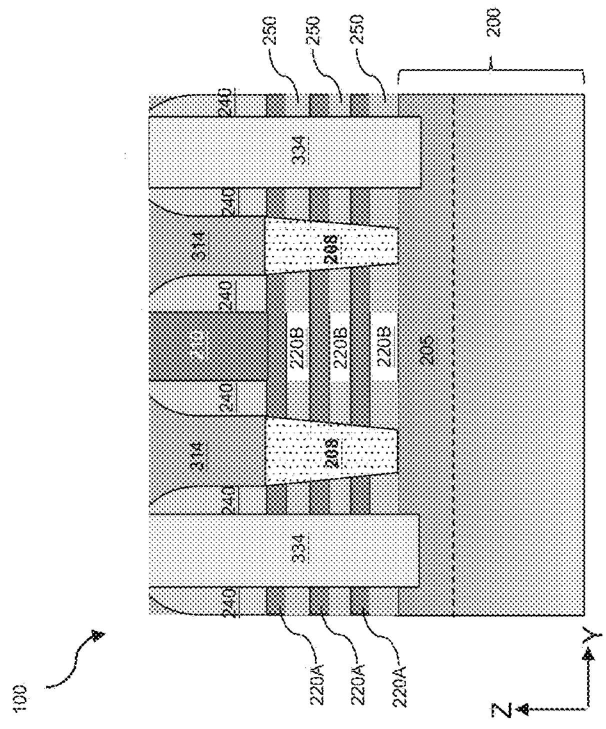
Figure 32C:
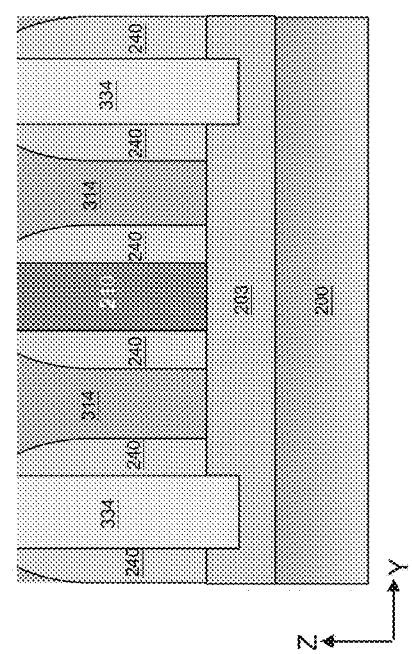
Figure 32D:
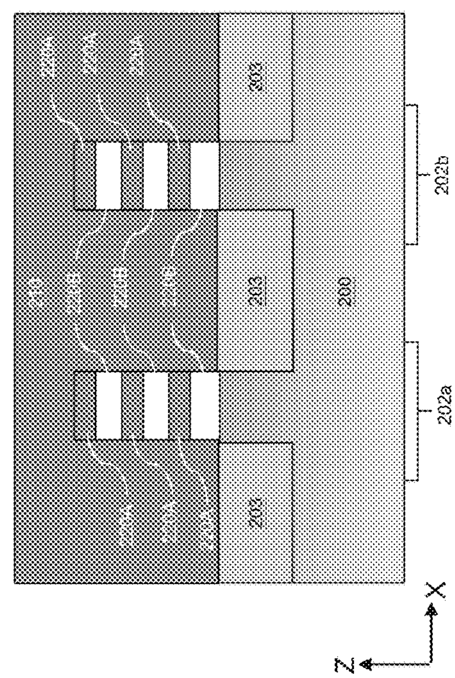
Figure 33B:
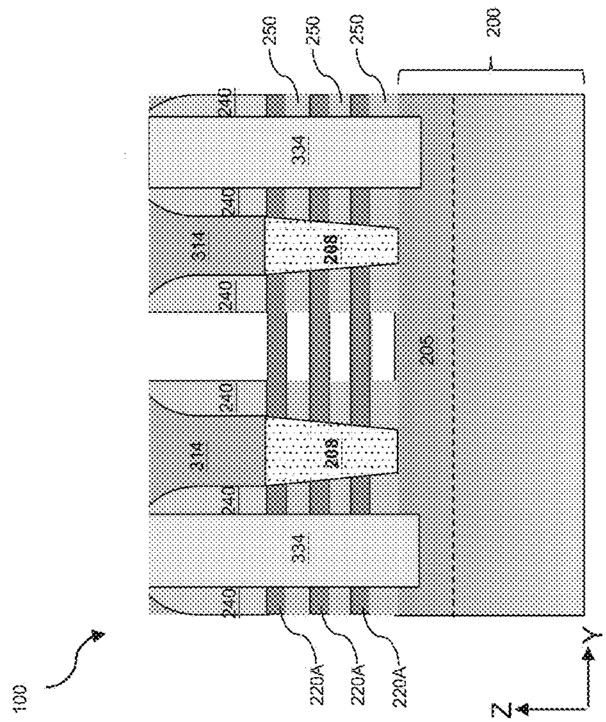
Figure 33D:
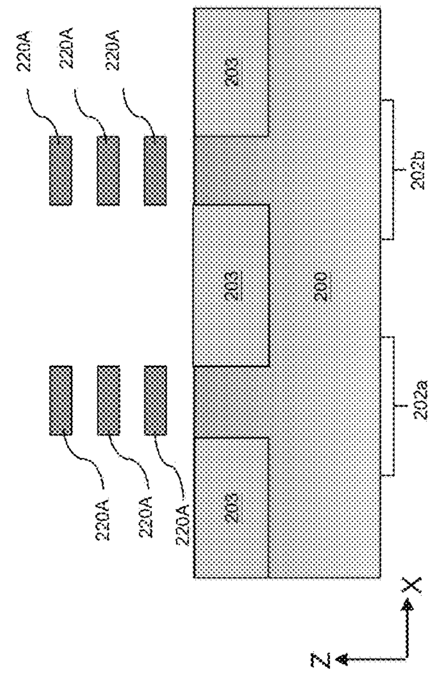
Figure 33A:
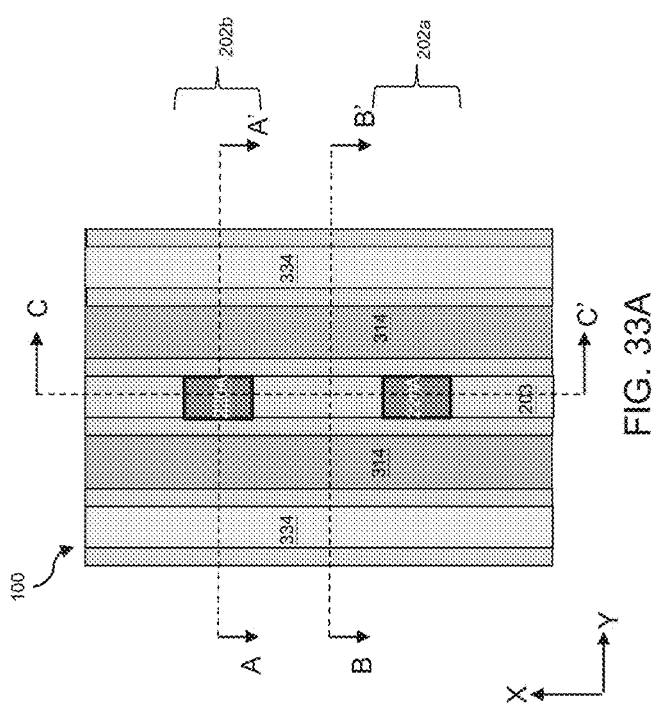
Figure 33C:
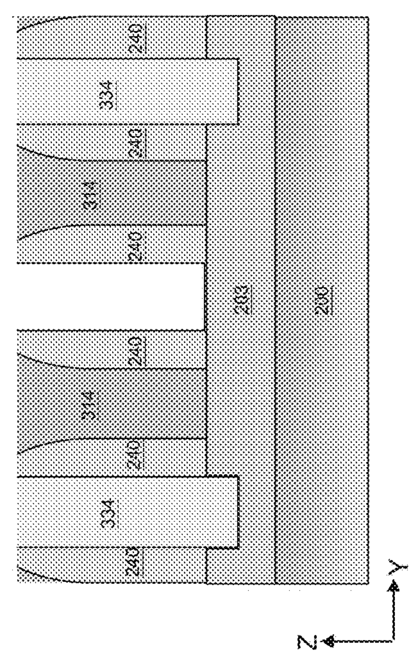
Figure 34B:
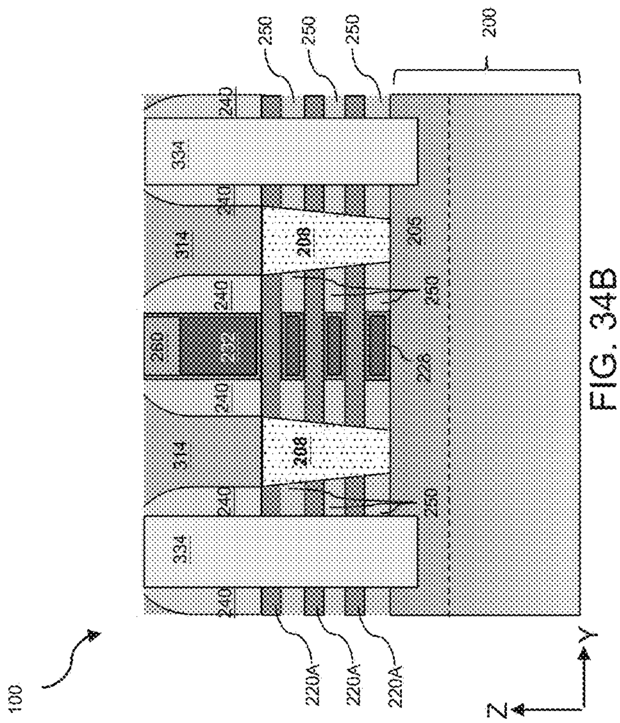
Figure 34D:
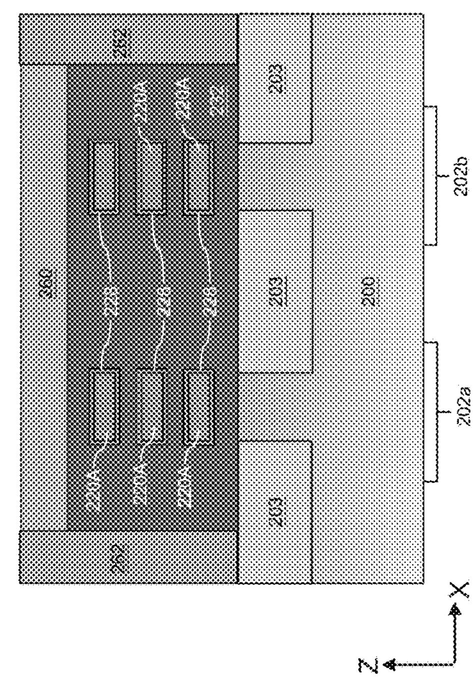
Figure 34A:
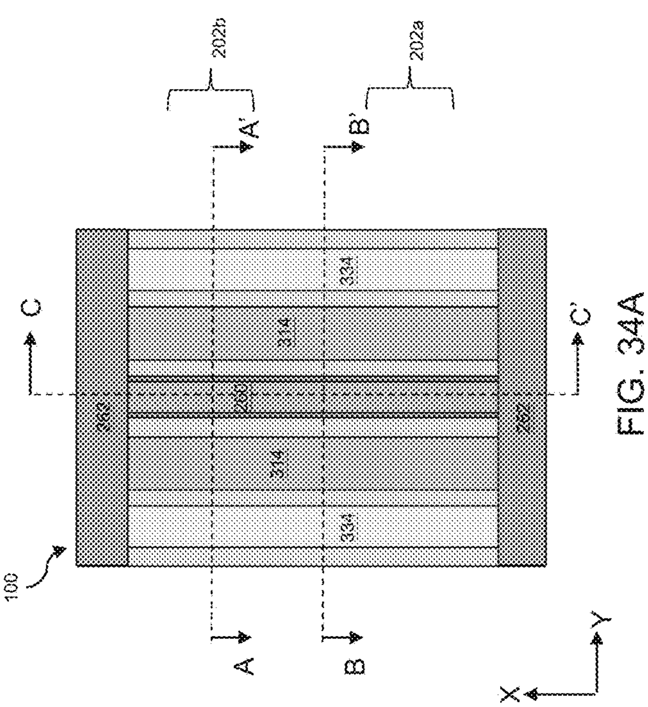
Figure 34C:
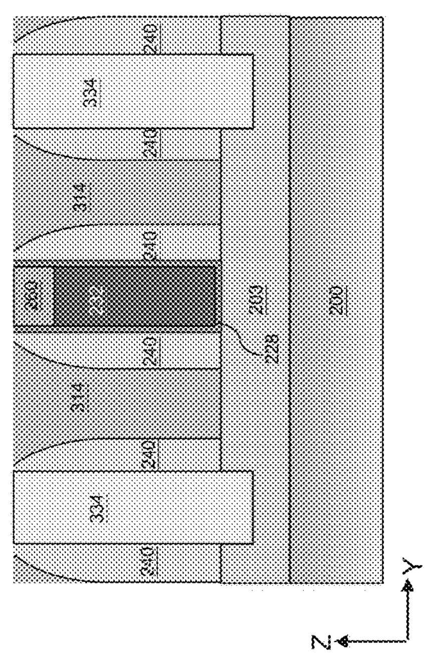
Figure 35A:
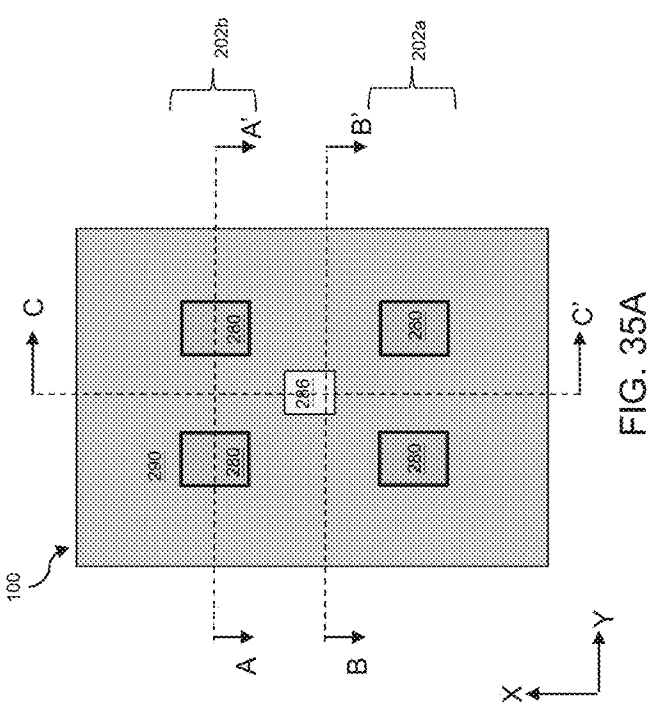
Figure 35B:
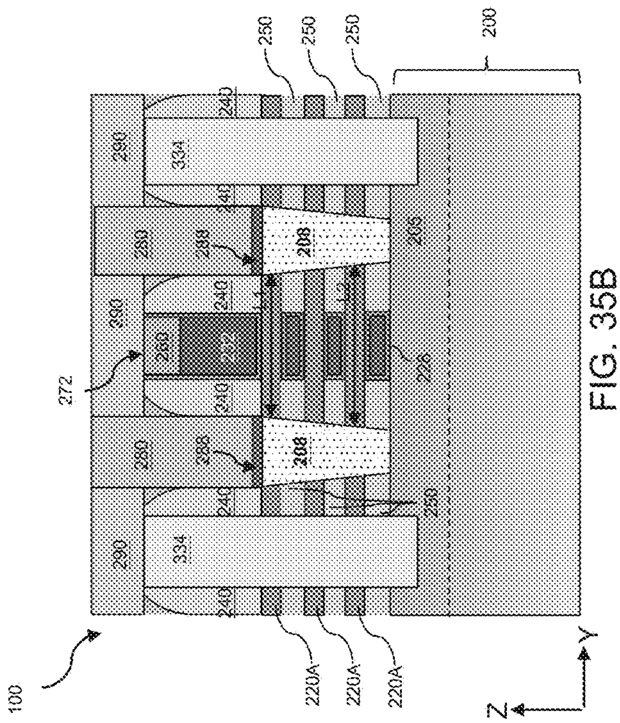
Figure 35C:
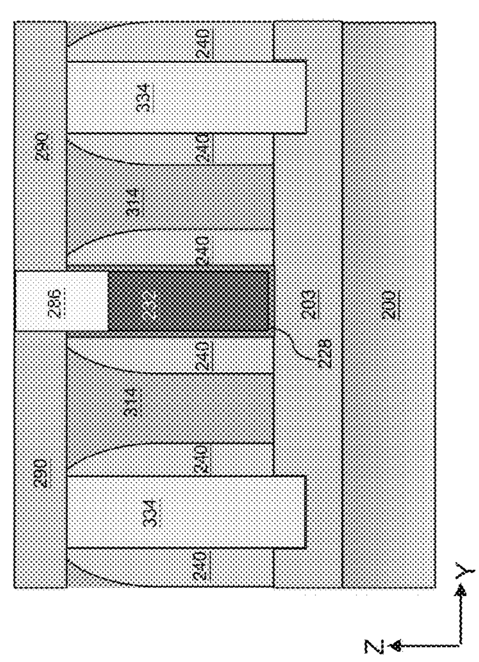
Figure 35D:
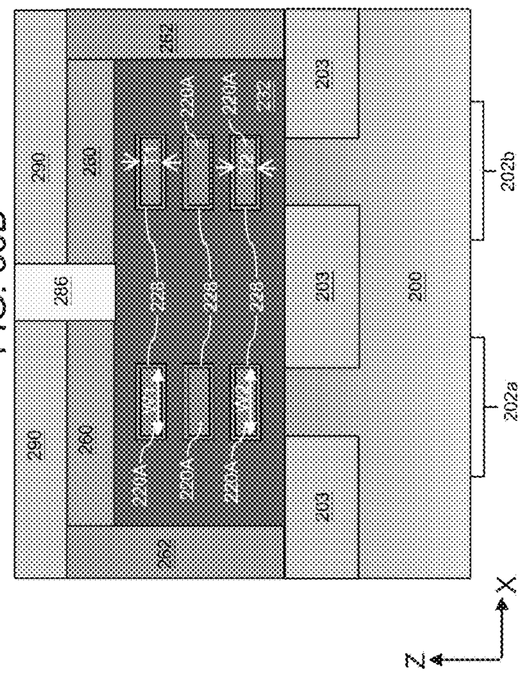

Referring to FIGS. 27B and 27D, several structural features may be observed. First, as seen in FIG. 27B, due to the tapered sidewalls of the epitaxial source/drain features 208, the semiconductor layers 220A that form the channels (e.g. nanochannels) of the GAA device 100 have different lengths along the Y-direction, depending on the position of the semiconductor layer 220A in the Z-direction. For example, the semiconductor layer 220A in closest proximity to the substrate 200 in the Z-direction has a length L2 along the Y-direction, while the semiconductor layer 220A that is farthest from the substrate 200 in the Z-direction has a length L1 along the Y-direction, where the length L2 is greater than the length L1. In some embodiments, the length L2 is larger than the length L1 by at least 0.5 nm (e.g. by at least 1 nm). Lengths within the stated range of values may be needed for device performance (e.g. to meet transistor switching speed requirements), especially for advanced technology nodes.

Second, as seen in FIG. 27D, the semiconductor layers 220A that form the channels (e.g. nanochannels) of the GAA device 100 have different widths along the X-direction, depending on the position of the semiconductor layer 220A in the Z-direction. For example, the semiconductor layer 220A in closest proximity to the substrate 200 in the Z-direction has a width W2 along the X-direction, while the semiconductor layer 220A that is farthest from the substrate 200 in the Z-direction has a width W1 along the X-direction, where the width W2 is greater than the width W1. In some embodiments, a difference between the width W2 and the width W1 is in a range from about 0.5 nm to about 5 nm.

Each of the widths W1 and W2 may be in a range from about 6 nm to about 50 nm. Widths within the stated range of values may be needed for device performance (e.g. to meet transistor switching speed requirements), especially for advanced technology nodes.

Third, the semiconductor layers 220A that form the channels (e.g. nanochannels) of the GAA device 100 may have a respective thickness T measured in the Z-direction. For example, in the embodiment depicted in FIG. 27D, the semiconductor layer 220A in closest proximity to the substrate 200 in the Z-direction has a thickness T2 along the Z-direction, while the semiconductor layer 220A that is farthest from the substrate 200 in the Z-direction has a thickness T1 along the Z-direction. The thicknesses T1 and T2 may be substantially equal, with each of the thicknesses T1 and T2 being in a range from about 3 nm to about 10 nm. A thickness within the stated range of values may be needed for device performance (e.g. to meet transistor switching speed requirements), especially for advanced technology nodes.

Fourth, as seen in FIG. 27B, the inner spacers 250 wrap around the side portions 220A-side of the semiconductor layers 220A that form the channels (e.g. nanochannels) of the GAA device 100 in 360 degrees. Furthermore, the gate structure 272 (including the gate dielectric layers 228 and the metal layers 232) wrap around the center portions 220A-center of the semiconductor layers 220A that form the channels of the GAA device 100.

Fifth, as seen in FIG. 27C, the non-active regions of the GAA device 100 are devoid of the inner spacers 250. Instead, the top spacers 240 extend to the isolation features 203, and the sidewalls of the gate structure 272 (including the gate dielectric layers 228 and the metal layers 232) physically contact the top spacers 240.

The above process flow describes one embodiment of the present invention. In this embodiment, the dielectric based gates 234 are formed after the formation of gate structures 270, 272. However, other embodiments are also contemplated without departing from the scope of the present disclosure. For example, rather than forming the dielectric based gates 234 by removing the gate structures 270 and subsequently filling the gate trenches, the dielectric based gates 234 may alternatively be formed prior to the formation of the gate structures 270, 272. Additional details for this alternative embodiment may be found in related patents, such as U.S. Pat. No. 9,613,953, entitled “Semiconductor device, semiconductor device layout, and method of manufacturing semiconductor device” by Jhon Jhy Liaw, U.S. Pat. No. 9,805,985, entitled “Method of manufacturing semiconductor device and semiconductor device” by Jhon Jhy Liaw, and U.S. Pat. No. 9,793,273, entitled “Fin-based semiconductor device including a metal gate diffusion break structure with a conformal dielectric layer” by Jhon Jhy Liaw. These patents are herein incorporated in their entities.

In one such implementation, after the top spacers 240 are formed (e.g. as illustrated in FIGS. 5A-5D), an ILD 304 may be formed over the GAA device 100, as seen in FIGS. 28A-28D. A mask layer 384 may be formed over the ILD 304 to cover the entire area except the region in which the dielectric based gates are to be formed. Subsequently, as seen in FIGS. 29A-29D, an etching process may be used to remove the exposed portions of the ILD 304, as well as the dummy gate structures 210 beneath the exposed portions of the ILD 304. The etching process may also remove a portion of the doped regions 205 under the dummy gate structures 210. This etching process forms dielectric based gate trenches 357, which are similar to those trenches 159 illustrated in FIGS. 23A-23D. The mask layer 384 may then be removed (see FIGS. 29A-29D). Once the dielectric based gate trenches 357 are formed, a dielectric material, similar to the materials described above for dielectric based gates 234, are used to fill in the trenches 357 to form the dielectric based gates 334 (see FIGS. 30A-30D). The method then proceeds to conduct a CMP and to etch a portion of the stack to form source/drain trenches 351, similar to those trenches 151 illustrated in the FIGS. 6A-6D (see FIGS. 31A-31D). Subsequent processes, such as those depicted in FIGS. 32A-35A, 32B-35B, 32C-35C, and 32D-35D, may proceed in ways similar to those illustrated in FIGS. 7A-27A, 7B-27B, 7C-27C, and 7D-27D. The final structure (see FIGS. 35A-35D) may be similar to that of FIGS. 27A-27D.

Figure 36B:
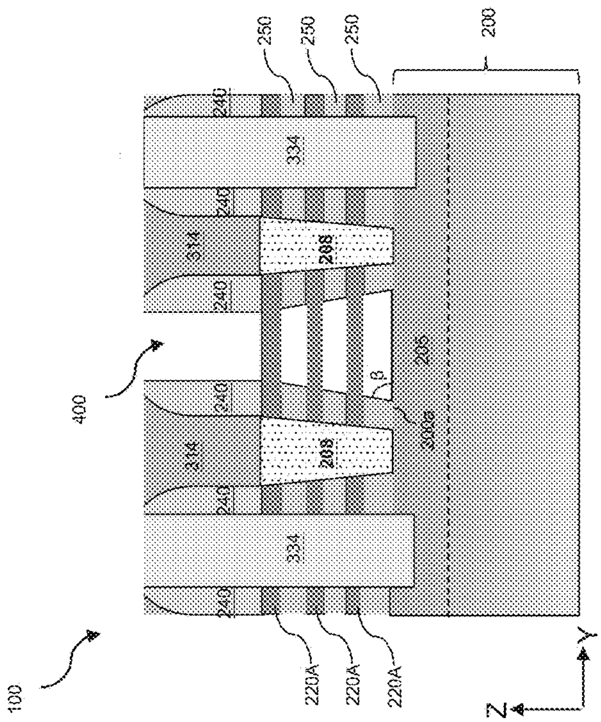
Figure 36D:
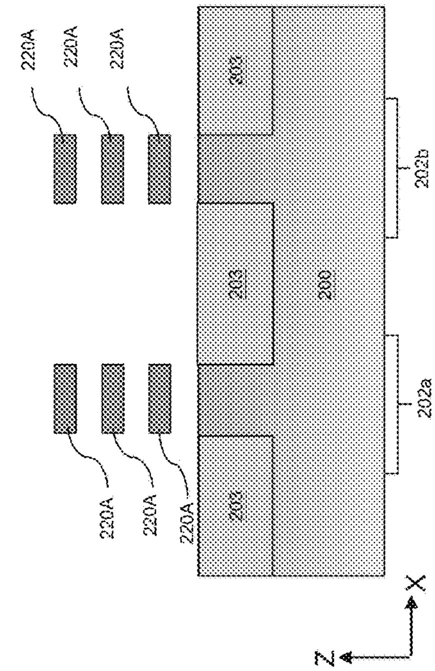
Figure 36A:
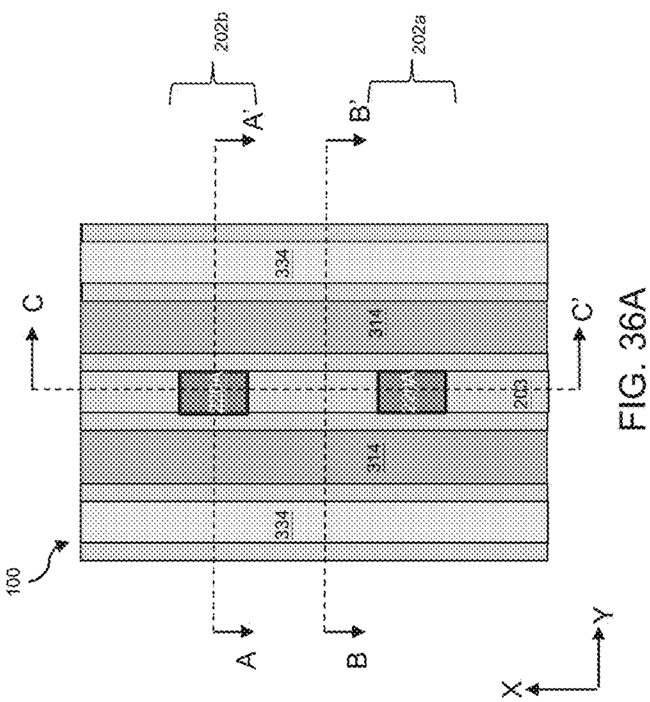
Figure 36C:
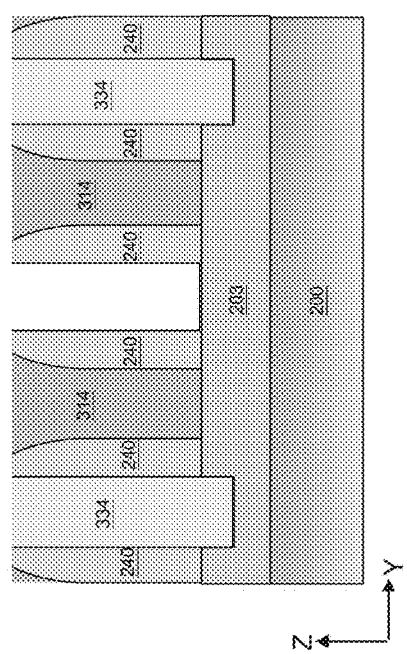
Figures 37A, 37B, 37C, 37D:
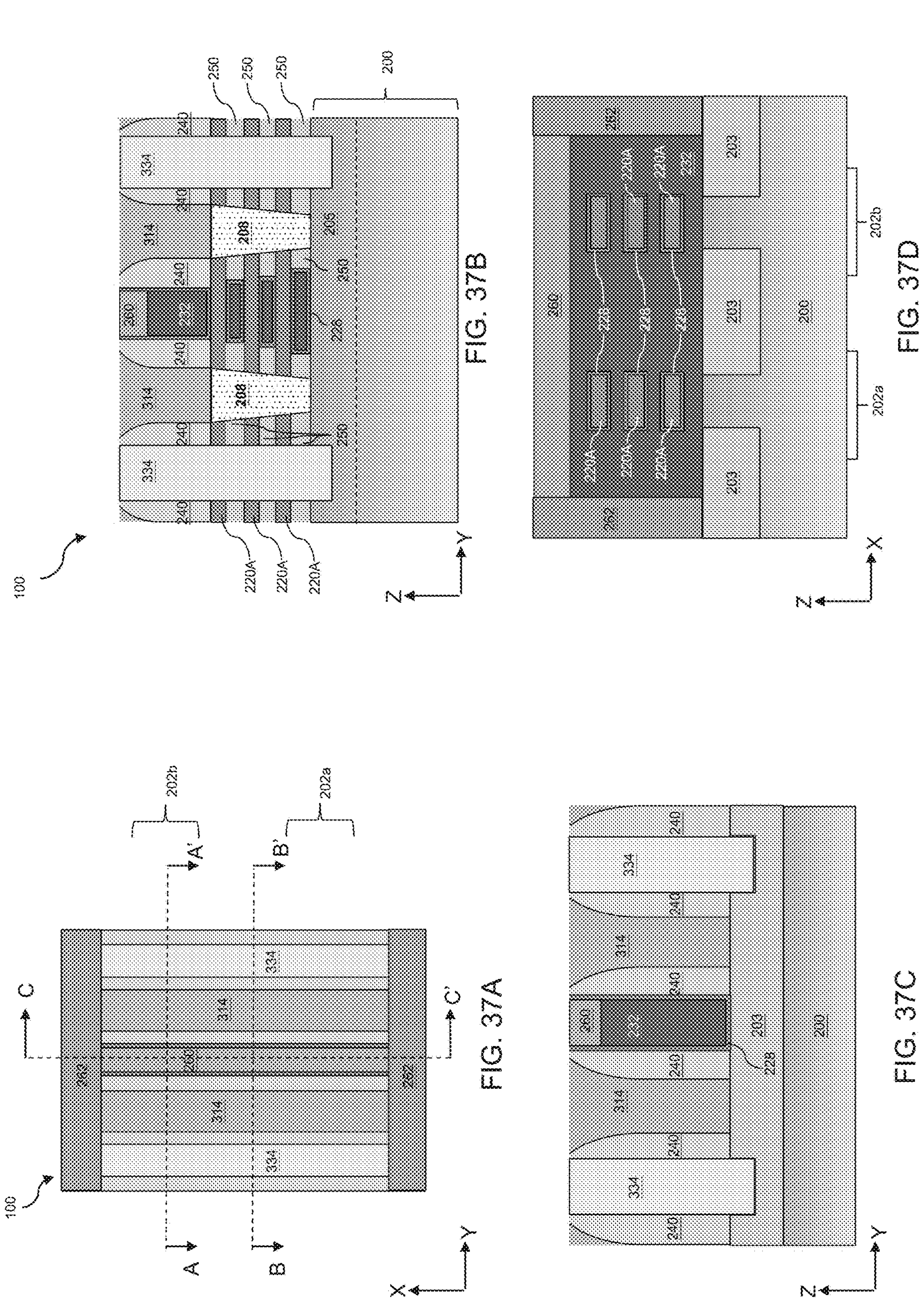

As mentioned above, in some embodiments, the gate structure 272 may have a tapered profile. In one such implementation, after the epitaxial source/drain features 208 are formed (e.g. as illustrated in FIGS. 32A-32D), the dummy gate structure 210 and the semiconductor layers 220B are selectively removed through suitable lithography and etching processes (see FIGS. 36A-36D). For example, the etch chemistry of the etch process used to remove the dummy gate structure 210 and thereby form a top portion of the trench 400 (e.g. in FIG. 36B) may include hydrogen bromide (HBr) combined with chlorine ($Cl_2$), tetrafluoromethane ($CF_4$), oxygen, or a combination thereof. The etch process then proceeds to selectively remove the semiconductor layers 220B to thereby extend the trench 400 to expose a portion of the top surface of the substrate 200 by using an etch chemistry including hydrogen bromide (HBr) combined with chlorine ($Cl_2$), oxygen, or a combination thereof. Use of such a combination of etch chemistries results in the tapered trench 400, where an acute angle β subtended by a sidewall of the trench 400 and the top surface 200*a* of the substrate 200 is in a range from about 80 degrees to about 88 degrees. Subsequent processes, such as those shown in FIGS. 37A-38A, 37B-38B, 37C-38C, and 37D-38D, may proceed in ways similar to those illustrated in FIGS. 34A-35A, 34B-35B, 34C-35C, and 34D-35D.

Figure 38B:
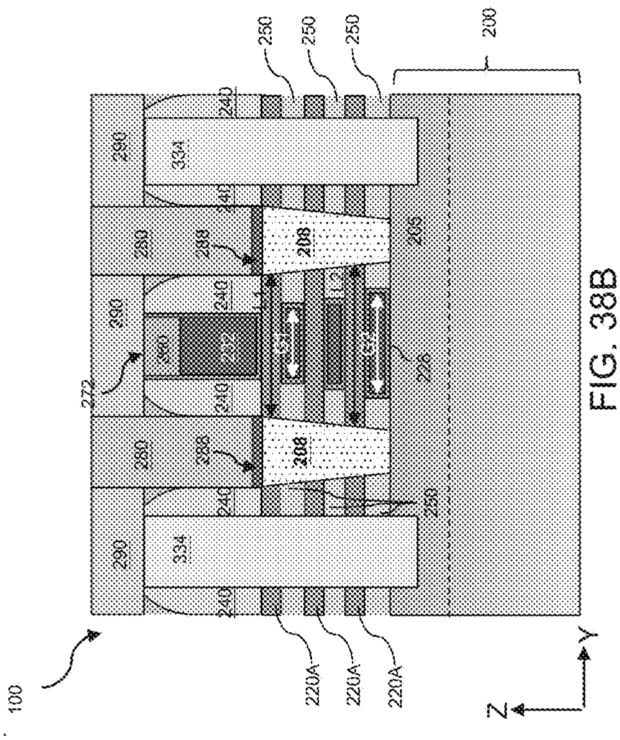
Figure 38D:
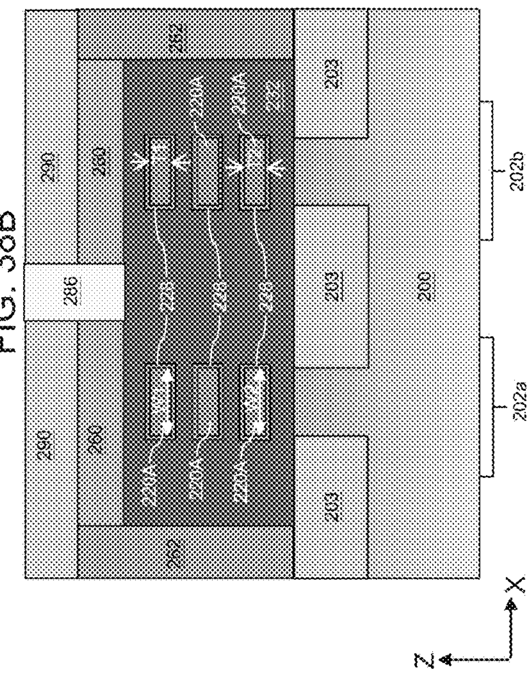
Figure 38A:
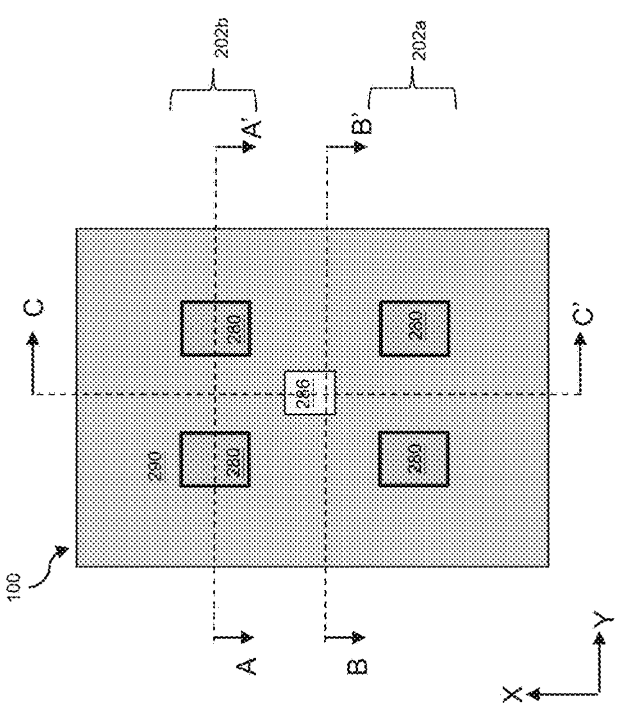
Figure 38C:
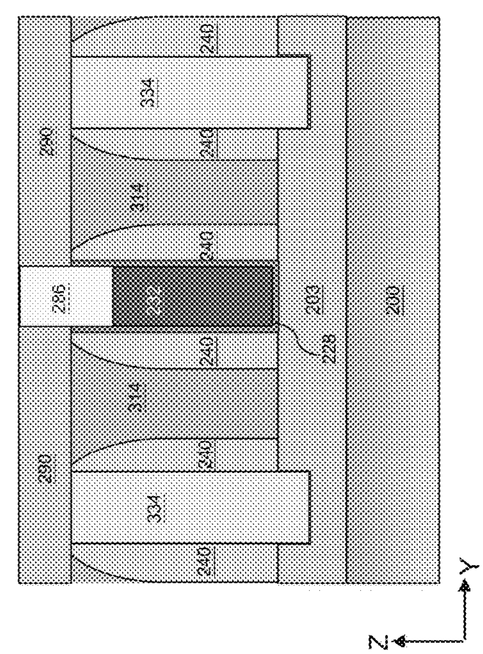

Referring to FIG. 38B, several structural features may be observed. Due to the tapered sidewalls of the trench 400, the resultant gate structure 272 (including gate dielectric layer 228 and metal layer 232) also has tapered sidewalls. In some embodiments, the gate lengths of the gate structure 272 along the Y-direction is different, depending on the position of the gate structure 272 in the Z-direction. For example, the gate length of the portion of the gate structure 272 in closest proximity to the substrate 200 in the Z-direction has a length G2 along the Y-direction, while the gate length of the portion of the gate structure 272 that is farthest from the substrate 200 in the Z-direction has a length G1 along the Y-direction, where the length G2 is greater than the length G1. In some embodiments, the length G2 is larger than the length G1 by at least 0.5 nm (e.g. by at least 1 nm). In general, the gate structure 272 seen in FIG. 38B controls the channels in the semiconductor layers 220A as well as a parasitic planar channel in the substrate 200. In a typical GAA device, the parasitic planar channel in the substrate 200 can be a limiting factor in the performance of the GAA device. However, with the tapered gate structure 272 seen in FIG. 38B, the longer gate length G2 of the portion of the gate structure 272 in closest proximity to the substrate 200 reduces the off-state current of the parasitic planar channel in the substrate 200 and junction leakage, thereby improving the performance of the GAA device 100.

Figure 39B:
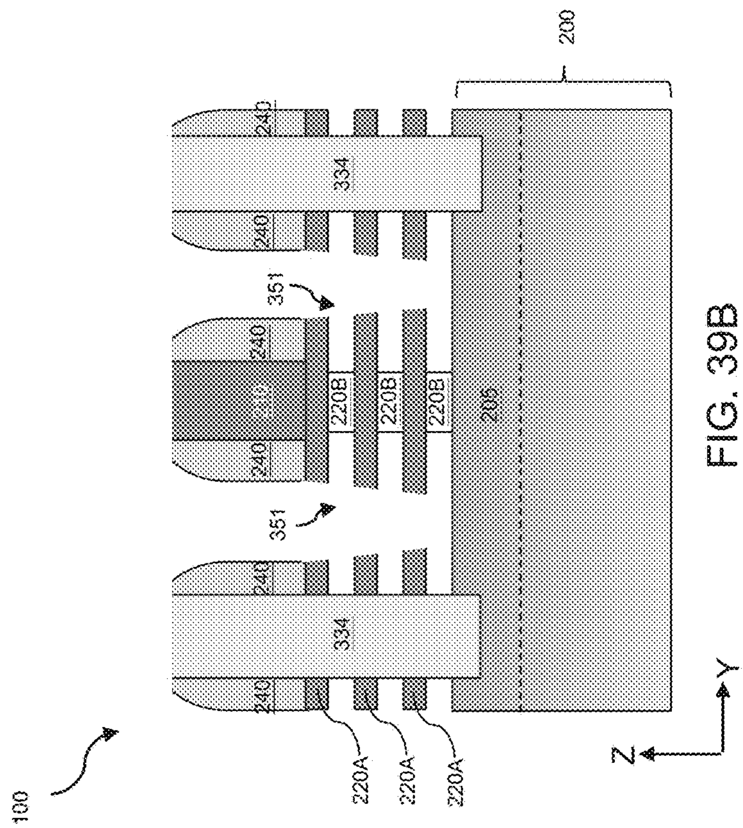
Figure 39A:
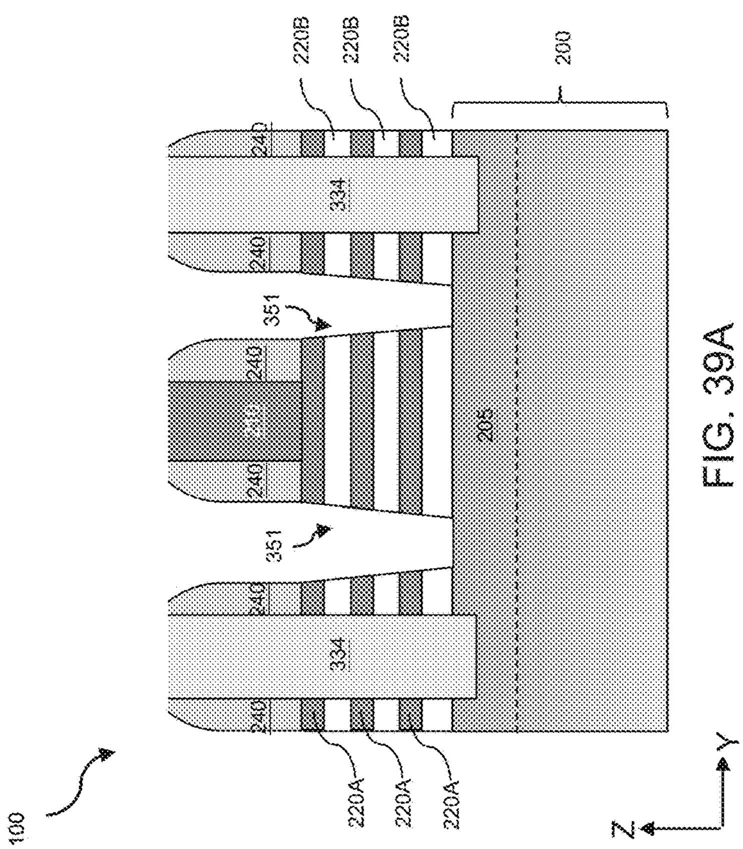

In some implementations, the inner spacers 250 may have air gaps formed therein. FIGS. 39A to 39G show an embodiment method of forming airgaps in the inner spacers 250 in an effort to decrease the capacitance between the sidewall of the source/drain feature 208 and the sidewall of the gate structure 272. FIG. 39A is similar to the structure shown in FIG. 31B and may be formed using the processes described above in reference to FIG. 31B. Subsequently, as described above in reference to FIGS. 7A-7D, portions of the semiconductor layers 220B are removed through the exposed sidewall surfaces in the trenches 151 via a selective etching process to yield the structure illustrated in FIG. 39B. A result of the selective etching process is the extension of the trenches 351 into areas beneath the semiconductor layers 220A and top spacers 240.

Figure 39D:
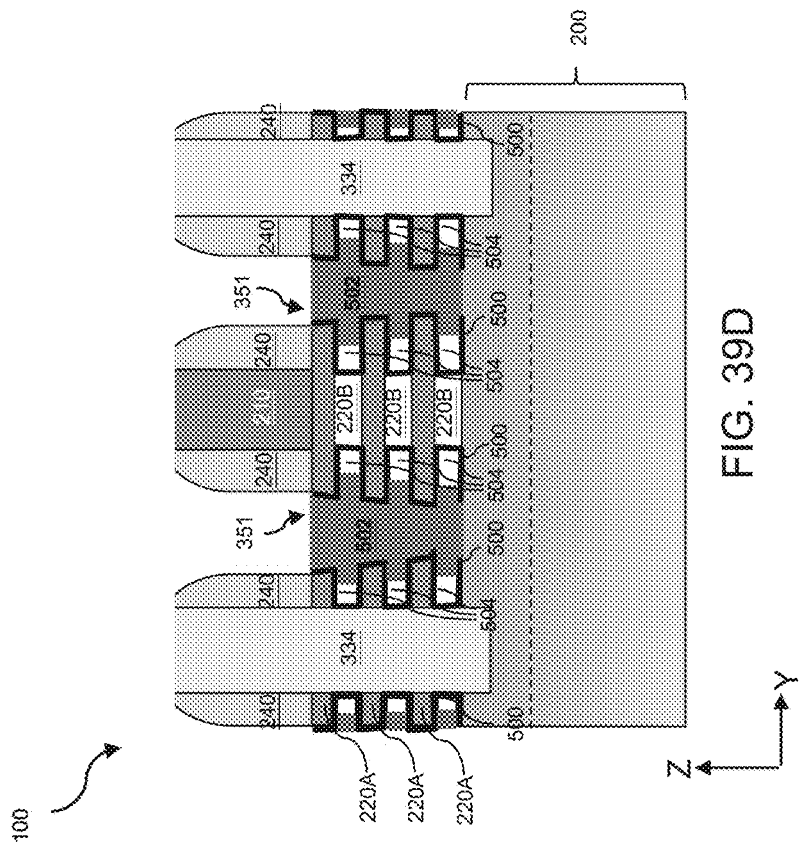
Figure 39C:
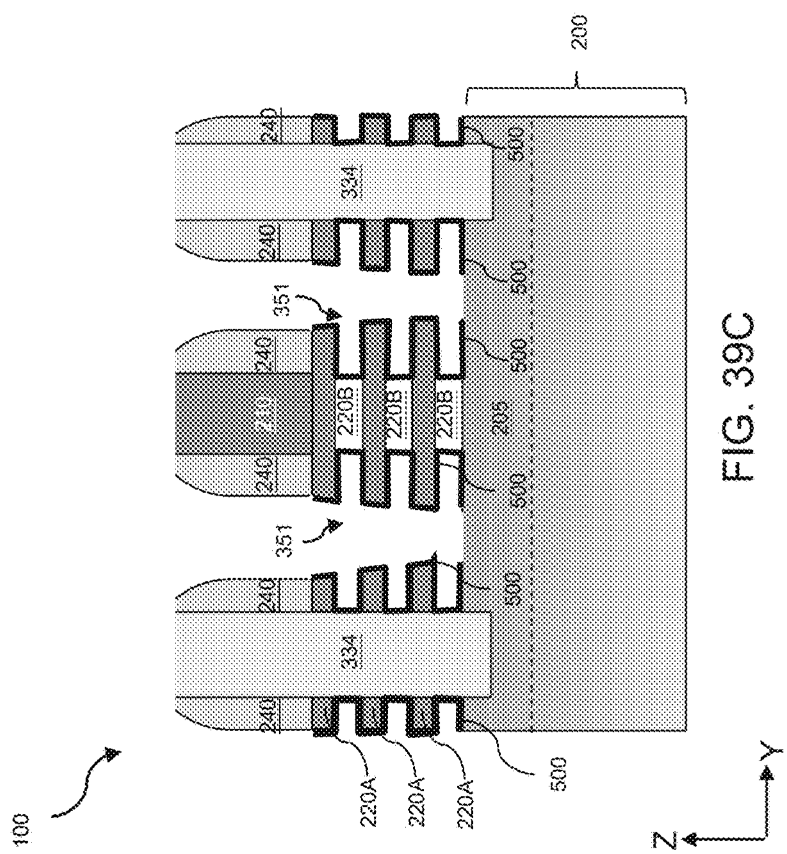
Figure 39F:
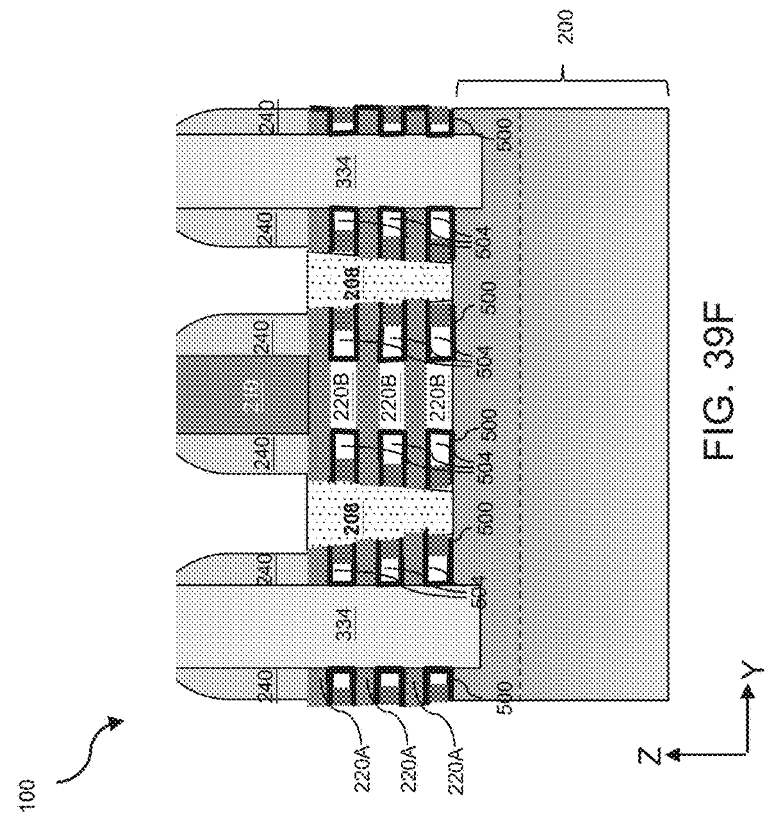
Figure 39E:
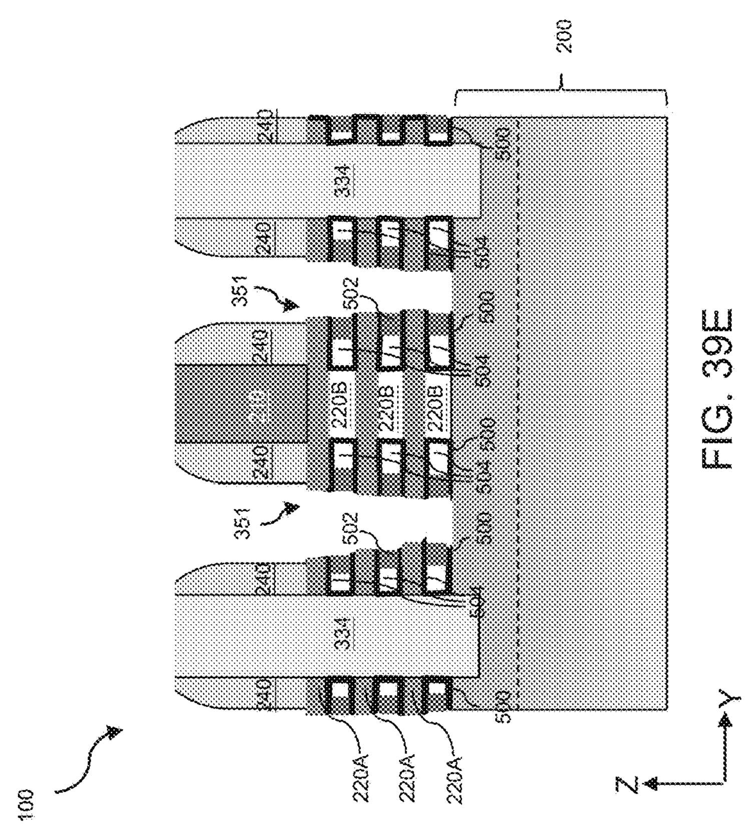
Figure 39G:
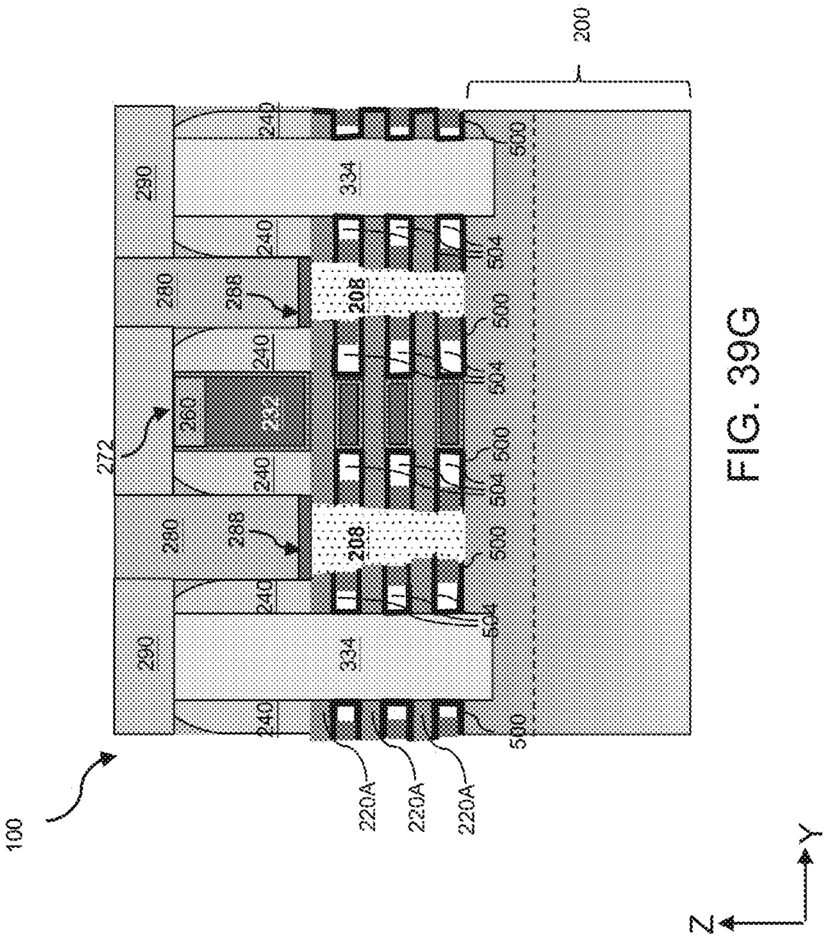

Referring to FIG. 39C, a conformal dielectric layer 500 is formed on exposed portions of the semiconductor layers 220A and 220B. In some embodiments, the conformal dielectric layer 500 may be formed by an ALD process and may include a material similar to those discussed above in reference to the inner spacer 250. Referring to FIG. 39D, a deposition process (e.g. a low-pressure CVD, abbreviated as LPCVD) is performed to non-conformally deposit a further dielectric layer 502 in the source/drain trenches 351. The further dielectric layer 502 may include a material similar to those discussed above in reference to the inner spacer 250. However, due to the extension of the trenches 351 into areas beneath the semiconductor layers 220A and top spacers 240 and the presence of the conformal dielectric layer 500 therein, the further dielectric layer 502 does not fully fill the areas beneath the semiconductor layers 220A, thereby forming airgaps 504. Referring to FIG. 39E, an etch back process is performed on the further dielectric layer 502 to expose end regions of the semiconductor layers 220A and the top surface of the substrate 200, while leaving behind a vestigial portion of the further dielectric layer 502 in the areas beneath the semiconductor layers 220A. The etch back process may include a wet etch process or a dry etch process that selectivity etches the further dielectric layer 502 without substantially perturbing or consuming the top spacers 240. Referring to FIG. 39F, the epitaxial source/drain features 208 are then formed using similar processes described above in reference to FIGS. 10A-10D. Subsequent processes may proceed in ways similar to those illustrated in FIGS. 33B-35B. The final structure (see FIG. 39G) includes airgaps 504 in the inner spacers that can reduce the capacitance between the sidewall of the source/drain feature 208 and the sidewall of the active gate structure 272.

Figure 40B:
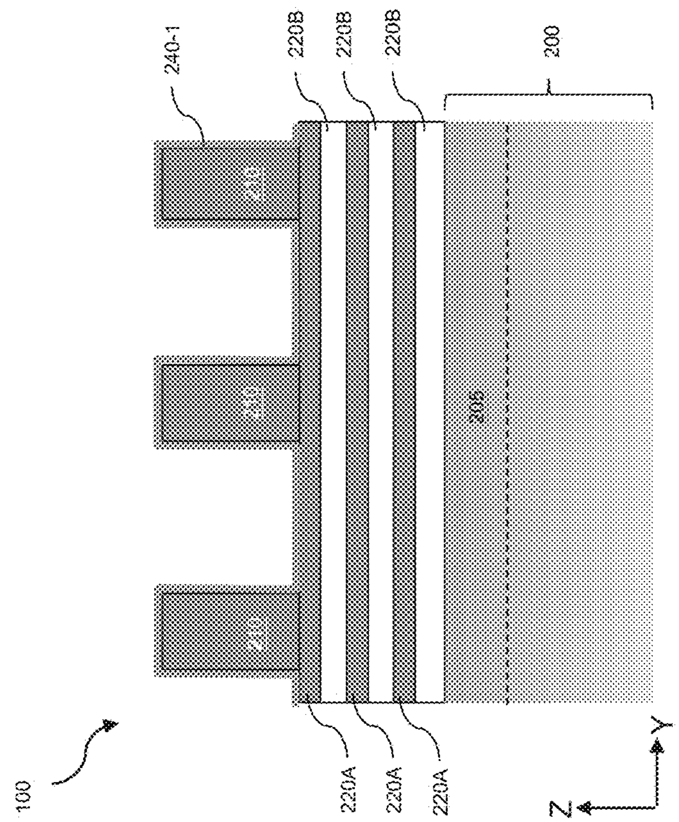
Figure 40A:
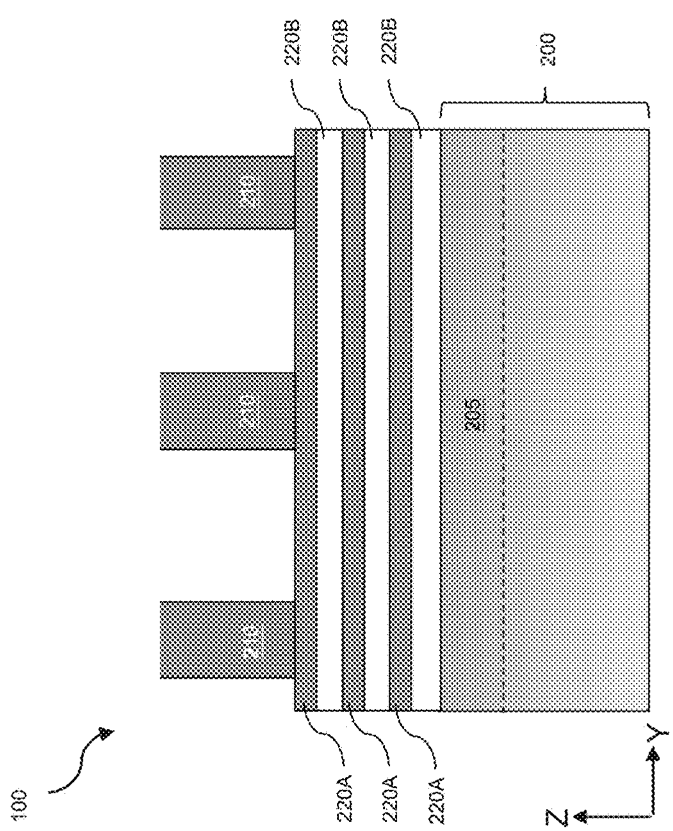

In some implementations, the top spacers 240 may have air gaps formed therein. FIGS. 40A to 401 show an embodiment method of forming airgaps in the top spacers 240 to decrease the capacitance between the sidewall of the contact 280 and the sidewall of the gate structure 272. FIG. 40A is similar to the structure shown in FIG. 4B and may be formed using the processes described above (e.g. LPCVD and/or ALD processes) in reference to FIG. 4B. FIG. 40B shows a first gate spacer 240-1 being conformally formed on exposed surfaces of the dummy gate structures 210 and the top-most semiconductor layer 220A. The first gate spacer 240-1 may include similar materials and may be formed using similar methods as described above in reference to gate spacer 240.

Figure 40C:
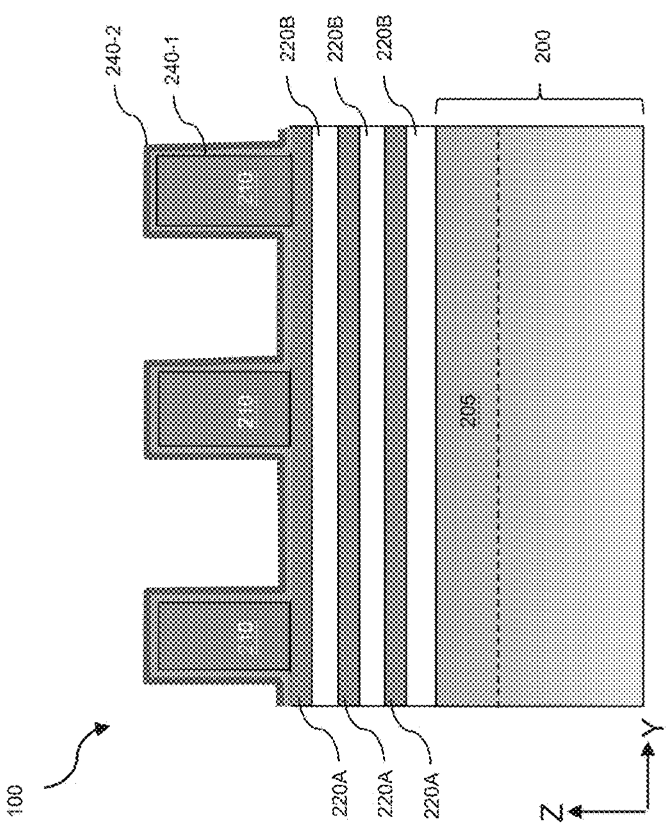
Figure 40D:
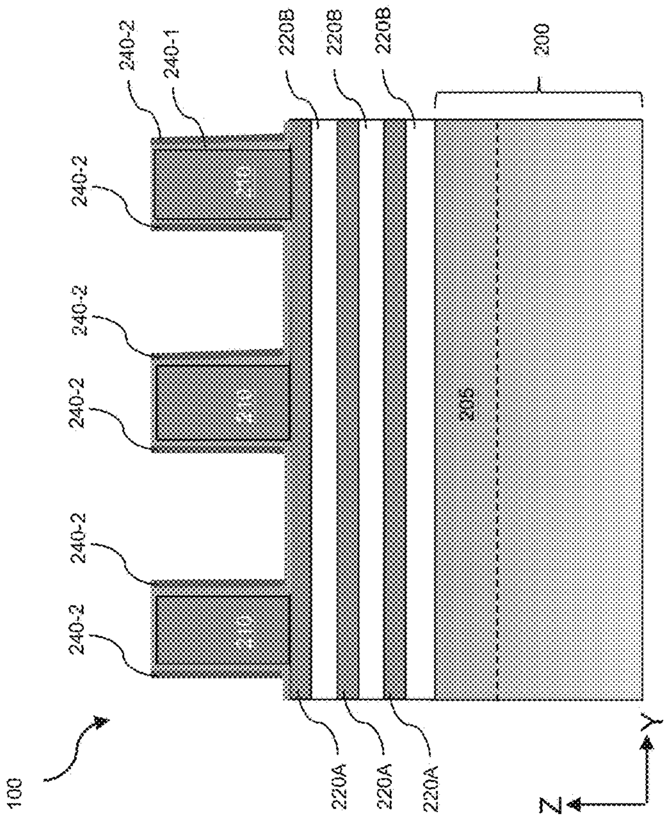

Referring to FIG. 40C, a sacrificial layer 240-2 is formed (e.g. using LPCVD and/or ALD processes) conformally over the first gate spacer 240-1. The sacrificial layer 240-2 may include polysilicon or a dielectric material that is different from the material of the first gate spacer 240-1. Referring to FIG. 40D, the sacrificial layer 240-2 is etched back such that vestigial portions thereof remain at sidewalls (e.g. vertical sidewalls) of the first gate spacer 240-1. Suitable etch back process may include a wet etch process or a dry etch process that selectivity etches the sacrificial layer 240-2 without substantially perturbing or consuming the first gate spacer 240-1.

Figure 40F:
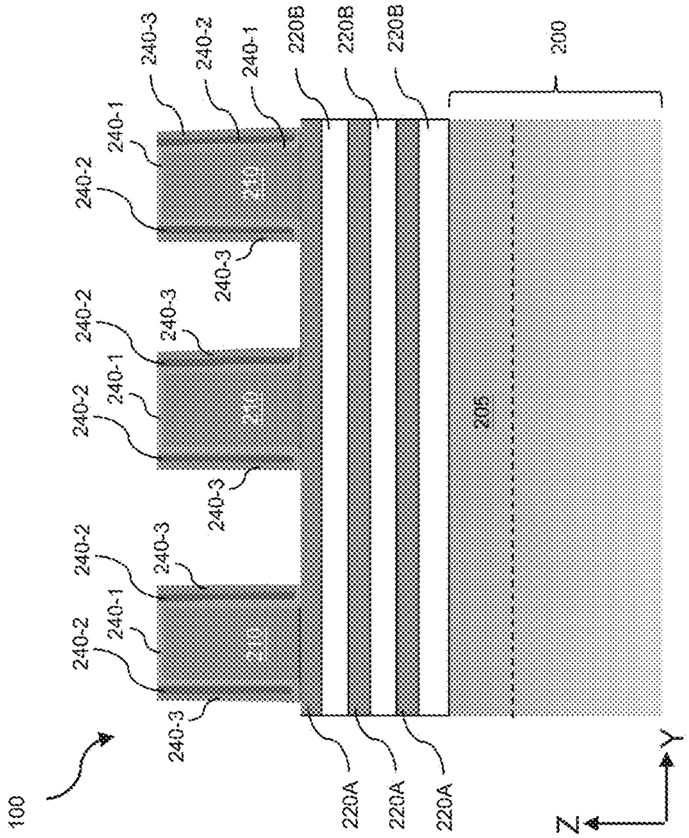
Figure 40E:
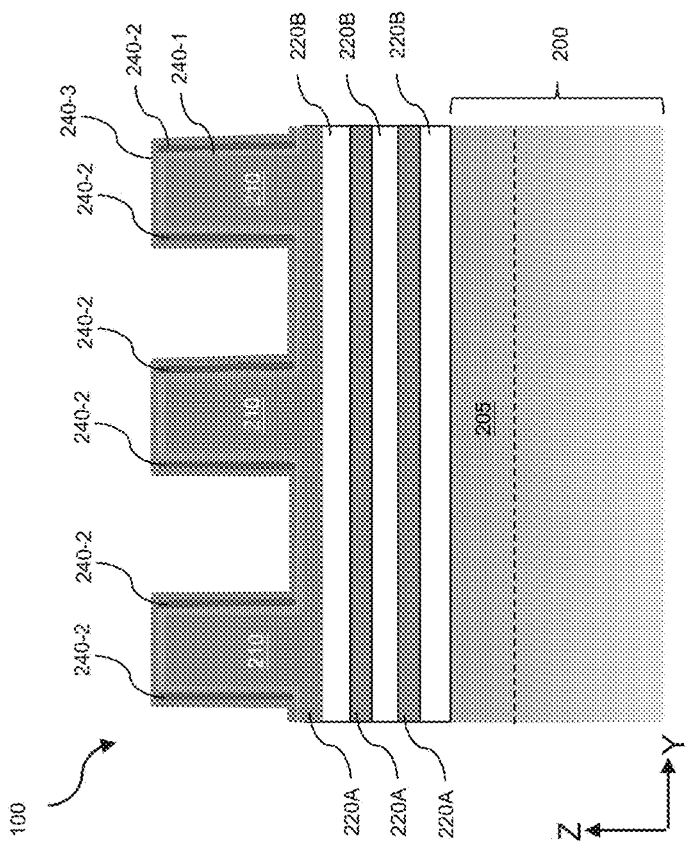

Referring to FIG. 40E, a second gate spacer 240-3 is conformally formed on exposed surfaces of the sacrificial layer 240-2 and the first gate spacer 240-1. The second gate spacer 240-3 may include similar materials and may be formed using similar methods as described above in reference to first gate spacer 240-1. In FIG. 40F, the second gate spacer 240-3 is etched back such that vestigial portions thereof remain at sidewalls (e.g. vertical sidewalls) of the second gate spacer 240-3. The etch back process also exposes top surfaces of the top-most semiconductor layer 220A, as seen in FIG. 40F. The etch back process used to remove portions of the second gate spacer 240-3 may include a wet etch process or a dry etch process. As seen in FIG. 40F, as a result of the process flow shown in FIGS. 40A to 40F, the dummy gate structures 210 have the first gate spacer 240-1 disposed on a top surface and sidewalls thereof. The sacrificial layer 240-2 is disposed on sidewalls of the first gate spacer 240-1, and the second gate spacer 240-3 is disposed on sidewalls of the sacrificial layer 240-2.

Figure 40H:
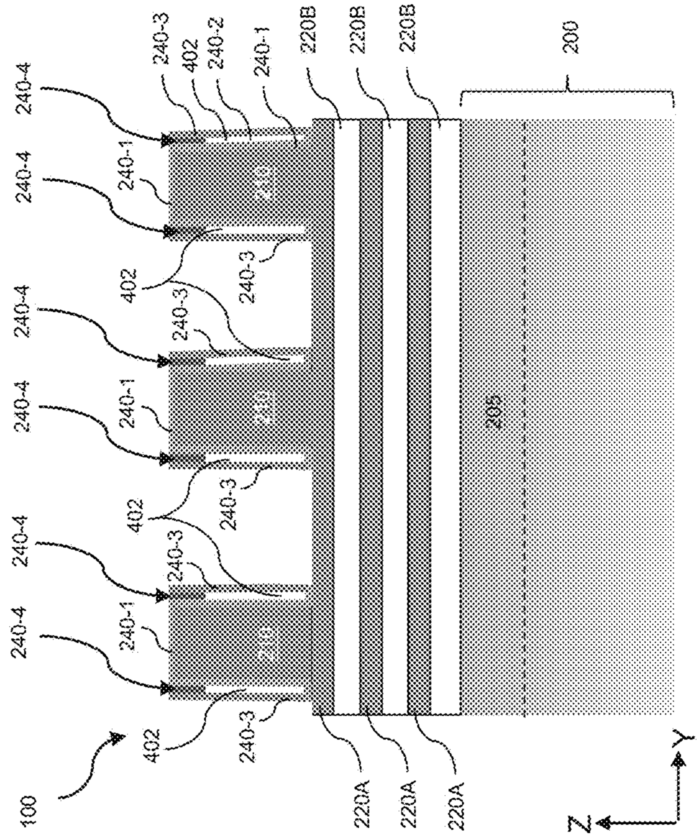
Figure 40G:
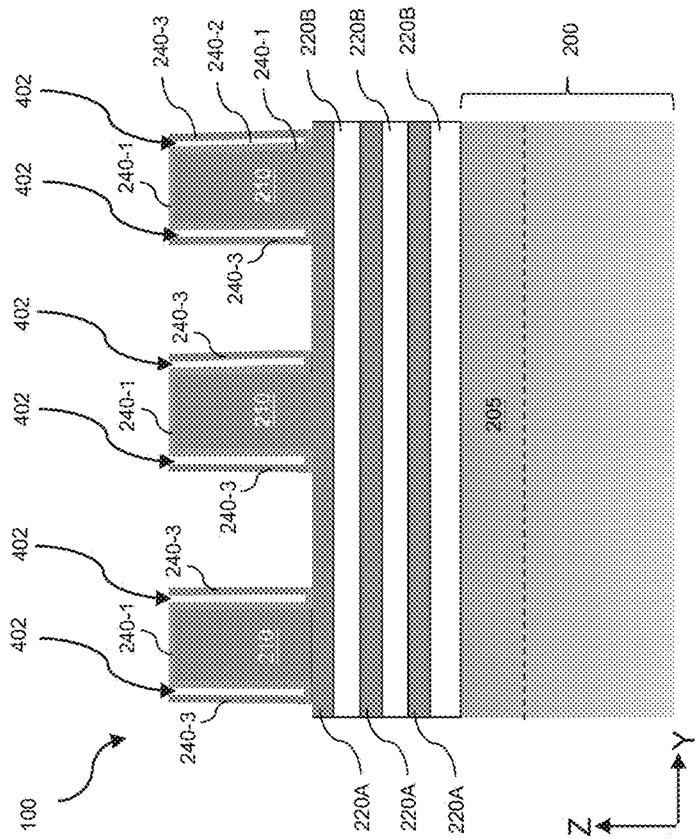

Referring to FIG. 40G, the sacrificial layer 240-2 is removed using a selective etch process that selectively removes the material of sacrificial layer 240-2 without substantially perturbing or consuming the material of the first gate spacer 240-1 and the material of the second gate spacer 240-3. As discussed above, the sacrificial layer 240-2 may include polysilicon (e.g. a material similar to the dummy gate structures 210). However, since the first gate spacer 240-1 is disposed on a top surface and sidewalls of the dummy gate structures 210, the first gate spacer 240-1 functions as a protective layer that prevents removal of the dummy gate structures 210 during the process of FIG. 40G. The result of FIG. 40G is the formation of a space 402 between adjacent ones of the first gate spacer 240-1 and the second gate spacer 240-3.

Figure 40I:
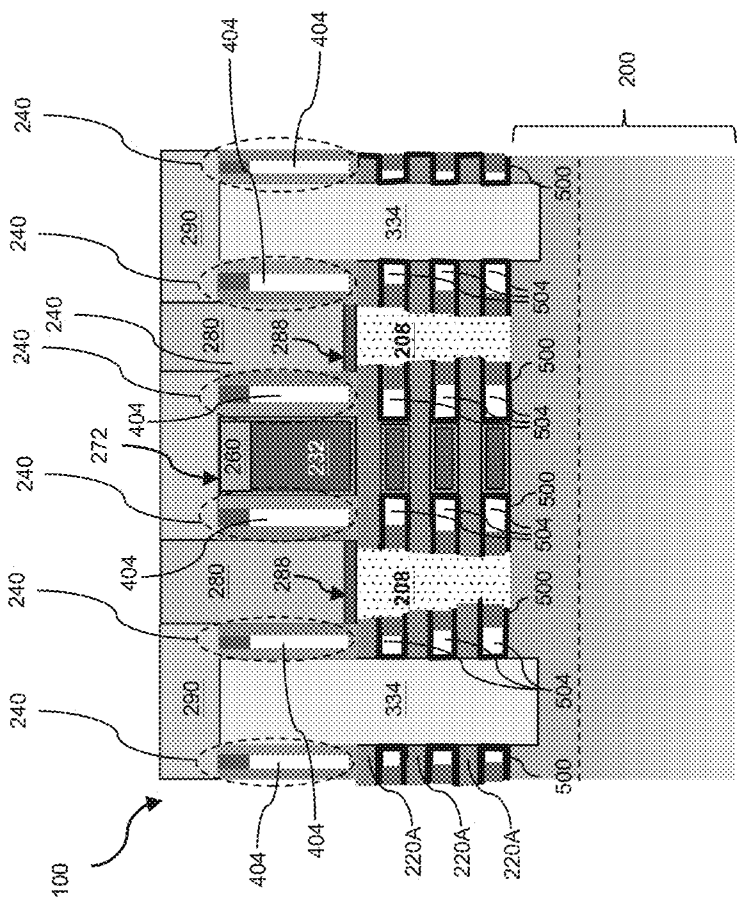

Referring to FIG. 40H, deposition and etch back processes are performed to form dielectric material 240-4 in top regions of the spaces 402. With regards to the deposition process, since the space 402 is narrow (e.g. less than or equal to about 1 nm), the dielectric material 240-4 does not completely fill the spaces 402, but instead fills up top regions thereof. Bottom regions of the spaces 402 (e.g. spaces proximate to the substrate 200) remain unfilled. Consequently, the deposition process of FIG. 40H produces air gaps 404, with remaining portions of the first gate spacer 240-1, the second gate spacer 240-3, and the dielectric material 240-4 collectively forming the top spacers 240 having air gaps 404 therein. Subsequent processes may proceed in ways similar to those illustrated in FIGS. 6A-38A, 6B-38B, 6C-38C, and 6D-38D. The final structure (see FIG. 40I) includes airgaps 404 in the top spacers that can reduce the capacitance between the sidewall of the contact 280 and the sidewall of the gate structure 272.

Though not intended to be limiting, embodiments of the present disclosure offer benefits for semiconductor processing and semiconductor devices. For example, the disclosed method allows larger process margins for forming gate dielectric layers and metal layers within the limited spacing between semiconductor channel layers of a GAA device than other technologies, thereby eliminating or reducing voids and/or other defects in those layers. For a specific example, tapered trenches are formed to induce a bottom-up epitaxial growth process that conformally fills the tapered trenches. Additionally, the present method allows the epitaxial source/drain features to be grown on side surfaces that include larger area of semiconductor materials, rather than dielectric materials. This improves the qualities of the epitaxial source/drain features, and eventually improves the performance and reliability of the GAA device. Furthermore, this present method also provides versatility allowing the designers to selectively optimize the capacitances of different regions of the GAA device according to design needs. As such, the present disclosure provides methods that improve the performance, functionality, and/or reliability of GAA devices. Stated differently, The GAA devices and methods of manufacture that are proposed in the present disclosure exhibit desirable properties, examples being: (1) a bottom-up epitaxial growth process that forms source/drain regions that are free from voids; (2) a large formation margin/window for gate dielectric and electrode in narrow channel-channel spaces; and (3) decreased capacitance between a source/drain region and an adjacent active gate structure.

An embodiment integrated circuit (IC) device includes: a semiconductor substrate having a top surface; a first source/drain feature and a second source/drain feature disposed on the semiconductor substrate; and a plurality of semiconductor layers including a first semiconductor layer and a second semiconductor layer. The first semiconductor layer extends longitudinally in a first direction and connects the first source/drain feature and the second source/drain feature, while the second semiconductor layer extends longitudinally in the first direction and connects the first source/drain feature and the second source/drain feature. The first semiconductor layer is stacked over and spaced apart the second semiconductor layer in a second direction perpendicular to the first direction, the second direction being normal to the top surface of the semiconductor substrate. The IC device further includes a gate structure engaging center portions of the first semiconductor layer and the second semiconductor layer, wherein a length of the first semiconductor layer along the first direction is less than a length of the second semiconductor layer along the first direction.

An embodiment integrated circuit (IC) device includes: a semiconductor substrate having a top surface; a first source/drain feature and a second source/drain feature disposed on the semiconductor substrate; and a plurality of semiconductor layers extending from the first source/drain feature to the second source/drain feature along a first direction. The plurality of semiconductor layers is stacked over each other along a second direction normal to the top surface and perpendicular to the second direction, wherein each of the semiconductor layers has a center portion and two side portions laterally adjacent to the center portion. The IC device also includes a gate electrode engaging the center portion of each of the semiconductor layers; a first spacer over the two side portions of a topmost semiconductor layer of the semiconductor layers; and a second spacer between vertically adjacent side portions of the semiconductor layers along the second direction. The first spacer includes a first dielectric material having a first dielectric constant, the second spacer includes a second dielectric material having a second dielectric constant different from the first dielectric constant, and a length of the topmost semiconductor layer, as measured along the first direction, is smaller than a length of each of the semiconductor layers vertically below the topmost semiconductor layer.

An embodiment method includes: forming a stack including first semiconductor layers and second semiconductor layers over a semiconductor substrate, wherein the first semiconductor layers and the second semiconductor layers have different material compositions and alternate with one another within the stack; forming a dummy gate structure over the stack, wherein the dummy gate structure wraps around top and sidewall surfaces of the stack; forming first spacers on sidewalls of the dummy gate structure, the first spacer being disposed on the top of the stack; forming a first tapered trench and a second tapered trench in the stack to expose a top surface of the semiconductor substrate; forming a first source/drain feature in the first tapered trench and a second source/drain feature in the second tapered trench; removing the dummy gate structure from the top and the sidewall surfaces of the stack; and removing the second semiconductor layers such that the first semiconductor layers remain and form semiconductor sheets connecting the first source/drain feature and the second source/drain feature to each other, wherein a length of a topmost first semiconductor layer is less than a length of a bottommost first semiconductor layer, as measured in a direction parallel to the top surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:

a semiconductor substrate having a top surface;

a first source/drain feature and a second source/drain feature disposed on the semiconductor substrate;

a plurality of semiconductor layers extending from the first source/drain feature to the second source/drain feature along a first direction, the plurality of semiconductor layers stacked over each other along a second direction normal to the top surface and perpendicular to the first direction; and a gate structure wrapping around each of the semiconductor layers, wherein the gate structure includes a tapered profile;

wherein the plurality of semiconductor layers includes a first semiconductor layer and a second semiconductor layer, the first semiconductor layer extending longitudinally in the first direction and connecting the first source/drain feature and the second source/drain feature;

the second semiconductor layer extending longitudinally in the first direction and connecting the first source/drain feature and the second source/drain feature;

the first semiconductor layer is stacked over and spaced apart the second semiconductor layer;

the gate structure engages the first semiconductor layer and the second semiconductor layer between the first source/drain feature and the second source/drain feature; and a width of the first semiconductor layer is different from a width of the second semiconductor layer, each of the width of the first semiconductor layer and the width of the second semiconductor layer being measured in a third direction perpendicular to the first direction and the second direction.

2. The IC device of claim 1, wherein the width of the first semiconductor layer is less than the width of the second semiconductor layer.

3. The IC device of claim 1, wherein a first portion of the gate structure engages the first semiconductor layer and a second portion of the gate structure engages the second semiconductor layer, wherein a length of the first portion of the gate structure along the first direction is less than a length of the second portion of the gate structure along the first direction.

4. The IC device of claim 3, wherein the length of the second portion of the gate structure is larger than the length of the first portion of the gate structure by at least 0.5 nanometers.

5. The IC device of claim 1, wherein a length of the first semiconductor layer along the first direction is less than a length of the second semiconductor layer along the first direction; and the width of the first semiconductor layer is less than the width of the second semiconductor layer.

6. The IC device of claim 5, wherein a difference between the length of the second semiconductor layer and the length of the first semiconductor layer is at least 1 nanometer; and a difference between the width of the first semiconductor layer and the width of the second semiconductor layer is in a range from about 0.5 nanometers to about 5 nanometers.

7. The IC device of claim 1, further comprising:

a first spacer disposed over side portions of the first semiconductor layer, the first semiconductor layer being a topmost layer of the plurality of semiconductor layers; and a second spacer disposed between the side portions of the first semiconductor layer and side portions of the second semiconductor layer, wherein the first spacer and the second spacer have different material compositions.

8. The IC device of claim 7, wherein the first spacer spans a first dimension along the first direction and the second spacer spans a second dimension along the first direction, wherein the first dimension of the first spacer is less than the second dimension of the second spacer.

9. The IC device of claim 1, wherein each of the first and second source/drain features includes a tapered sectional profile.

10. The IC device of claim 1, wherein an acute angle subtended by a sidewall of the first source/drain feature and the top surface of the semiconductor substrate is in a range from about 80 degrees to about 88 degrees.

11. An integrated circuit device, comprising:

a semiconductor substrate having a top surface;

a first source/drain feature and a second source/drain feature disposed on the semiconductor substrate;

a plurality of semiconductor layers extending from the first source/drain feature to the second source/drain feature along a first direction, the plurality of semiconductor layers stacked over each other along a second direction normal to the top surface and perpendicular to the first direction; and a gate structure wrapping around each of the semiconductor layers, wherein a width of a topmost semiconductor layer is different from a width of a bottommost semiconductor layer, as measured in a third direction perpendicular to the first and second directions.

12. The IC device of claim 11, wherein a length of the topmost semiconductor layer of the semiconductor layers is less than a length of the bottommost semiconductor layer of the semiconductor layers, as measured in the first direction.

13. The IC device of claim 11, wherein a first portion of the gate structure engages the topmost semiconductor layer and a second portion of the gate structure engages the bottommost semiconductor layer, wherein a length of the first portion of the gate structure along the first direction is less than a length of the second portion of the gate structure along the first direction.

14. The IC device of claim 11, wherein each of the first and second source/drain features includes a tapered profile.

15. The IC device of claim 14, wherein an acute angle subtended by a sidewall of the first source/drain feature and the top surface of the semiconductor substrate is in a range from about 80 degrees to about 88 degrees.

16. The IC device of claim 11, further comprising:

a first spacer over two side portions of the topmost semiconductor layer of the semiconductor layers; and a second spacer between vertically adjacent side portions of the semiconductor layers along the second direction, wherein the first spacer includes a first dielectric material having a first dielectric constant, wherein the second spacer includes a second dielectric material having a second dielectric constant different from the first dielectric constant.

17. The IC device of claim 16, wherein the first spacer includes the first dielectric material selected from the group consisting of SiON, SiOC, SiOCN, and combinations thereof, and wherein the second spacer includes the second dielectric material selected from the group consisting of SiO2, Si3N4, carbon doped oxide, nitrogen doped oxide, porous oxide, and combinations thereof.

18. The IC device of claim 16, further comprising a gate end dielectric layer contacting opposing ends of each of the plurality of semiconductor layers, wherein the gate end dielectric layer includes a third dielectric material having a third dielectric constant, the third dielectric constant being larger than the first dielectric constant and the second dielectric constant.

19. An integrated circuit device, comprising:

a semiconductor substrate having a top surface;

a first source/drain feature and a second source/drain feature disposed on the semiconductor substrate, wherein each of the first and second source/drain features includes a tapered profile;

a plurality of semiconductor layers extending from the first source/drain feature to the second source/drain feature along a first direction, the plurality of semiconductor layers stacked over each other along a second direction normal to the top surface and perpendicular to the first direction;

a gate structure wrapping around each of the semiconductor layers;

the gate structure comprising a top portion over the plurality of semiconductor layers; and first and second top spacers disposed on opposing sidewalls of the top portion of the gate structure;

wherein a width of a topmost semiconductor layer is different from a width of a bottommost semiconductor layer, as measured in a third direction perpendicular to the first and second directions.

20. The IC device of claim 19, wherein the semiconductor layers include a bottom semiconductor layer, a middle semiconductor layer stacked over the bottom semiconductor layer, and a top semiconductor layer stacked over the middle semiconductor layer;

the bottom semiconductor layer includes a first width along a third direction perpendicular to the first direction and the second direction;

the middle semiconductor layer includes a second width along the third direction;

the top semiconductor layer includes a third width along the third direction; and the second width is less than the first width and is greater than the third width.

* * * * *